(12) United States Patent
Ohashi et al.

(10) Patent No.: US 8,956,803 B2
(45) Date of Patent: Feb. 17, 2015

(54) SULFONIUM SALT, RESIST COMPOSITION, AND PATTERNING PROCESS

(71) Applicant: Shin-Etsu Chemical Co., Ltd., Tokyo (JP)

(72) Inventors: Masaki Ohashi, Jyoetsu (JP); Tomohiro Kobayashi, Jyoetsu (JP); Akihiro Seki, Jyoetsu (JP); Masayoshi Sagehashi, Jyoetsu (JP); Masahiro Fukushima, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/099,678

(22) Filed: Dec. 6, 2013

(65) Prior Publication Data

US 2014/0199629 A1 Jul. 17, 2014

(30) Foreign Application Priority Data

Jan. 11, 2013 (JP) ................. 2013-003555

(51) Int. Cl.
| | |
|---|---|
| G03F 7/004 | (2006.01) |
| G03F 7/039 | (2006.01) |
| G03F 7/11 | (2006.01) |
| G03F 7/20 | (2006.01) |
| G03F 7/30 | (2006.01) |

(52) U.S. Cl.
USPC ............. 430/270.1; 430/273.1; 430/311; 430/326; 430/330; 430/907; 430/910; 430/922; 430/925; 430/942; 430/966; 549/78; 549/80; 549/83

(58) Field of Classification Search
None
See application file for complete search history.

(56) References Cited

U.S. PATENT DOCUMENTS

| | | | |
|---|---|---|---|
| 5,650,483 A | 7/1997 | Malik et al. | |
| 6,187,504 B1 | 2/2001 | Suwa et al. | |
| 6,312,867 B1 | 11/2001 | Kinsho et al. | |
| 2003/0013039 A1 | 1/2003 | Kobayashi et al. | |
| 2006/0194982 A1 | 8/2006 | Harada et al. | |
| 2006/0228648 A1 | 10/2006 | Ohsawa et al. | |
| 2008/0085469 A1 | 4/2008 | Ohsawa et al. | |
| 2008/0090172 A1 | 4/2008 | Hatakeyama et al. | |
| 2008/0187860 A1 | 8/2008 | Tsubaki et al. | |
| 2009/0011366 A1 | 1/2009 | Tsubaki et al. | |
| 2009/0081588 A1 | 3/2009 | Hatakeyama et al. | |
| 2009/0111047 A1 | 4/2009 | Yamashita | |
| 2009/0208867 A1 | 8/2009 | Harada et al. | |
| 2009/0208873 A1 | 8/2009 | Harada et al. | |
| 2009/0246694 A1 | 10/2009 | Ohsawa et al. | |
| 2009/0274978 A1 | 11/2009 | Ohashi et al. | |
| 2009/0280434 A1 | 11/2009 | Harada et al. | |
| 2010/0035185 A1 | 2/2010 | Hagiwara et al. | |
| 2010/0112482 A1 | 5/2010 | Watanabe et al. | |
| 2010/0136482 A1 | 6/2010 | Harada et al. | |
| 2010/0209827 A1 | 8/2010 | Ohashi et al. | |
| 2010/0266957 A1 | 10/2010 | Harada et al. | |
| 2011/0008735 A1 | 1/2011 | Ohsawa et al. | |
| 2012/0045724 A1* | 2/2012 | Ohsawa et al. | ............... 430/325 |
| 2012/0100486 A1 | 4/2012 | Sagehashi et al. | |
| 2014/0199629 A1 | 7/2014 | Ohashi et al. | |

FOREIGN PATENT DOCUMENTS

| | | |
|---|---|---|
| JP | A-2000-336121 | 12/2000 |
| JP | A-2003-066612 | 3/2003 |
| JP | B2-3632410 | 3/2005 |
| JP | A-2006-257078 | 9/2006 |
| JP | A-2007-145797 | 6/2007 |
| JP | B2-3995575 | 10/2007 |
| JP | A-2007-298569 | 11/2007 |
| JP | A-2008-106045 | 5/2008 |
| JP | A-2008-122932 | 5/2008 |

(Continued)

OTHER PUBLICATIONS

Dammel et al., "193 nm Immersion Lithography—Taking the Plunge," *Journal of Photopolymer Science and Technology*, 2004, pp. 587-602, vol. 17, No. 4.
U.S. Appl. No. 14/103,462, filed Dec. 11, 2013 in the name of Ohashi et al.
Dammel et al., "193 nm Immersion Lithography—Taking the Plunge," *Journal of Photopolymer Science and Technology*, 2004, pp. 587-601, vol. 17, No. 4.
Dec. 12, 2014 Office Action issued in U.S. Appl. No. 14/103,462.

*Primary Examiner* — Sin J. Lee
(74) *Attorney, Agent, or Firm* — Oliff PLC

(57) ABSTRACT

The present invention provides a sulfonium salt used in a resist composition that can give a pattern having a high resolution, especially an excellent rectangularity of a pattern form and a small roughness, while not readily generating a defect, in the photolithography using a high energy beam as a light source; a resist composition that contains the sulfonium salt; and a patterning process using this resist composition, wherein the sulfonium salt is shown by the following general formula (1a), (1a)

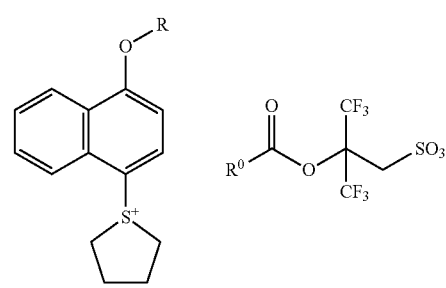

wherein each of R and R⁰ independently represents a hydrogen atom, or a linear, branched, or cyclic monovalent hydrocarbon group having 1 to 30 carbon atoms which may be optionally substituted by a heteroatom or interposed by a heteroatom.

18 Claims, 2 Drawing Sheets

(56) References Cited

FOREIGN PATENT DOCUMENTS

| | | |
|---|---|---|
| JP | A-2008-281974 | 11/2008 |
| JP | A-2008-281975 | 11/2008 |
| JP | A-2009-007327 | 1/2009 |
| JP | A-2009-098638 | 5/2009 |
| JP | A-2009-109595 | 5/2009 |
| JP | A-2009-191151 | 8/2009 |
| JP | A-2009-192784 | 8/2009 |
| JP | A-2009-258695 | 11/2009 |
| JP | A-2009-269953 | 11/2009 |
| JP | A-2009-276363 | 11/2009 |
| JP | A-2010-020204 | 1/2010 |
| JP | A-2010-107695 | 5/2010 |
| JP | A-2010-134012 | 6/2010 |
| JP | A-2010-215608 | 9/2010 |
| JP | B2-4554665 | 9/2010 |
| JP | A-2010-250105 | 11/2010 |
| JP | A-2011-016746 | 1/2011 |
| JP | A-2011-042789 | 3/2011 |
| JP | A-2012-046501 | 3/2012 |

* cited by examiner

SULFONIUM SALT, RESIST COMPOSITION, AND PATTERNING PROCESS

BACKGROUND OF THE INVENTION

1. Field of the Invention

The present invention relates to a sulfonium salt, a resist composition, and a patterning process.

2. Description of the Related Art

In recent years, as LSI advances toward a higher integration and a more rapid processing speed, finer pattern rules are being requested; and in this trend, a far ultraviolet lithography and a vacuum ultraviolet lithography are promising for the next generation fine patterning technologies. Especially, a photolithography using an ArF excimer laser beam as a light source is an indispensable technology for an ultrafine patterning process with the size of 0.13 µm or less.

The ArF lithography started to be used partially from manufacturing of a device with the 130-nm node, and then it became a main lithography technology from the 90-nm node device. As the lithography technology for the next 45-nm node device, a 157-nm lithography using a $F_2$ laser was initially considered as a promising technology; however, a delay in development thereof due to several problems was indicated. Accordingly, an ArF immersion lithography emerged rapidly because by inserting a liquid whose refractive index is higher than air, such as water, ethylene glycol, and glycerin, between a projection lens and a wafer, the number of aperture (NA) of the projection lens therein can be designed to be 1.0 or more thereby attaining a high resolution (for example, see Non-Patent Document 1); and this is now in the stage of practical use. For this immersion lithography, a resist composition not readily eluting into water is being requested.

In the ArF lithography, in order to avoid deterioration of a precise and expensive optical material, a highly sensitive resist composition that can express a sufficient resolution with a small exposure dose is requested; and in order to realize this, the most generally used method is to select each ingredient having a high transparency at the wavelength of 193 nm. As to a base resin for example, polyacrylic acid and a derivative thereof, norbornene-maleic acid anhydride alternating copolymer, polynorbornene, a ring-opened metathesis polymer, a hydrogenated ring-opened metathesis polymer, and the like have been proposed; and these bring about a certain level of results in enhancing a transparency of a resin.

In recent years, a negative tone resist by an organic solvent development as well as a positive tone resist by an alkaline development has been receiving an attention. In order to resolve a very fine hole pattern, which cannot be achieved by a positive tone, by a negative tone exposure, a negative pattern is formed by an organic solvent development using a positive resist composition having a high resolution. In addition, a study to obtain a doubled resolution power by combining two developments of the alkaline development and the organic solvent development is going on.

As to the ArF resist composition for the negative tone development by an organic solvent, an existing positive ArF resist composition can be used; and patterning processes thereof are disclosed in Patent Document 1 to 3.

In order to catch up the rapid fine patterning trend in recent years, development of a resist material as well as a process technology is progressing day by day. Various photo-sensitive acid generators have been studied; and a sulfonium salt of a triphenylsulfonium cation and a perfluoroalkane sulfonate anion is generally used. However, a generated acid of a perfluoroalkane sulfonic acid, especially perfluorooctane sulfonic acid (PFOS), has concerns about low degradability, biological concentration, and toxicity. And therefore, its use in the resist composition becomes difficult, so that currently a photo-sensitive acid generator to generate perfluorobutane sulfonic acid is being used; however, when this generator is used in the resist composition, it is difficult to achieve a high resolution because of a high diffusibility of the acid generated therefrom.

To solve this problem, various kinds of partially fluorinated alkane sulfonic acids and their salts have been developed; and a photo-sensitive acid generator having 2-acyloxy-1,1,3,3,3-pentafluoropropane-1-sulfonic acid has been developed because of its characteristics including easiness to introduce a substituent group that can control such properties as solubility into a resist solvent, stability, and diffusibility (see Patent Document 4). Meanwhile, in patent document 4, photo-sensitive acid generators to generate $\alpha,\alpha$-difluoroalkane sulfonic acids by photo-exposure, specifically di(4-tert-butylphenyl)iodonium=1,1-difluoro-2-(1-naphthyl)ethane sulfonate and photo-sensitive acid generators to generate an $\alpha,\alpha,\beta,\beta$-tetrafluoroalkane sulfonic acid are mentioned as conventional technologies; however, although in both generators can lower the fluorine-substitution rates, degradability thereof is insufficient because there are no degradable substituents such as an ester structure; and in addition, there are problems such that molecular design to change the bulkiness of the alkane sulfonic acid is limited, and that a starting fluorine-containing material is expensive.

As to the cation, a triphenylsulfonium cation is widely used; however, this cation has a drawback of a large absorbance at the ArF exposure light (193 nm) to lower the transmittance in the resist film thereby sometimes leading to a low resolution. Accordingly, in order to obtain a high sensitivity and a high resolution, a 4-alokoxy-1-naphthyltetrahydrothiophenium cation and the like have been developed (see Patent Document 5); and a resist composition in combination thereof with components including a resin having a plurality of acid-labile groups is disclosed (see Patent Document 6).

However, as the circuit line width is becoming narrower so rapidly that effect of the contrast deterioration due to acid diffusion is becoming even more problematic in the resist material; and therefore, under the current situation, the sulfonium salts as mentioned above cannot satisfy the required resist performance. This is because the pattern size gets close to the diffusion length of the acid, causing specifically deterioration of the mask reliability and the pattern rectangularity, inhomogeneity of a fine line pattern (line width roughness, or LWR), and the like.

As a resist pattern with a high resolution is demanded in recent years, improvements not only in lithography properties typically represented by a pattern form, contrast, roughness, and the like but also in a defect (surface defect) of a resist pattern after development become necessary more than ever. The defect herein means all the troubles observed from directly above the resist pattern after development, for example, by a surface defect observation apparatus (trade name of KLA, manufactured by KLA-Tencor Corporation). The foregoing troubles include problems after development such as a scum, a bubble, a dust, and a bridge among resist patterns.

PRIOR ART DOCUMENTS

Patent Documents

Patent Document 1: Japanese Patent Laid-Open Publication No. 2008-281974
Patent Document 2: Japanese Patent Laid-Open Publication No. 2008-281975
Patent Document 3: Japanese Patent No. 4554665
Patent Document 4: Japanese Patent Laid-Open Publication No. 2007-145797
Patent Document 5: Japanese Patent No. 3632410
Patent Document 6: Japanese Patent No. 3995575

Non-Patent Document

Non-Patent Document 1: Journal of photopolymer Science and Technology Vol. 17, No. 4, p 587 (2004)

SUMMARY OF THE INVENTION

The present invention was made in view of the circumstance as mentioned above, and thus, objects thereof are to provide: a sulfonium salt to be used in a resist composition that can give an excellent pattern having a high resolution, especially an excellent rectangularity of a pattern form and a small roughness, while not readily generating a defect, in the photolithography using high energy beams, such as an ArF excimer beam and an EUV, as the light source; a resist composition that contains the sulfonium salt; and a patterning process using this resist composition.

In order to solve the problems mentioned above, the present invention provides a sulfonium salt shown by the following general formula (1a),

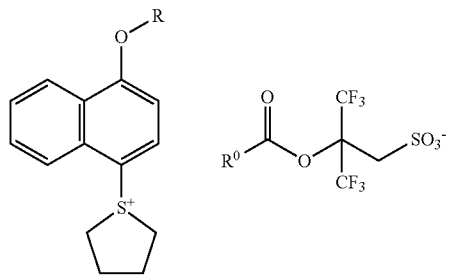

(1a)

wherein each of R and $R^0$ independently represents a hydrogen atom, or a linear, branched, or cyclic monovalent hydrocarbon group having 1 to 30 carbon atoms which may be optionally substituted by a heteroatom or interposed by a heteroatom.

By using the sulfonium salt like this as an acid generator (photo-sensitive acid generator), a resist composition having a high transparency and a high resolution with excellent pattern form and roughness, and yet with a small number of defects, can be obtained; and thus, this resist composition can be made extremely useful for fine processing with high precision.

In this case, the foregoing general formula (1a) is preferably shown by the following general formula (1b),

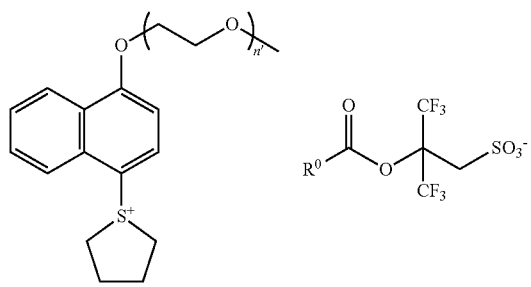

(1b)

wherein $R^0$ represents the same meaning as before; and n' represents an integer of 1 to 4.

By using the sulfonium salt like this as an acid generator, a resist composition having further higher transparency and resolution with excellent pattern form and roughness, and yet with a small number of defects, can be obtained; and thus, this resist composition can be made extremely useful for fine processing with high precision.

In addition, the present invention provides a chemically amplified resist composition which comprises a base resin, an acid generator, and an organic solvent, wherein the acid generator is the sulfonium salt according to the present invention.

The chemically amplified resist composition like this has a high transparency and a high resolution with excellent pattern form and roughness, and yet with a small number of defects, and thus, this can be made extremely useful for fine processing with high precision.

In this case, the base resin is preferably a polymer compound having a repeating unit shown by the following general formula (2) and a repeating unit shown by the following general formula (3),

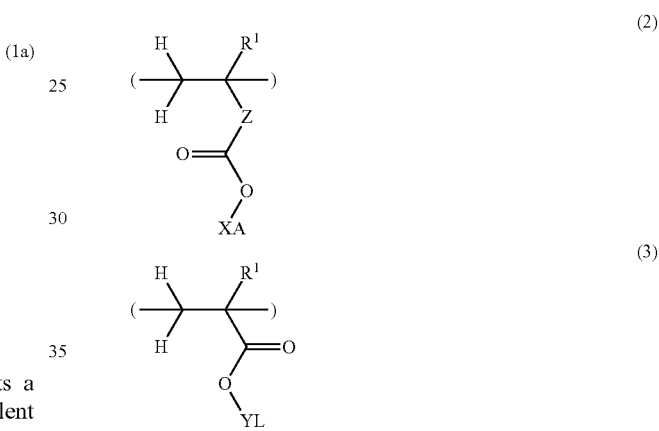

wherein $R^1$ represents a hydrogen atom, a fluorine atom, a methyl group, or a trifluoromethyl group. Z represents any of a single bond, a pheylene group, a naphthylene group, and (main chain)—C(=O)—O—Z'—. Z' represents a phenylene group, a naphthylene group, or a liner, branched, or cyclic alkylene group having 1 to 10 carbon atoms which may optionally contain any of a hydroxy group, an ether bond, an ester bond, and a lactone ring. XA represents an acid-labile group. YL represents a hydrogen atom, or a polar group having any one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

By using the chemically amplified resist composition containing the base resin like this, a resist composition giving after exposure an excellent pattern form and having further higher transparency and resolution with excellent pattern form and roughness, and yet with a small number of defects, can be obtained.

In this case, it is preferable that the chemically amplified resist composition contains further at least any one of a basic compound and a surfactant.

The chemically amplified resist composition like this is preferable because the resolution power can be enhanced even more.

Furthermore, the present invention provides a patterning process comprising a step of applying the chemically amplified resist composition onto a substrate, a step of exposure by a high energy beam after heat treatment, and a step of development by using a developing solution.

By using the patterning process like this of the present invention, an excellent pattern having an excellent resolution, especially an excellent rectangularity and a small roughness, can be formed.

In this case, it is preferable to conduct the exposure by an immersion exposure interposed by a liquid having a refractive index of 1.0 or more between a resist coat film and a projection lens.

By using the patterning process by the immersion exposure like this, a better pattern having an excellent resolution, especially an excellent rectangularity and a small roughness, can be formed.

In addition, it is preferable to further apply a protective coat on the resist coat film and thereafter to carry out the immersion exposure interposed by the liquid between the protective coat and the projection lens.

By using the protective coat like this, the resist film can be protected so that a further better pattern having an excellent resolution, especially an excellent rectangularity and a small roughness, can be formed.

In this case, the high energy beam for exposure is preferably a KrF excimer laser, an ArF excimer laser, an electron beam, or a soft X-ray in the wavelength range of 3 to 15 nm. The acid generator of the present invention is suitable for the exposure using the light sources as mentioned above.

If a chemically amplified resist composition is made to contain the sulfonium salt of the present invention as an acid generator (photo-sensitive acid generator), owing to the structure thereof, a resolution, a form, and a roughness of the composition can be improved further more as compared with existing resist compositions; and thus, this resist composition can be made extremely useful for fine processing with high precision.

DETAILED DESCRIPTION OF THE PREFERRED EMBODIMENTS

Figure 1:
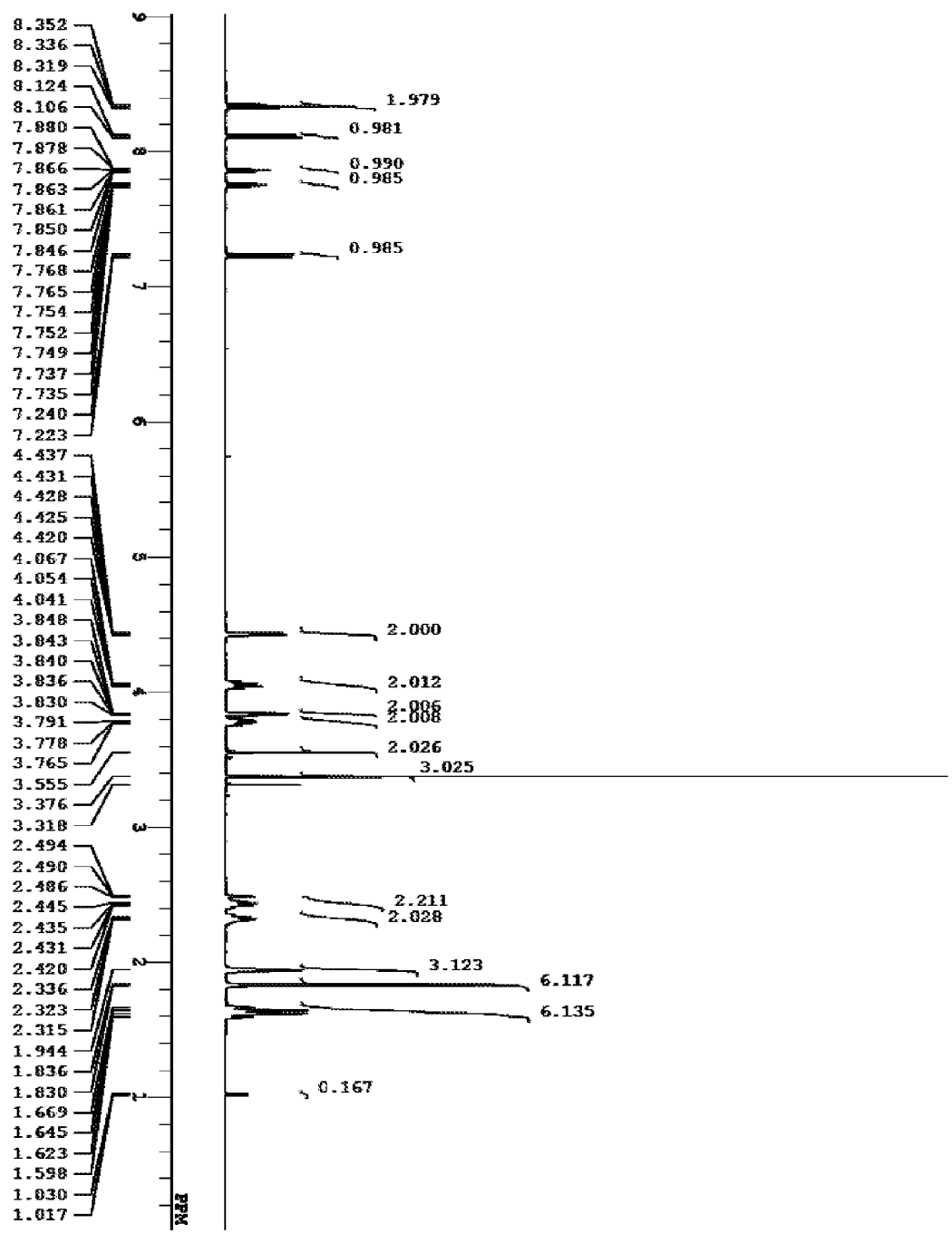
FIG. 1 shows $^1$H-NMR in DMSO-$d_6$ of the target compound PAG-1 obtained in Synthesis Example 1-3.

Hereunder, the present invention will be explained specifically.

Inventors of the present invention carried out an extensive investigation to achieve the object mentioned above; and as a result, it was found that a resist composition using a sulfonium salt shown by the following general formula (1a) as a photo-sensitive acid generator gave a high transparency and a high resolution with excellent pattern form and roughness, and yet with a small number of defects, so that this was extremely useful for fine processing with high precision as the resist composition; and based on this finding, the present invention could be completed.

That is, the present invention provides a sulfonium salt shown below, a resist composition containing the sulfonium salt, and a patterning process.

Hereunder, the present invention will be explained in detail.

Firstly, the present invention provides a sulfonium salt shown by the following general formula (1a),

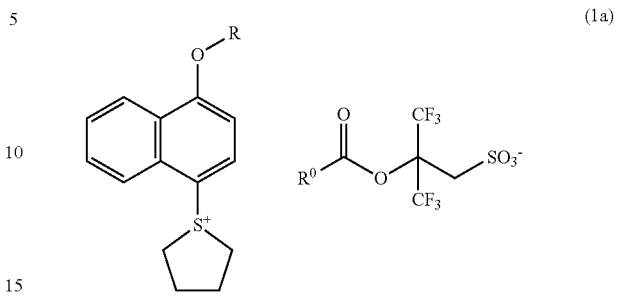

(1a)

wherein each of R and $R^0$ independently represents a hydrogen atom, or a linear, branched, or cyclic monovalent hydrocarbon group having 1 to 30 carbon atoms which may be optionally substituted by a heteroatom or interposed by a heteroatom.

First of all, a cationic part of the sulfonium salt shown by the general formula (1a) will be described in detail.

In the general formula (1a), R represents a hydrogen atom, or a linear, branched, or cyclic monovalent hydrocarbon group having 1 to 30 carbon atoms which may be optionally substituted by a heteroatom or interposed by a heteroatom. Specific example thereof includes a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.0$^{2,6}$]decanyl group, and an adamantyl group. In addition, a part of hydrogen atoms in these groups may be displaced by a heteroatom such as an oxygen atom, a sulfur atom, a nitrogen atom, and a halogen atom, or may be interposed by a heteroatom such as an oxygen atom, a sulfur atom, and a nitrogen atom; and as a result, the hydrocarbon groups may form or be interposed by a hydroxy group, a cyano group, a carbonyl group, an ether bond, an ester bond, a sulfonate ester bond, a carbonate bond, a lactone ring, a sultone ring, a carboxylic acid anhydride, and a halogenated alkyl group. R is preferably a hydrogen atom or an alkyl group, or more preferably an alkyl group interposed by an oxygen atom.

Then, an anionic part of the sulfonium salt shown by the general formula (1a) will be described in detail.

In the general formula (1a), $R^0$ represents a hydrogen atom, or a linear, branched, or cyclic monovalent hydrocarbon group having 1 to 30 carbon atoms which may be optionally substituted by a heteroatom or interposed by a heteroatom. Specific example thereof includes a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.0$^{2,6}$]decanyl group, and an adamantyl group. In addition, a part of hydrogen atoms in these groups may be displaced by a heteroatom such as an oxygen atom, a sulfur atom, a nitrogen atom, and a halogen atom, and may be interposed by a heteroatom such as an oxygen atom, a sulfur atom, and a nitrogen atom; and as a result, the hydrocarbon groups may form or be interposed by a hydroxy group, a cyano group, a carbonyl group, an ether bond, an ester bond, a sulfonate ester bond, a carbonate bond, a lactone ring, a sultone ring, a carboxylic acid anhydride, and a halogenated alkyl group.

Specific example of the preferable structure of $R^0$ in the general formula (1a) includes the followings. However, the sulfonium salt of the present invention is not limited to these.

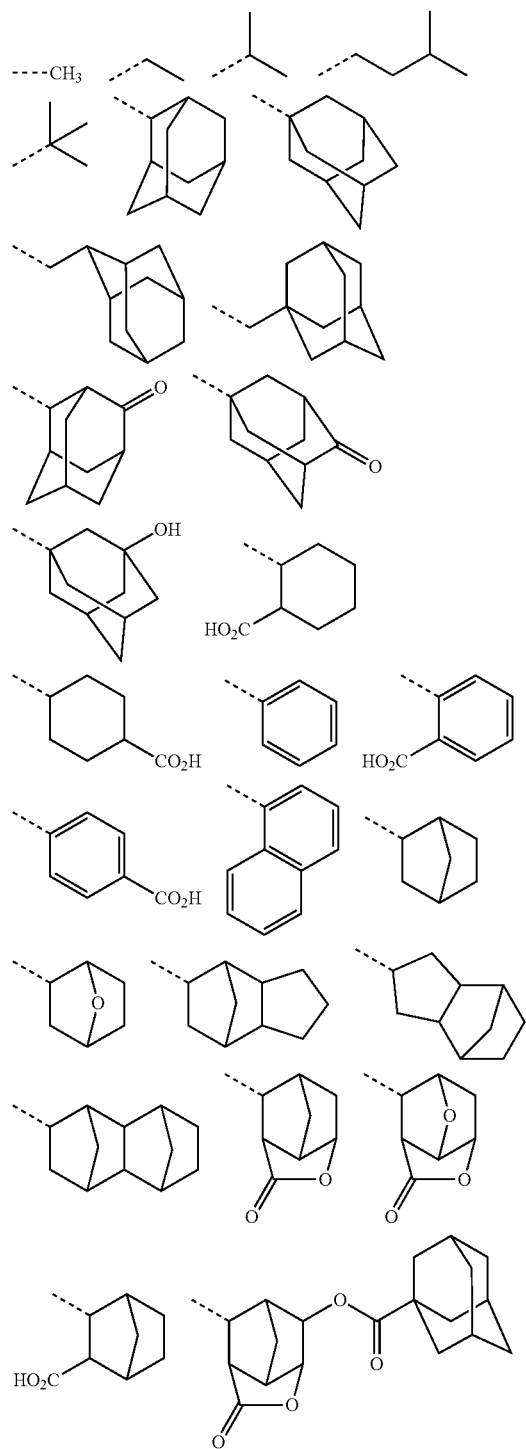

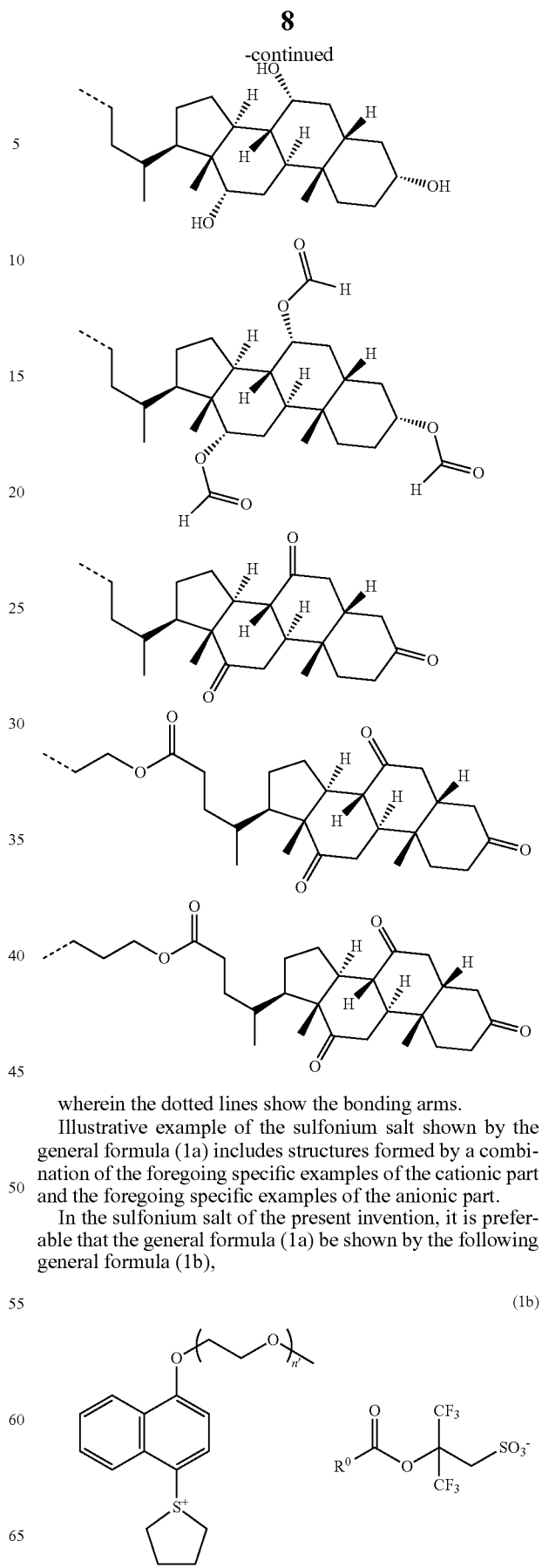

wherein the dotted lines show the bonding arms.

Illustrative example of the sulfonium salt shown by the general formula (1a) includes structures formed by a combination of the foregoing specific examples of the cationic part and the foregoing specific examples of the anionic part.

In the sulfonium salt of the present invention, it is preferable that the general formula (1a) be shown by the following general formula (1b), (1b)

wherein R⁰ represents the same meaning as before; and n' represents an integer of 1 to 4.

In the general formula (1b), specifically R⁰ represents the same meaning as before; and n' represents an integer of 1 to 4. If n' is 1 or more, solubility thereof in the resist composition is excellent, so that defects may not appear easily after development. If n' is 5 or more, the same effect may be expected; but in view of availability of the raw material thereof, n' is preferably in the range of 1 to 4.

The sulfonium salts of the present invention are excellent in solubility in the resist composition. One reason for this may be attributed to an ether bond attached to the naphthalene ring, which is generally poor in solubility in a solvent. Especially sulfonium salts shown by the formula (1b) are excellent in compatibility with a resist solvent, typically represented by propylene glycol monomethyl ether acetate, cyclohexanone, γ-butyrolactone, and the like, owing to the alkyl group that is interposed by two or more oxygen atoms (glyme chain) in the cationic part. Accordingly, if development and patterning are done by using the resist composition which contains these sulfonium salts, the sulfonium salts or cationic decomposition products thereof are difficult to remain as a residue; and as a result, this brings about an advantageous effect not causing the defects readily.

Illustrative example of the especially suitable sulfonium salt shown by the general formula (1b) includes the followings. However, the sulfonium salt of the present invention is not limited to these compounds.

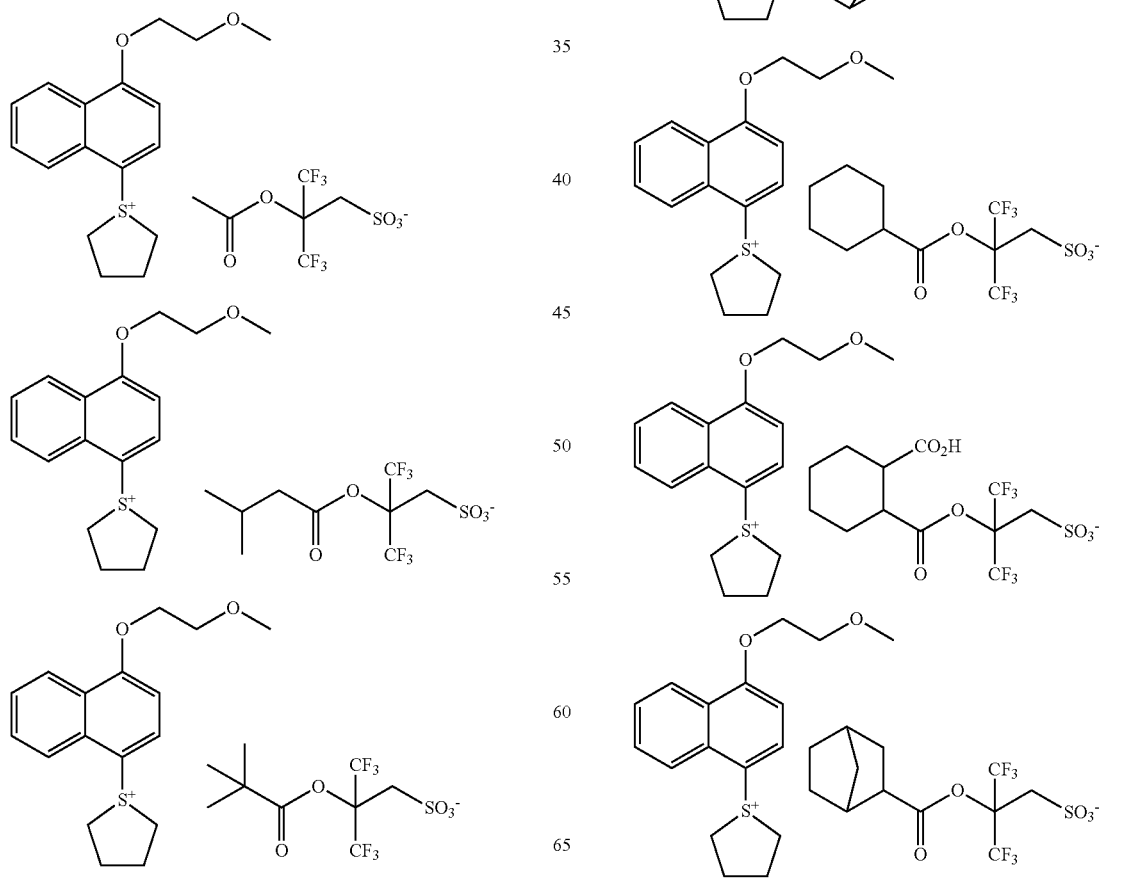

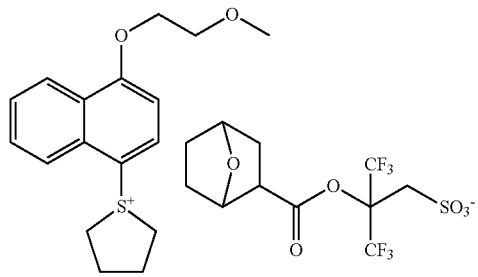
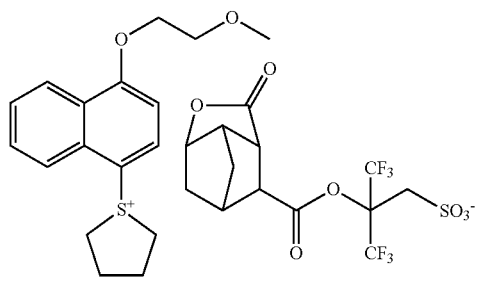
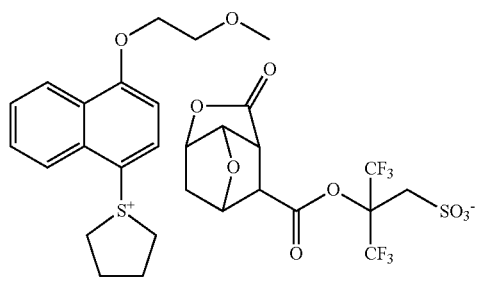
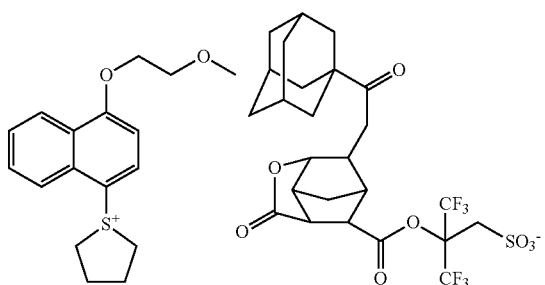
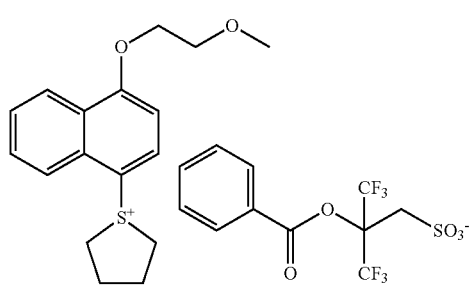
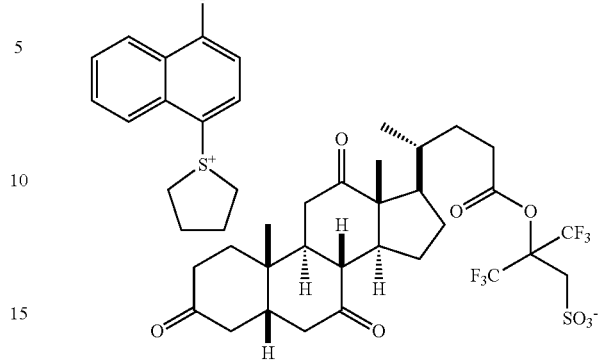
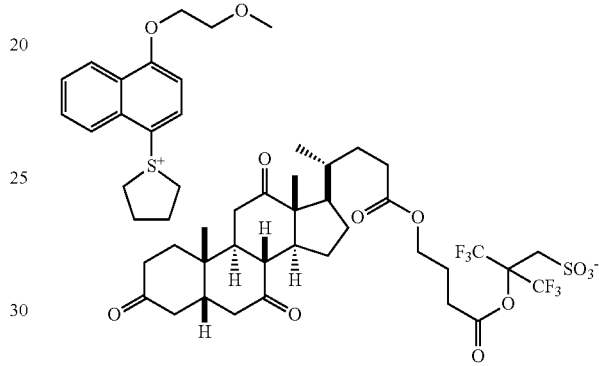
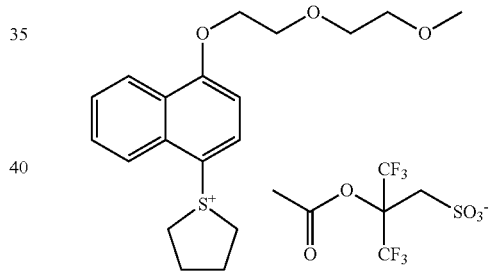
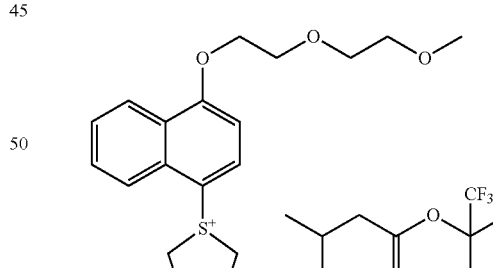
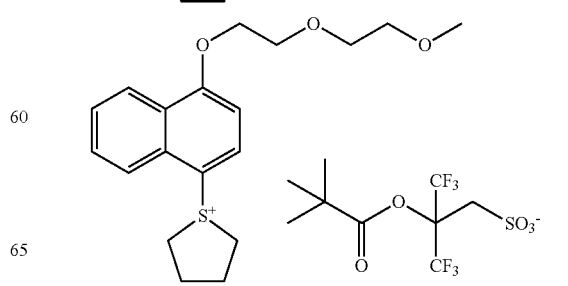

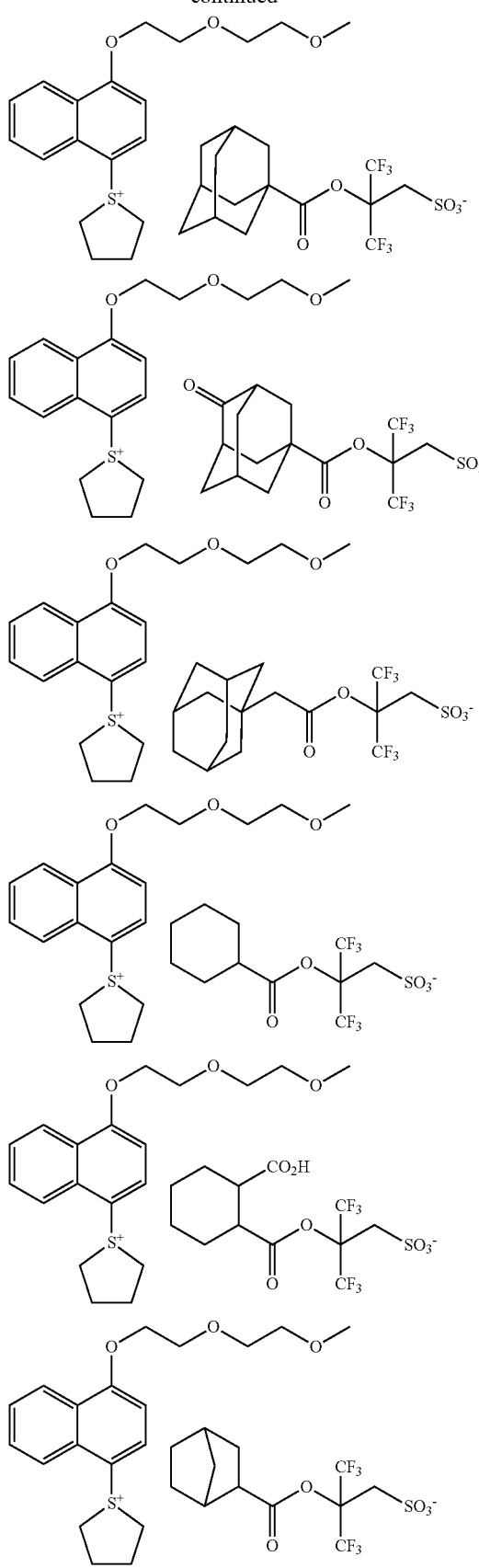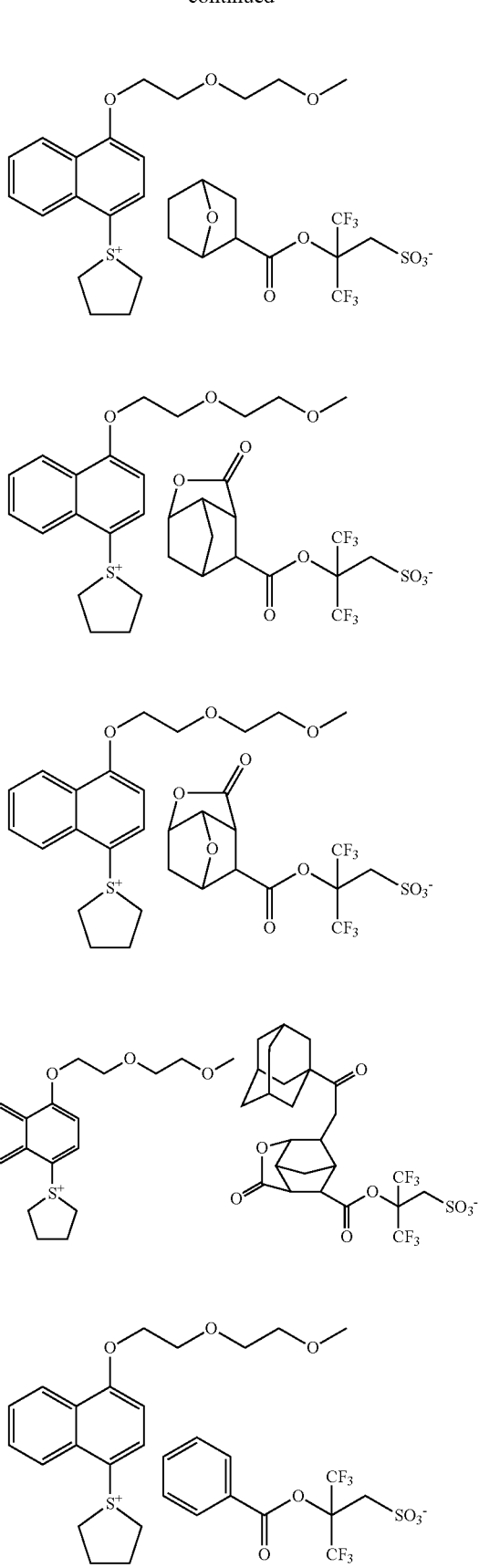

-continued

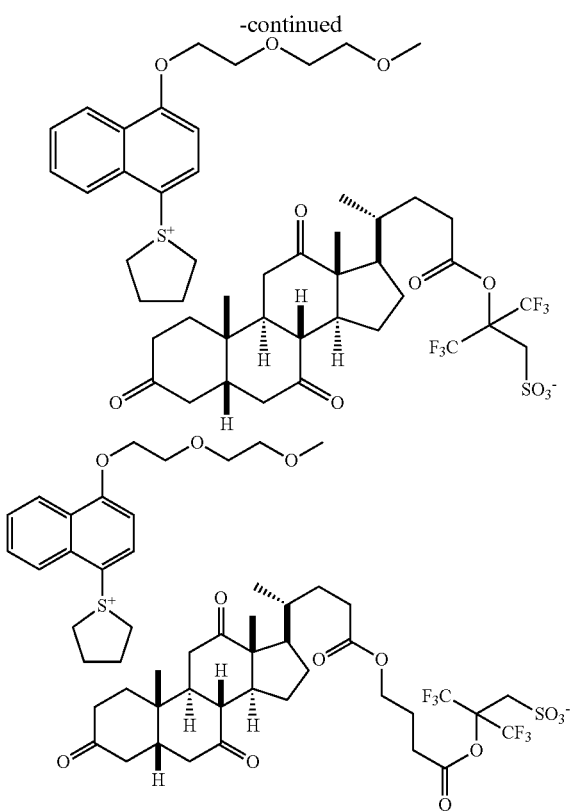

Here, advantageous effects of the sulfonium salt of the present invention will be mentioned. Anions of perfluorobutane sulfonic acid and the like that have been used in the past are high in diffusibility although the acid strength of the generated acid is sufficient. If acid diffusibility is too high, various resist performances cannot be expressed, especially LWR cannot be lowered; however, in the anion of the sulfonium salt of the present invention, the diffusibility can be controlled by selecting appropriate $R^o$. In recent years, partially fluorinated alkanesulfonic acid salts with the type of an $\alpha,\alpha$-difluorosulfonate such as, for example, triphenylsulfonium=2-(adamantane-1-carbonyloxy)-1,1,3,3,3-pentafluoropropane-1-sulfonate shown in Japanese Patent Laid-Open Publication No. 2007-145797 (Patent Document 4) and triphenylsulfonium=1-adamantylmethoxycarbonyl difluoromethanesulfonate shown in Japanese Patent Laid-Open Publication No. 2006-257078 have been developed. These have a relatively high degree of freedom with regard to the structural modification thereof, and thus, depending on the substituent thereof, the acid diffusion thereof can be suppressed to a certain degree; however, the lithography performance thereof has been insufficient so that the desired lithography performance has not been secured yet. On the other hand, in the anion structure of the sulfonium salt of the present invention, an acid strength of the generated acid is a little bit weaker than the reported salts because the trifluoromethyl group is located at the β-position of the sulfo group; and thus, the acid shows apparently a behavior of suppressed acid diffusion. As a result, the LWR of the sulfonium salt of the present invention can be made lower as compared with existing sulfonium salts.

The sulfonium salt of the present invention, owing to the cation structure thereof, also keeps an appropriate transparency without significantly losing the acid generation efficiency thereof, so that a pattern having a high resolution, especially an excellent rectangularity, can be formed. 1-Naphthyltetrahydrothiophenium cation like this has already been developed as described in Japanese Patent No. 3632410 (Patent Document 5), but the suppression capacity of the acid diffusion thereof is insufficient although the resolution power thereof is to some extent fine; and thus, LWR was not satisfactorily lowered. Accordingly, the resist composition not existing before, having an excellent LWR while securing excellent resolution and pattern form, is provided by using the sulfonium salt of the present invention having the cationic part and the anionic part.

In addition, the sulfonium salt of the present invention is excellent in solubility in the resist composition. Because of this, when development is done by using the resist composition of the present invention, it is difficult to remain as a residue; and as a result, this brings about an advantageous effect not causing the defects readily. As can be seen in the above explanation, the resist composition using the sulfonium salt of the present invention is especially useful in the fine patterning process from the ArF lithography onward.

The sulfonium cation of the general formula (1a) or (1b) may be easily synthesized by a conventional two-stage method of i) synthesis of an alkoxynaphthalene and ii) synthesis of a sulfonium cation. For example, in the case of n'=1 in the general formula (1b), specifically 2-methoxyethylchloride and 1-naphthol are reacted under a basic condition to synthesize 1-(2-methoxyethoxy)naphthalene. Then, this compound and tetramethylene sulfoxide are treated in a solution of diphosphorous pentaoxide in methanesulfonic acid to synthesize the sulfonium cation. In the case that n' is 2 to 4, too, the sulfonium cation can be synthesized by using the corresponding substituted alkyl halide and so on.

The anion of the sulfonium salt shown by the general formula (1a) or (1b) may be synthesized by referring to Japanese Patent Laid-Open Publication No. 2010-215608.

The ion-exchange reaction of the cation and the anion may be carried out in an organic solvent alone or together with water; the organic solvent being dichloromethane, ethyl acetate, methyl isobutyl ketone, methanol, ethanol, acetonitrile, and the like.

The sulfonium cation and the sulfonate anion mentioned above may be combined appropriately by arbitrarily selecting these ions in view of stability of the sulfonium cation in the resist composition, the acid generation efficiency at the wavelength of the exposure light, the diffusibility of the generated acid, and the like.

Secondarily, the present invention can provide a chemically amplified resist composition comprising: as essential components, (A) a sulfonium salt shown by the general formula (1a) or (1b), (B) a base resin, and (C) an organic solvent; and as other components, (D) a basic compound (quencher), (E) a surfactant which is insoluble or poorly soluble in water but soluble in an alkaline developing solution, and/or a surfactant which is insoluble or poorly soluble in water and an alkaline developing solution (hydrophobic resin); further, if necessary, (F) a photo-sensitive acid generator other than the sulfonium salt shown by the general formula (1a) or (1b) (photo-sensitive acid generator); further, if necessary, (G) an organic acid derivative and/or a fluorine-substituted alcohol; and the like.

The sulfonium salt (A) of the present invention (photo-sensitive acid generator) is as shown above; and the blending amount thereof is in the range of 0.1 to 40 parts (parts by mass, the same shall apply hereafter), or particularly preferably in the range of 1 to 20 parts, relative to 100 parts of a base resin in the resist composition.

(B) Base Resin

The base resin to be used in the resist composition of the present invention is preferably a polymer compound containing a repeating unit shown by the following general formula (2) and a repeating unit shown by the following general formula (3),

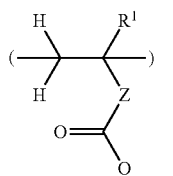

(2)

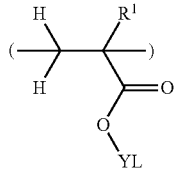

(3)

wherein $R^1$ represents a hydrogen atom, a fluorine atom, a methyl group, or a trifluoromethyl group. Z represents any of a single bond, a phenylene group, a naphthylene group, and (main chain)—C(=O)—O—Z'—. Z' represents a phenylene group, a naphthylene group, or a liner, branched, or cyclic alkylene group having 1 to 10 carbon atoms which may optionally contain any of a hydroxy group, an ether bond, an ester bond, and a lactone ring. XA represents an acid-labile group. YL represents a hydrogen atom, or a polar group having any one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

Specific example of the structure having the modified Z in the general formula (2) includes the followings.

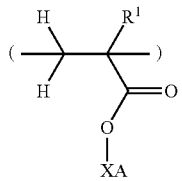 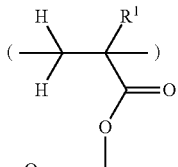

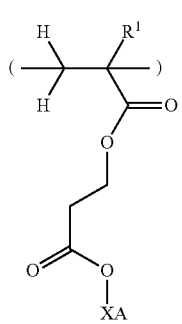 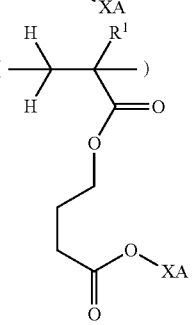

-continued

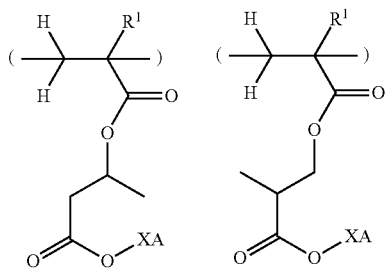

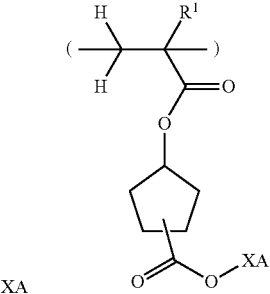

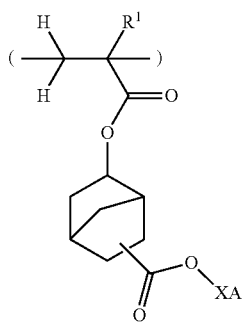 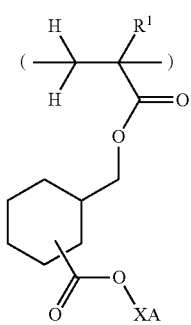

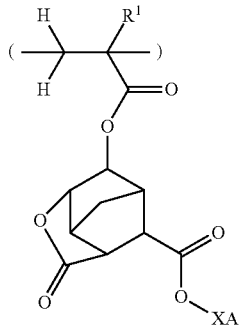 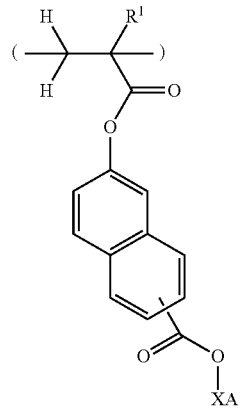

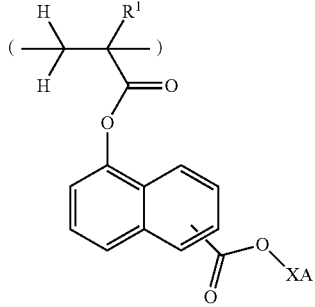

-continued

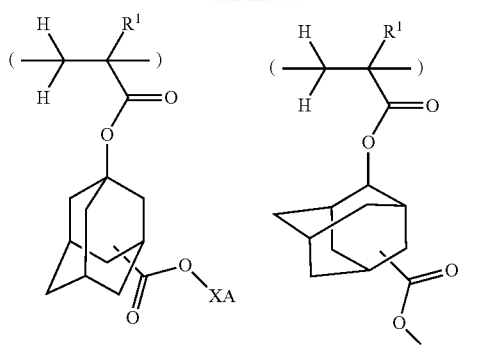
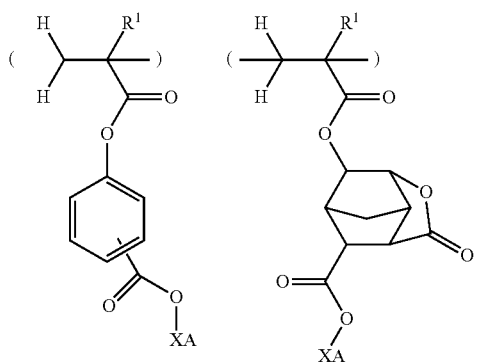
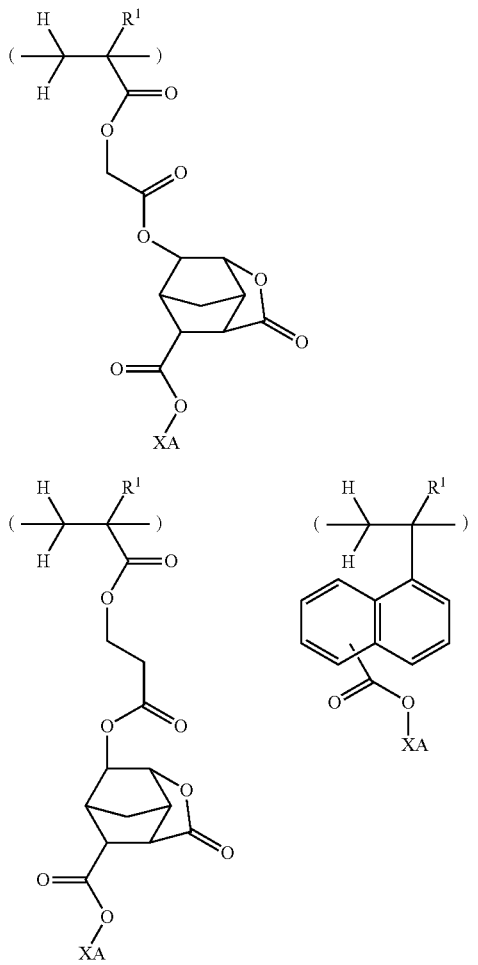

-continued

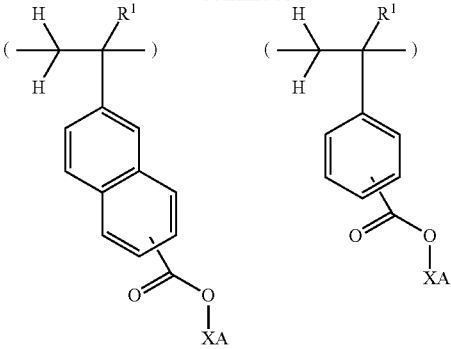

The polymer having the repeating unit shown by the general formula (2) decomposes by action of an acid to generate a carboxylic acid, whereby giving an alkali-soluble polymer. Various kinds of the acid-labile group XA may be used, while specific example thereof includes groups shown by the following general formulae (L1) to (L4), a tertiary alkyl group having 4 to 20 carbon atoms or preferably 4 to 15 carbon atoms, a trialkylsilyl group whose respective alkyl groups have 1 to 6 carbon atoms, and an oxoalkyl group having 4 to 20 carbon atoms.

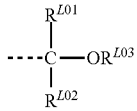
(L1)

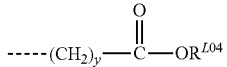
(L2)

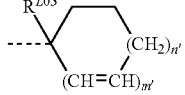
(L3)

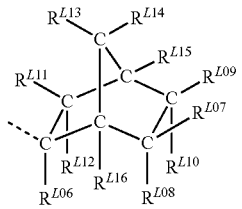
(L4)

Here, the dotted lines show the bonding arms (the same shall apply hereafter).

In the formula (L1), $R^{L01}$ and $R^{L02}$ represent a hydrogen atom, or a linear, branched, or cyclic alkyl group having 1 to 18 carbon atoms, or preferably 1 to 10 carbon atoms; and specific example thereof includes a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. $R^{L03}$ represents a monovalent hydrocarbon group having 1 to 18 carbon atoms or preferably 1 to 10 carbon atoms, which may optionally contain a heteroatom such as an oxygen atom; and illustrative example thereof includes a linear, branched, or cyclic alkyl group, wherein a part of hydrogen atoms in these groups may be substituted by a hydroxy group, an alkoxy group, an oxo group, an amino group, an alkylamino group, and the like, or may be interposed by an oxygen atom between carbon atoms therein. Specific example of the linear, branched, or cyclic alkyl group includes a methyl group, an ethyl group, a propyl group, an isopropyl group, a n-butyl group, a sec-butyl group, a tert-butyl group, a cyclopentyl group, a cyclohexyl group, a 2-ethylhexyl group, a n-octyl group, a norbornyl group, a tricyclodecanyl group, a tetracyclododecanyl group, and an adamantyl group. Specific example of the substituted alkyl group includes the followings.

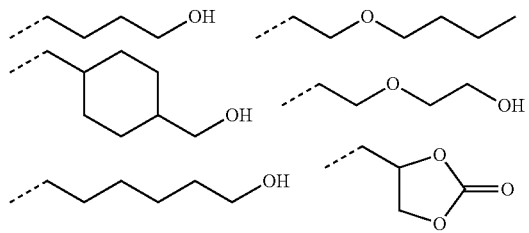

$R^{L01}$ and $R^{L02}$, $R^{L01}$ and $R^{L03}$, $R^{L02}$ and $R^{L03}$ may be bonded with each other to form a ring together with a carbon atom or an oxygen atom to which they are bonded; and in the case of forming the ring, of $R^{L01}$, $R^{L02}$, and $R^{L03}$, each of the groups which involve in the ring formation is a linear or branched alkylene group having 1 to 18 carbon atoms, or preferably 1 to 10 carbon atoms.

In the formula (L2), $R^{L04}$ represents a tertiary alkyl group having 4 to 20 carbon atoms or preferably 4 to 15 carbon atoms, a trialkylsilyl group with the number of carbon atoms in the respective alkyl groups therein being 1 to 6, an oxoalkyl group having 4 to 20 carbon atoms, or a group shown by the general formula (L1); and specific example of the tertiary alkyl group includes a tert-butyl group, a tert-amyl group, a 1,1-diethylpropyl group, a 2-cyclopentylpropane-2-yl group, a 2-cyclohexylpropane-2-yl group, a 2-(bicyclo[2.2.1]heptane-2-yl)propane-2-yl group, a 2-(adamantane-1-yl)propane-2-yl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, and a 2-ethyl-2-adamantyl group. Specific example of the trialkylsilyl group includes a trimethylsilyl group, a triethylsilyl group, and a dimethyl-tert-butylsilyl group; and specific example of the oxoalkyl group includes a 3-oxocyclohexyl group, a 4-methyl-2-oxooxane-4-yl group, and a 5-methyl-2-oxooxolane-5-yl group. Character "y" represents an integer of 0 to 6.

In the formula (L3), $R^{L05}$ represents a linear, branched, or cyclic alkyl group having 1 to 8 carbon atoms which may be optionally substituted, or an aryl group having 6 to 20 carbon atoms which may be optionally substituted. Specific example of the optionally substituted alkyl group includes linear, branched, or cyclic alkyl groups such as a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group; and these groups having a part of hydrogen atoms thereof substituted by a hydroxy group, an alkoxy group, a carboxy group, an alkoxycarbonyl group, an oxo group, an amino group, an alkylamino group, a cyano group, a mercapto group, an alkylthio group, a sulfo group, and the like. Specific example of the optionally substituted aryl group includes a phenyl group, a methylphenyl group, a naphthyl group, an anthryl group, a phenanthryl group, and a pyrenyl group. Character m' represents 0 or 1, and n' represents any of 0, 1, 2, and 3, wherein m' and n' are the numbers satisfying 2m'+n'=2 or 3.

In the formula (L4), $R^{L06}$ represents a linear, branched, or cyclic alkyl group having 1 to 8 carbon atoms which may be optionally substituted, or an aryl group having 6 to 20 carbon atoms which may be optionally substituted; and specifically, the same groups as the specific examples of $R^{L05}$ may be mentioned. Each of $R^{L07}$ to $R^{L16}$ independently represents a hydrogen atom or a monovalent hydrocarbon group having 1 to 15 carbon atoms; and specific example thereof includes linear, branched, or cyclic alkyl groups such as a methyl group, an ethyl group, a propyl group, an isopropyl group, a n-butyl group, a sec-butyl group, a tert-butyl group, a tert-amyl group, a n-pentyl group, a n-hexyl group, a n-octyl group, a n-nonyl group, a n-decyl group, a cyclopentyl group, a cyclohexyl group, a cyclopentylmethyl group, a cyclopentylethyl group, a cyclopentylbutyl group, a cyclohexylmethyl group, a cyclohexylethyl group, and a cyclohexylbutyl group; and these groups having a part of hydrogen atoms thereof substituted by a hydroxy group, an alkoxy group, a carboxy group, an alkoxycarbonyl group, an oxo group, an amino group, an alkylamino group, a cyano group, a mercapto group, an alkylthio group, a sulfo group, and the like. $R^{L07}$ to $R^{L16}$ may be bonded with each other by two of them to form a ring together with a carbon atom to which they are bonded (for example, such as, $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, and $R^{L13}$ and $R^{L14}$); and in this case, the group which involves in this bonding is a divalent hydrocarbon group having 1 to 15 carbon atoms, and specific example thereof includes a group having one hydrogen atom removed from the monovalent hydrocarbon groups that are exemplified above. In addition, $R^{L07}$ to $R^{L16}$ may be bonded between the groups bonded to the neighboring carbon atoms to form a double bond without any interposition (for example, such as, $R^{L07}$ and $R^{L09}$, $R^{L09}$ and $R^{L15}$, $R^{L13}$ and $R^{L15}$, and $R^{L14}$ and $R^{L15}$).

Specific example of the linear or branched acid-labile group among the groups shown by the formula (L1) includes the following groups.

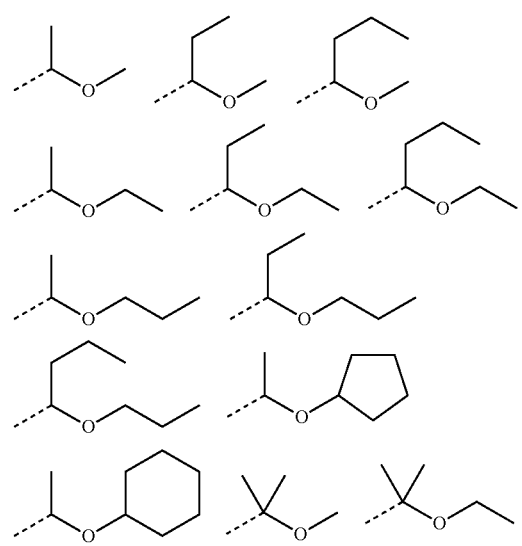

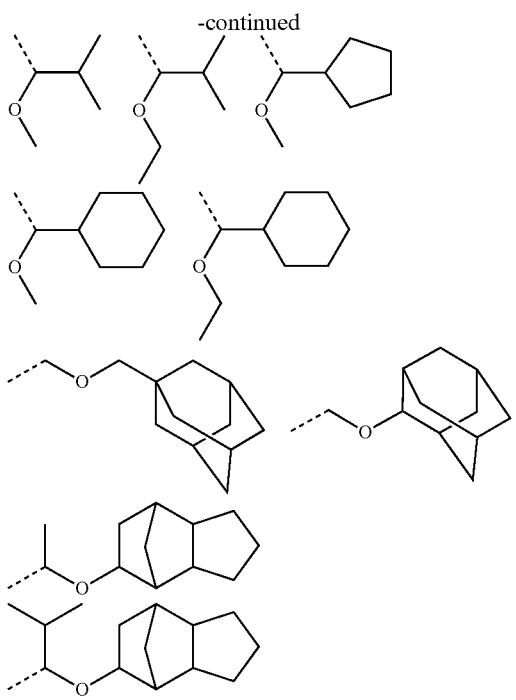

Specific example of the cyclic acid-labile group among the groups shown by the formula (L1) includes a tetrahydrofuran-2-yl group, a 2-methyltetrahydrofuran-2-yl group, a tetrahydropyran-2-yl group, and a 2-methyltetrahydropyran-2-yl group.

Specific example of the acid-labile group of the formula (L2) includes a tert-butoxycarbonyl group, a tert-butoxycarbonylmethyl group, a tert-amyloxycarbonyl group, a tert-amyloxycarbonylmethyl group, a 1,1-diethylpropyloxycarbonyl group, a 1,1-diethylpropyloxycarbonylmethyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopentenyloxycarbonylmethyl group, a 1-ethoxyethoxycarbonylmethyl group, a 2-tetrahydropyranyloxycarbonylmethyl group, and a 2-tetrahydrofuranyloxycarbonylmethyl group.

Specific example of the acid-labile group of the formula (L3) includes a 1-methylcyclopentyl group, a 1-ethylcyclopentyl group, a 1-n-propylcyclopentyl group, a 1-isopropylcyclopentyl group, a 1-n-butylcyclopentyl group, a 1-sec-butylcyclopentyl group, a 1-cyclohexylcyclopentyl group, a 1-(4-methoxy-n-butyl)cyclopentyl group, a 1-methylcyclohexyl group, a 1-ethylcyclohexyl group, a 3-methyl-1-cyclopentene-3-yl group, a 3-ethyl-1-cyclopentene-3-yl group, a 3-methyl-1-cyclohexene-3-yl group, and a 3-ethyl-1-cyclohexene-3-yl group.

As to the acid-labile group of the formula (L4), the groups shown by the following general formulae (L4-1) to (L4-4) are especially preferable.

(L4-1)

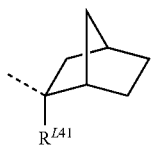

(L4-2)

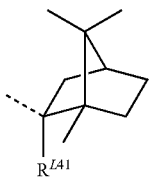

(L4-3)

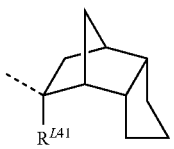

(L4-4)

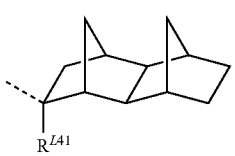

In the formulae (L4-1) to (L4-4), the dotted lines show the bonding sites and the bonding directions. Each of $R^{L41}$ independently represents a monovalent hydrocarbon group such as a linear, branched, or cyclic alkyl group having 1 to 10 carbon atoms; and specific example thereof includes a methyl group, an ethyl group, a propyl group, an isopropyl group, a n-butyl group, a sec-butyl group, a tert-butyl group, a tert-amyl group, a n-pentyl group, a n-hexyl group, a cyclopentyl group, and a cyclohexyl group.

In the general formulae (L4-1) to (L4-4), an enantiomer and a diastereomer can exist; and the general formulae (L4-1) to (L4-4) represent all these stereoisomers. These stereoisomers may be used solely or as a mixture of them.

For example, the general formula (L4-3) represents one kind or a mixture of two kinds selected from the groups shown by the following (L4-3-1) and (L4-3-2).

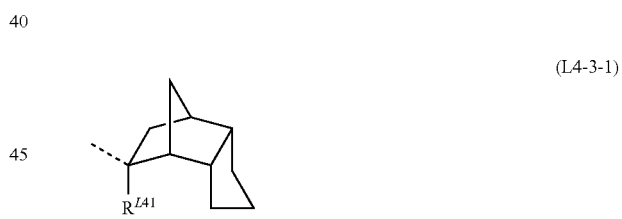

The general formula (L4-4) represents one kind or a mixture of two or more kinds selected from the groups shown by the following (L4-4-1) to (L4-4-4).

(L4-4-1)

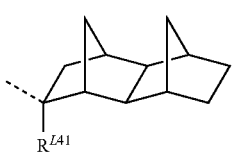

-continued

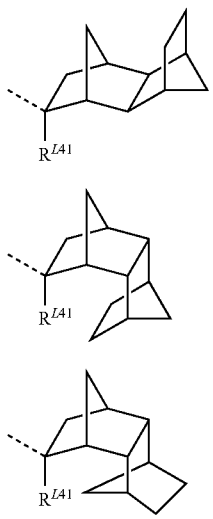

(L4-4-2)

(L4-4-3)

(L4-4-4)

The general formulae (L4-1) to (L4-4), (L4-3-1), (L4-3-2), and (L4-4-1) to (L4-4-4) represent also enantiomers thereof and mixtures of these enantiomers.

Meanwhile, by making the respective bonding directions of the general formulae (L4-1) to (L4-4), (L4-3-1), (L4-3-2), and (L4-4-1) to (L4-4-4) toward the exo side relative to the bicyclo[2.2.1]heptane ring, a high reactivity can be realized in the acid-catalyzed elimination reaction (refer to Japanese Patent Laid-Open Publication No. 2000-336121). In the method for producing a monomer having a tertiary exo-alkyl group having these bicyclo[2.2.1]heptane skeleton as a substituent group, there is a case of including a monomer that is substituted with an endo-alkyl group shown by the following general formulae (L4-1-endo) to (L4-4-endo); and in this case, to realize a high reactivity, the exo ratio thereof is preferably 50% or more by mol, or more preferably 80% or more by mol.

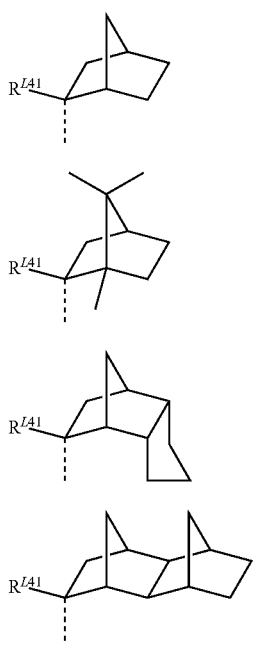

(L4-1-endo)

(L4-2-endo)

(L4-3-endo)

(L4-4-endo)

Specific example of the acid-labile group of the formula (L4) includes the following groups.

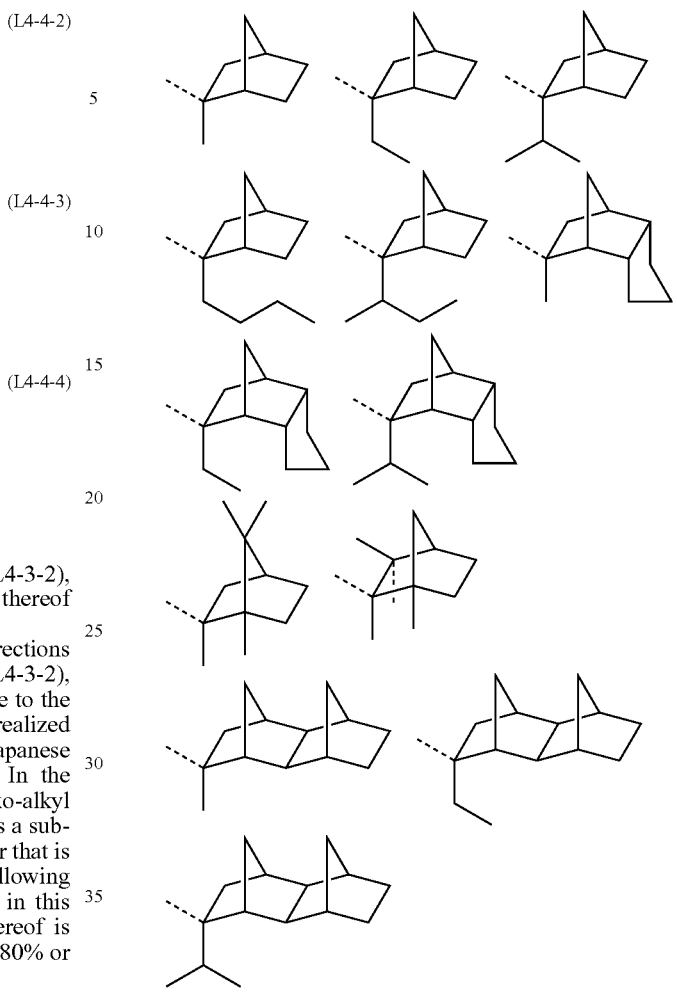

Specific example of the tertiary alkyl group having 4 to 20 carbon atoms, the trialkylsilyl group with the number of carbon atoms in the respective alkyl groups thereof being 1 to 6, and the oxoalkyl group having 4 to 20 carbon atoms includes the same groups as those mentioned in $R^{LO4}$.

Specific example of the repeating unit shown by the general formula (2) includes the followings, though not limited to them.

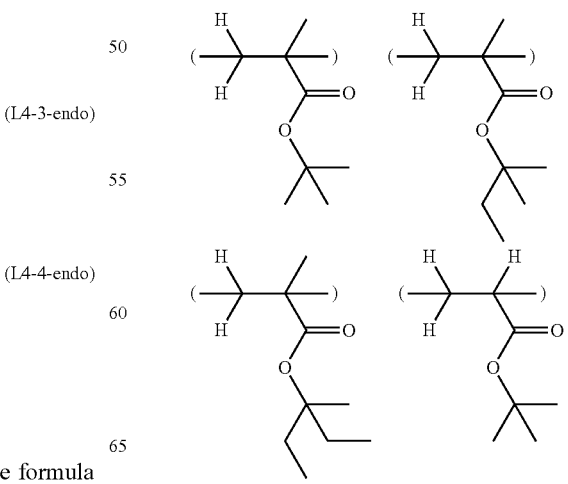

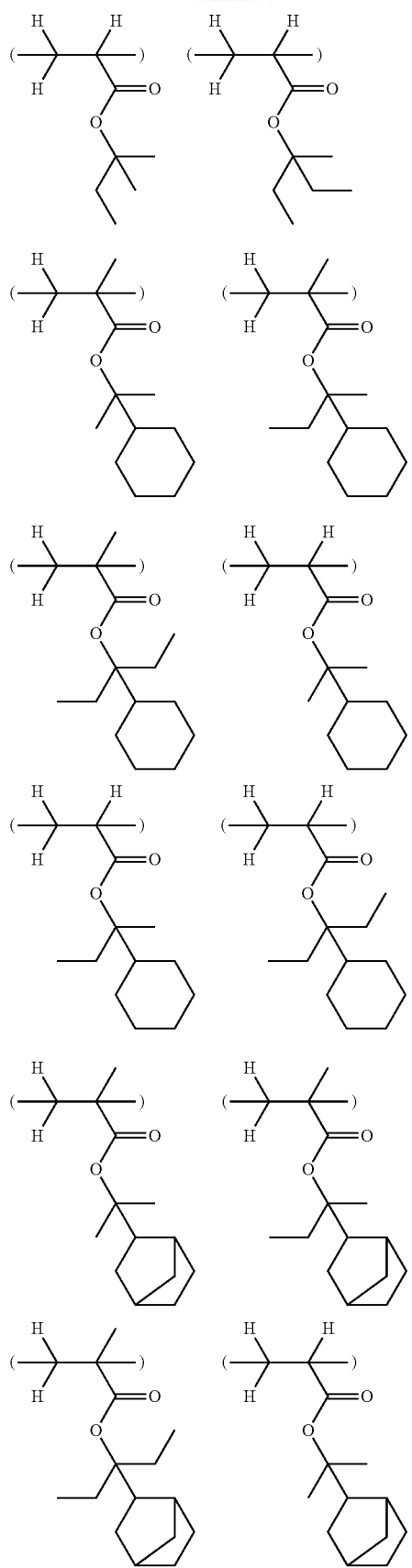
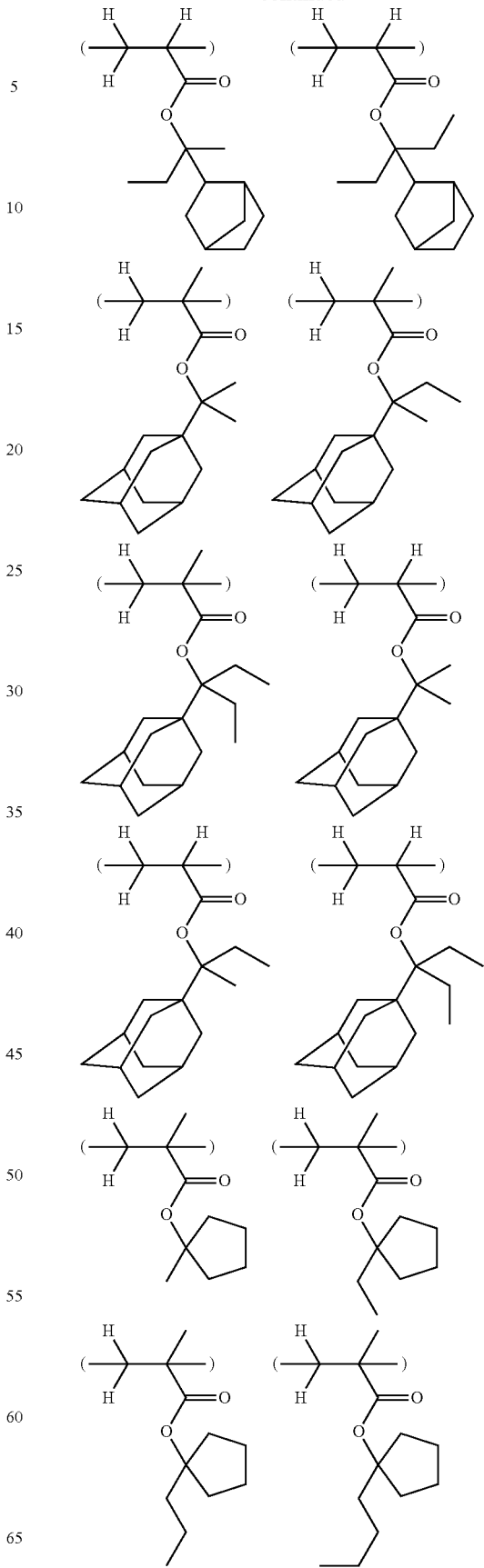

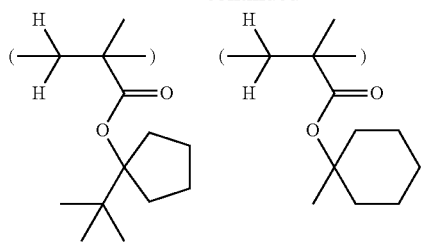
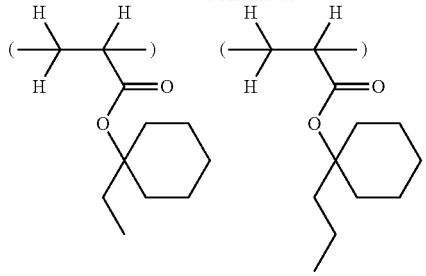
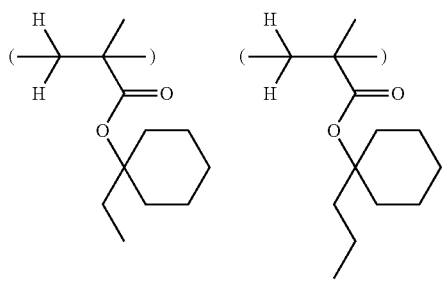
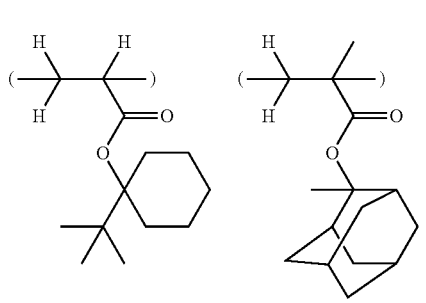
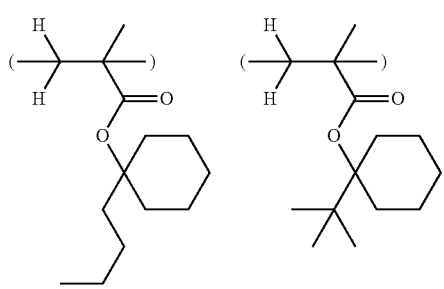
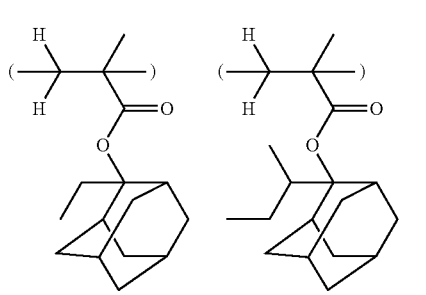
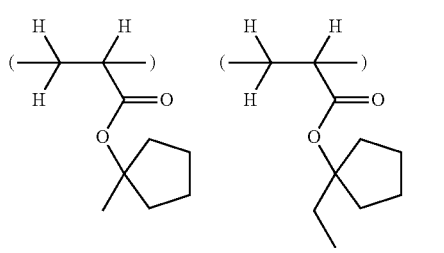
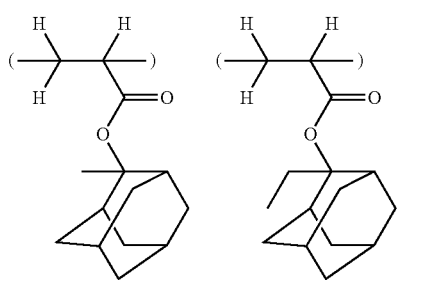
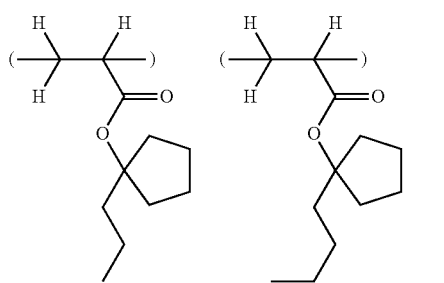
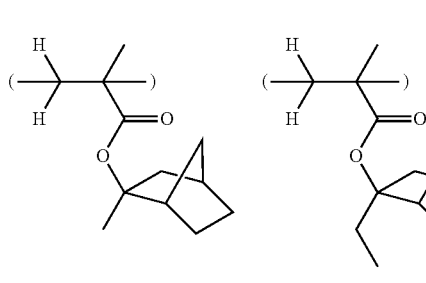
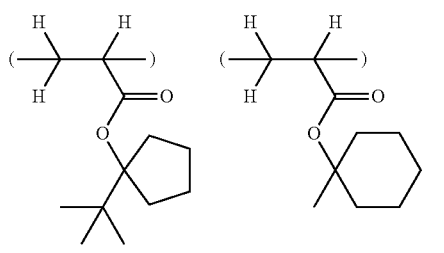
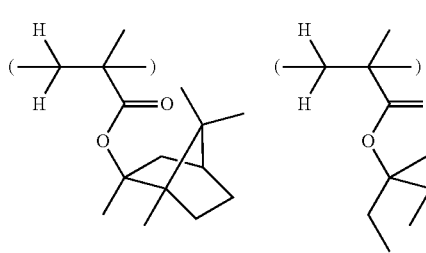

-continued
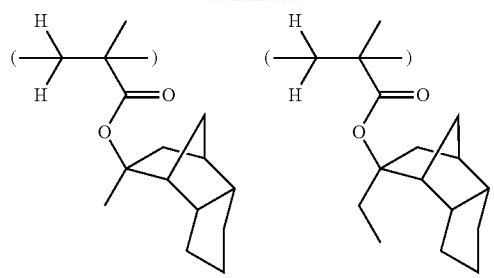
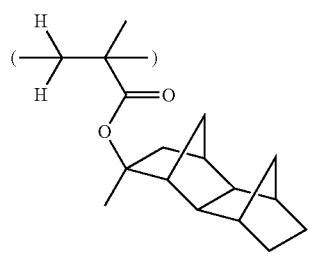
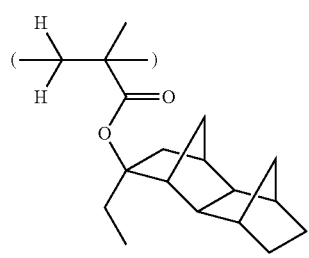
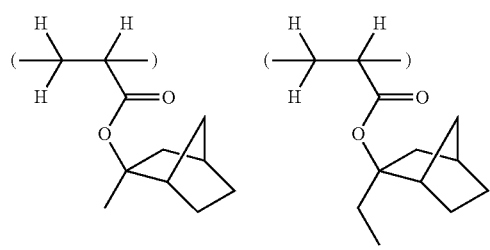
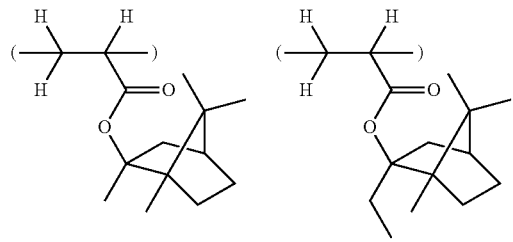
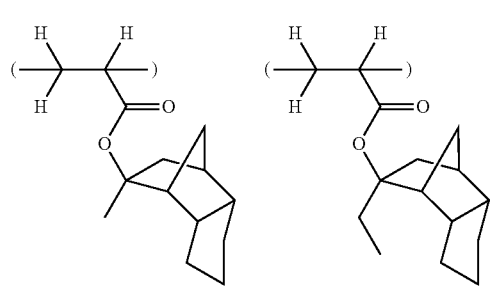
-continued
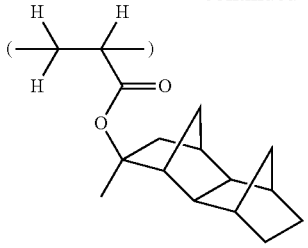
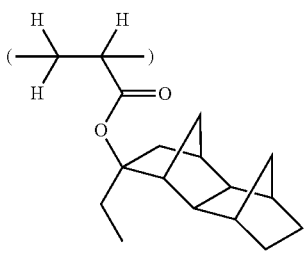
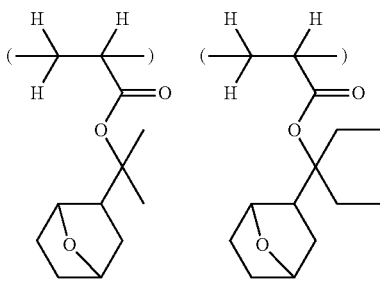
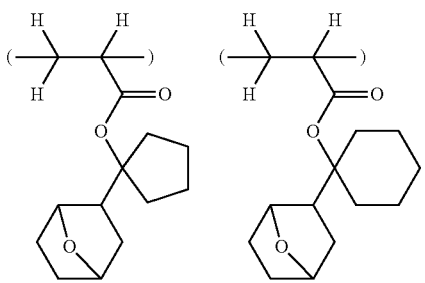
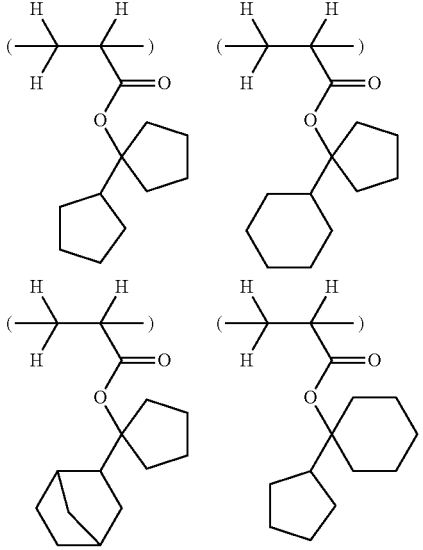

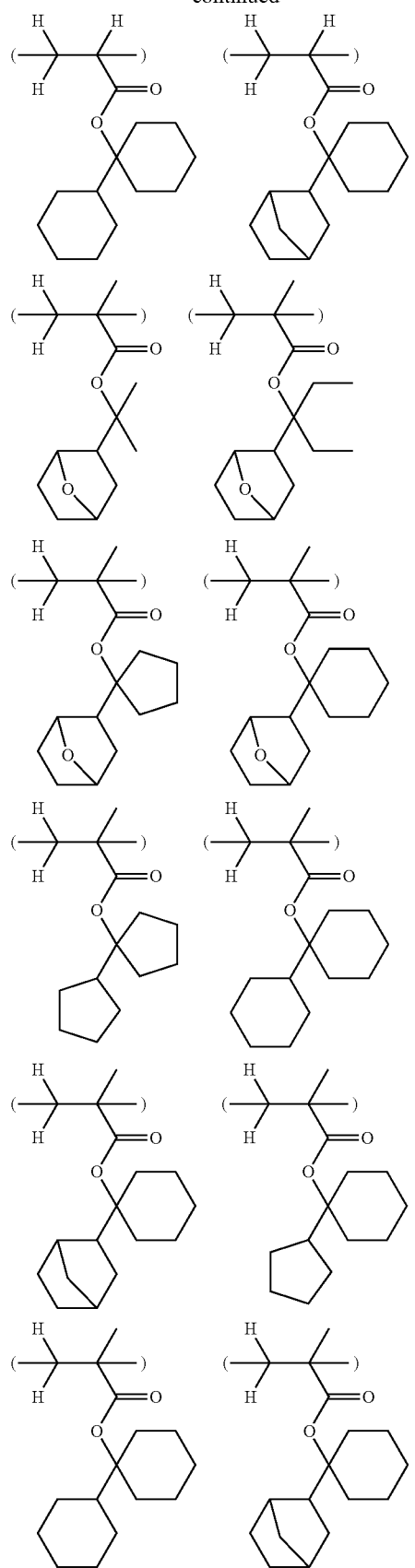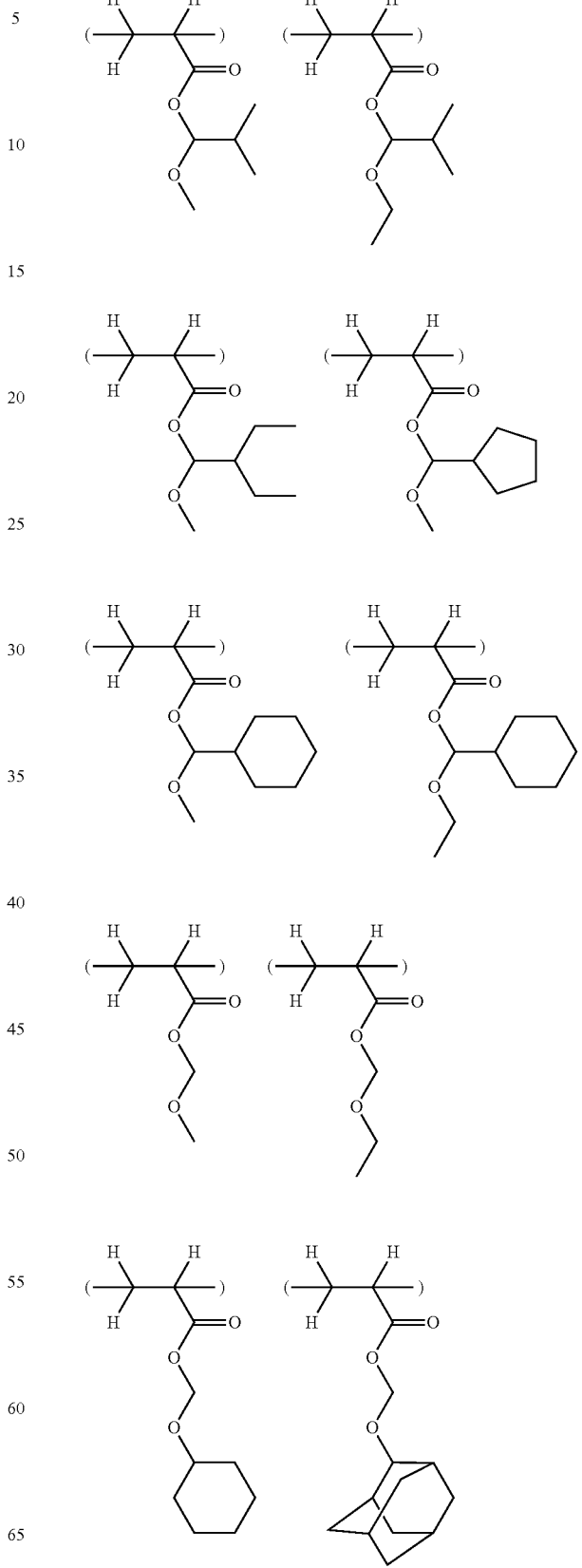

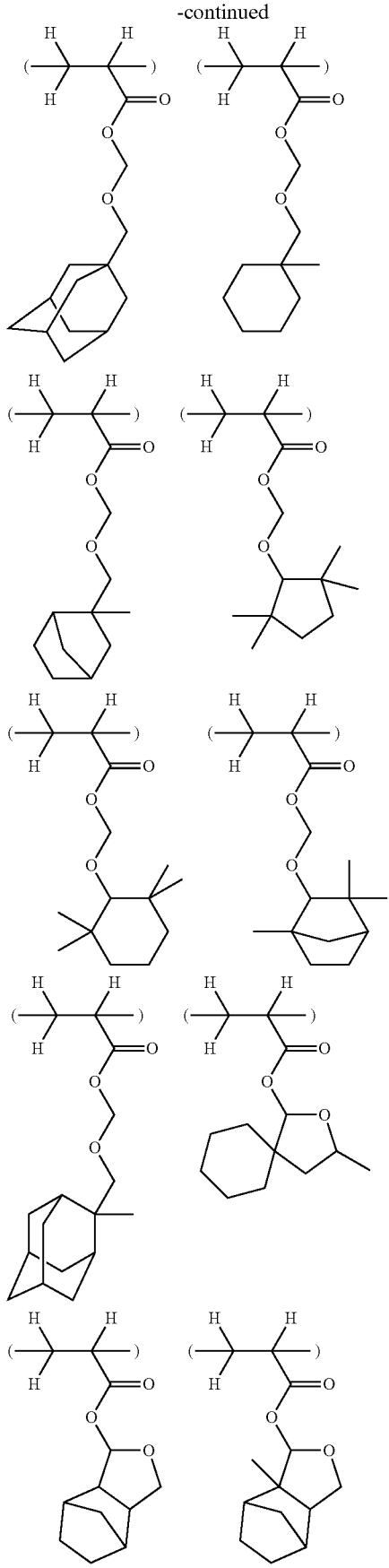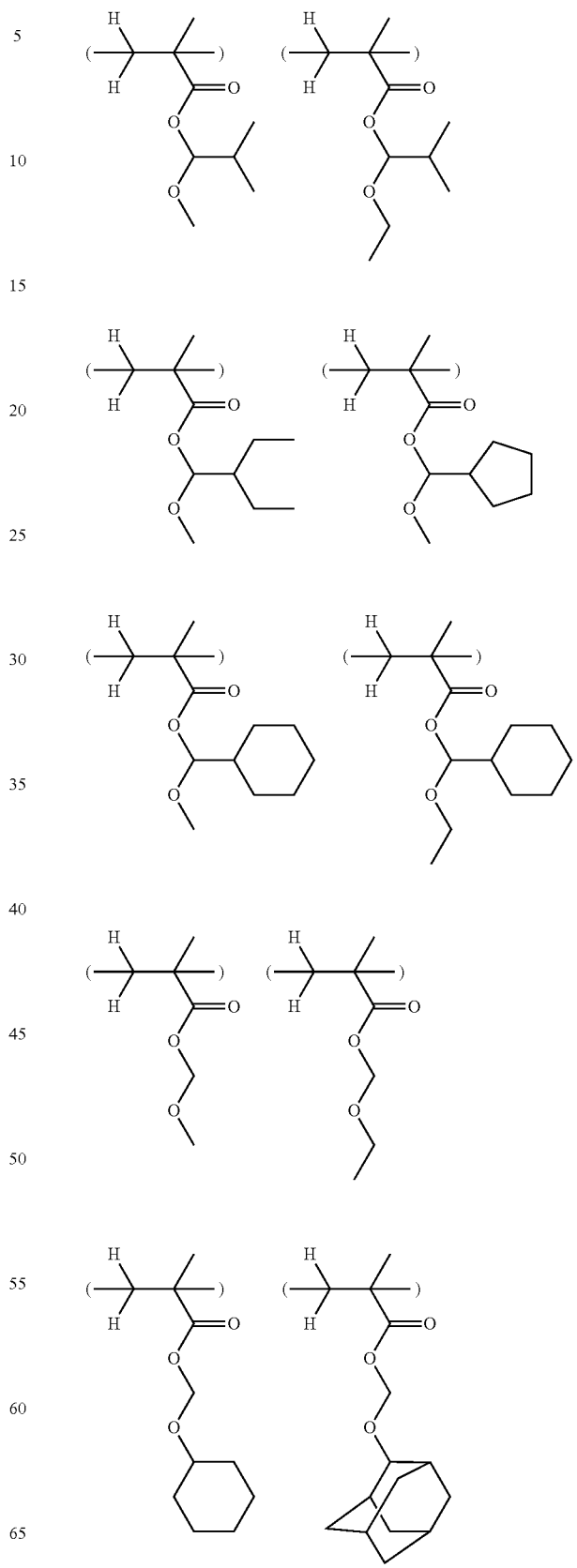

-continued

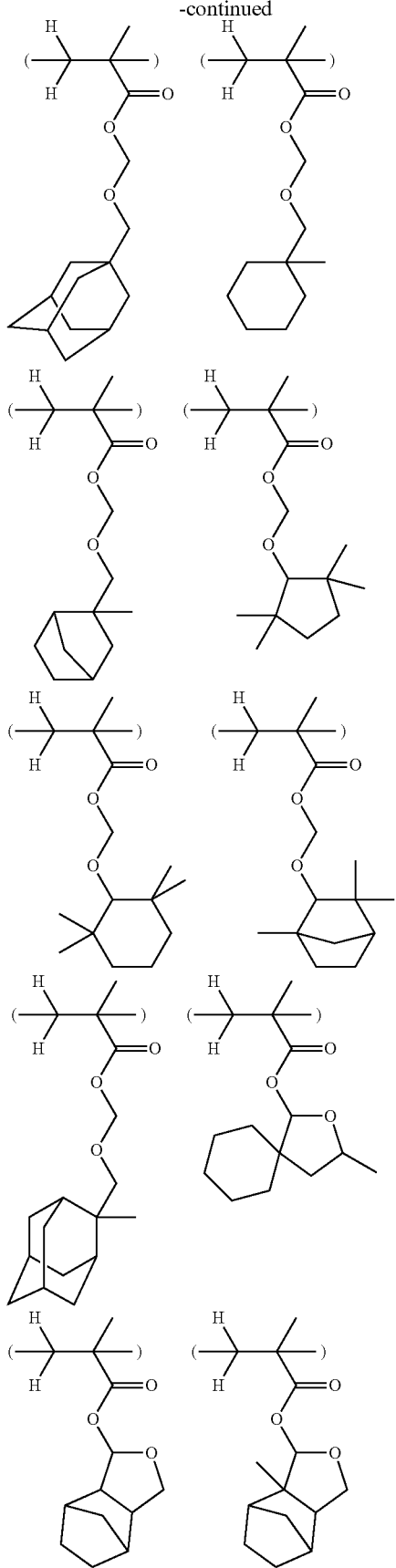

The specific examples shown above are in the case that Z is a single bond; however, in the case that Z is other than a single bond, too, similar acid-labile groups may be combined therewith. Those having a single bond Z displaced with a bond other than the single bond may be mentioned.

In the general formula (3), YL represents a hydrogen atom, or a polar group having any one or a plurality of structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride. Specific example thereof includes the followings, though not limited to them.

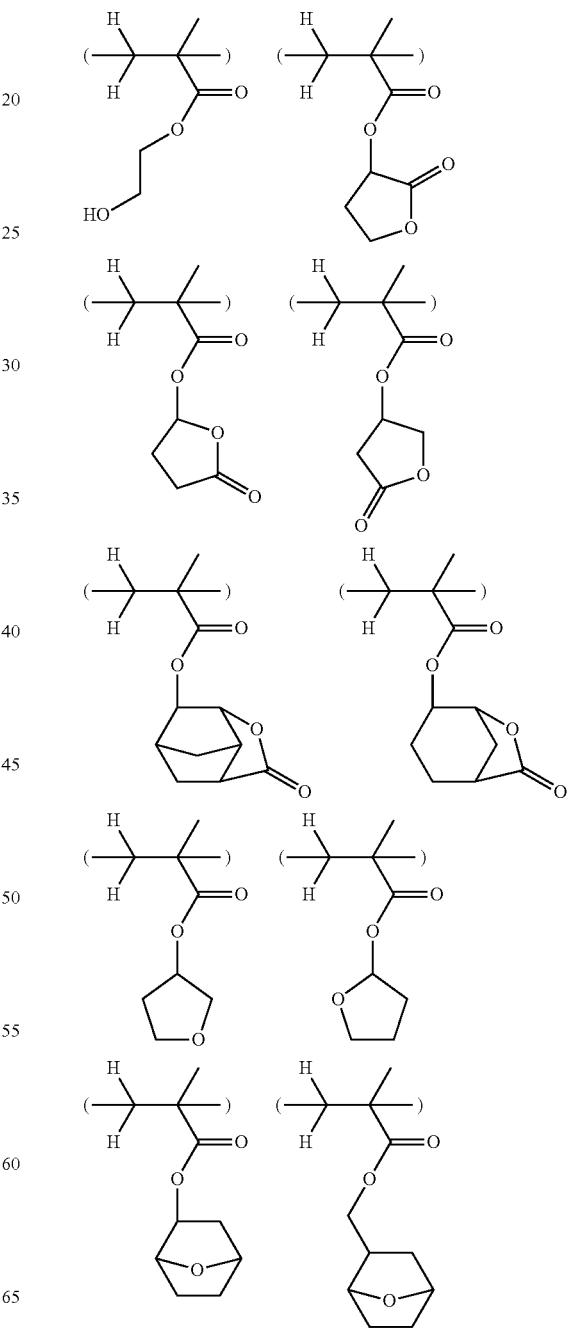

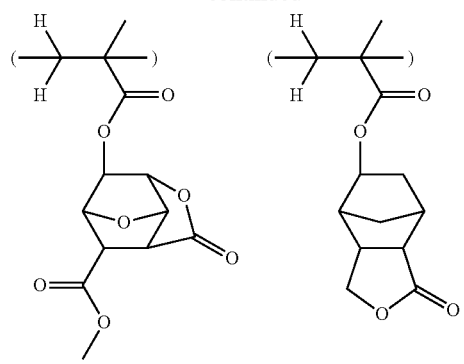
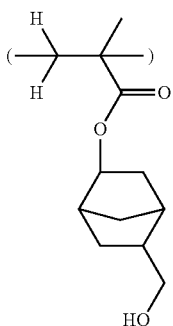
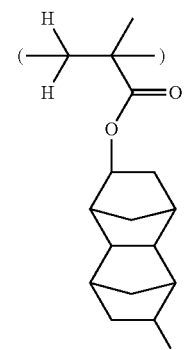
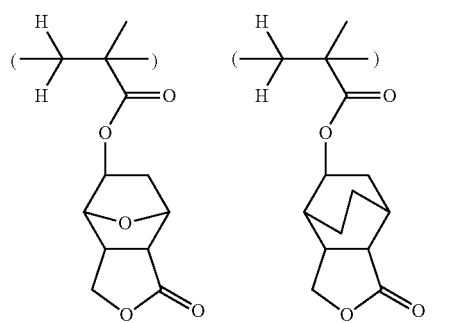
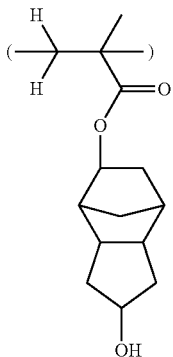
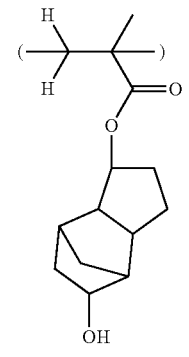
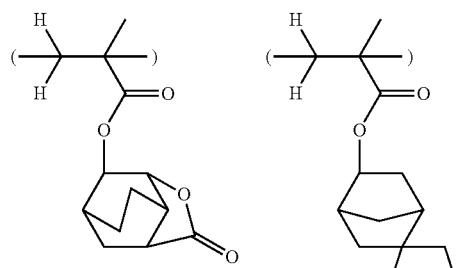
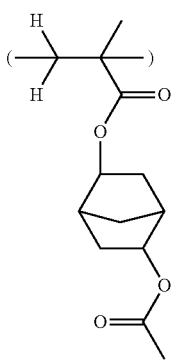
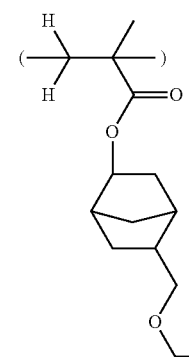
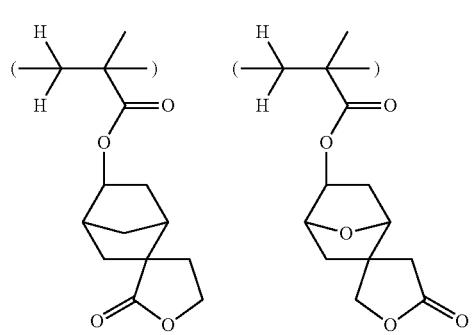
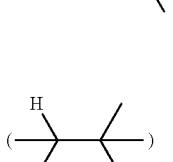
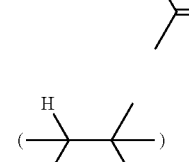
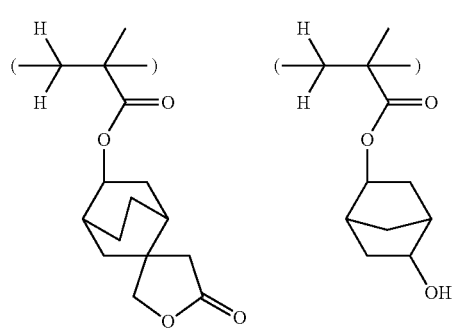
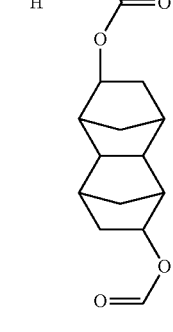
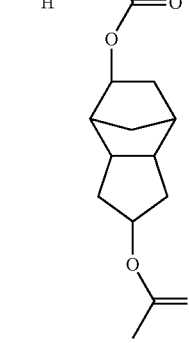

-continued
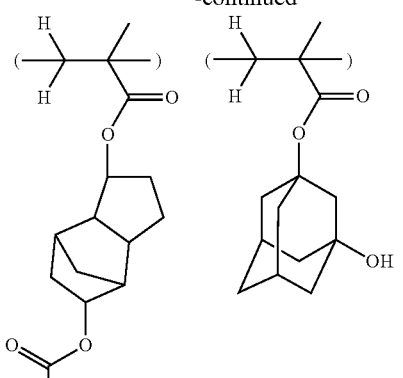
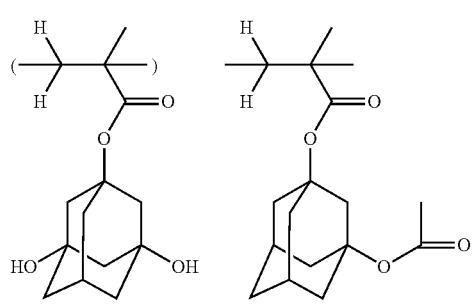
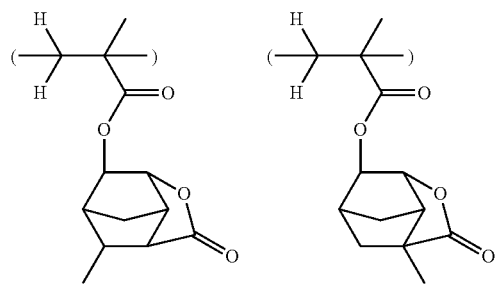
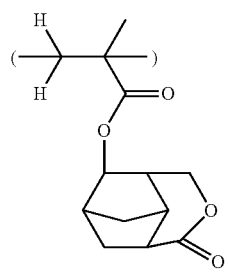
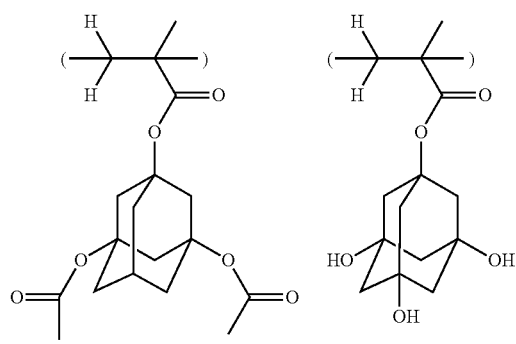
-continued
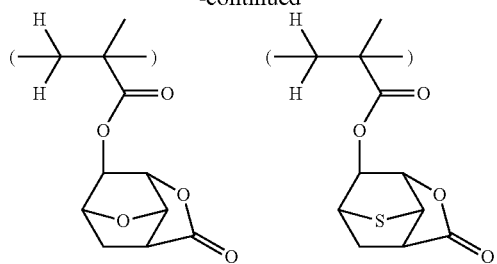
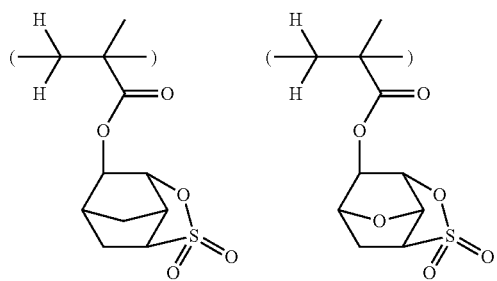
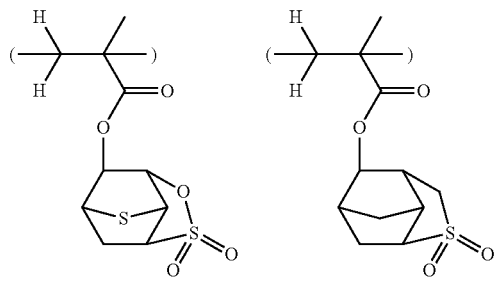
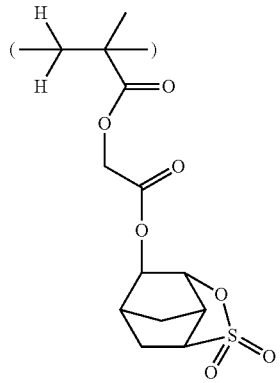
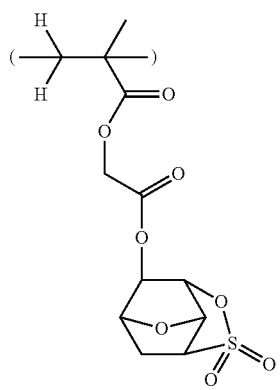

-continued
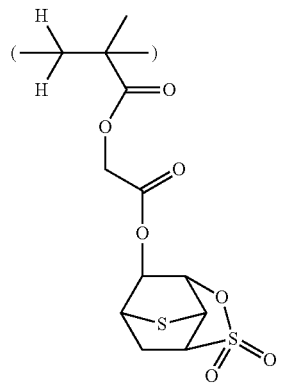
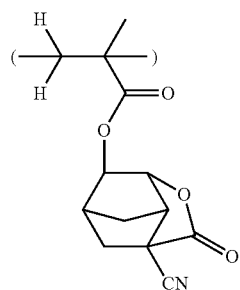
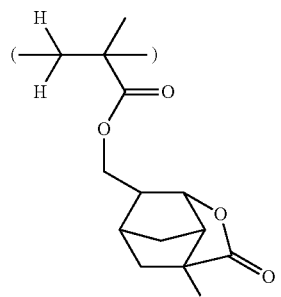
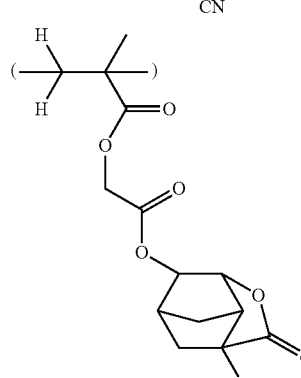
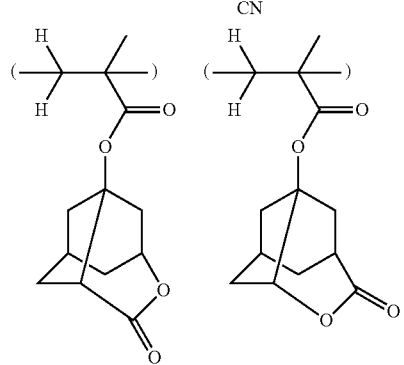
-continued
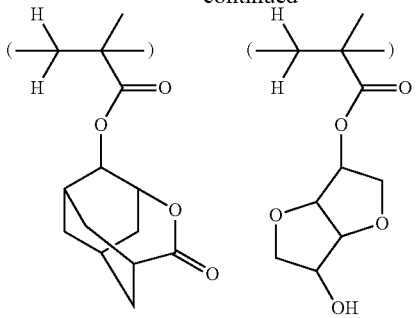
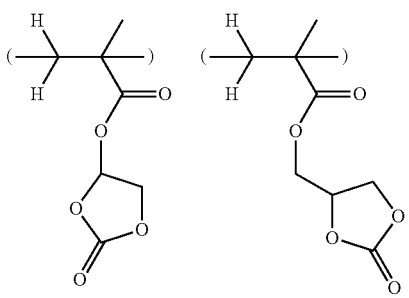
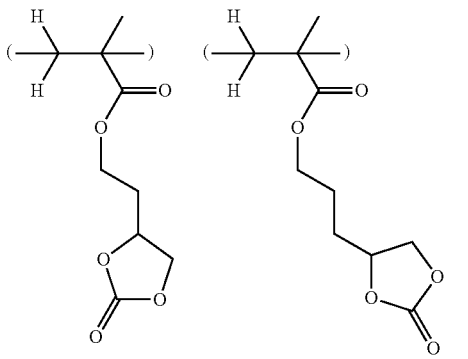
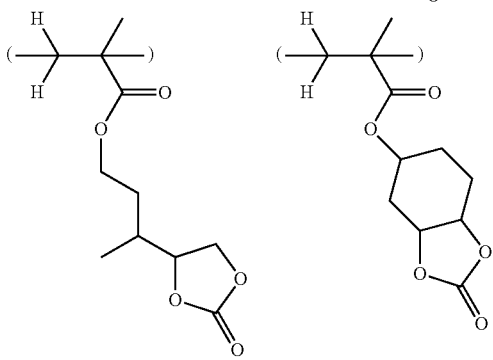
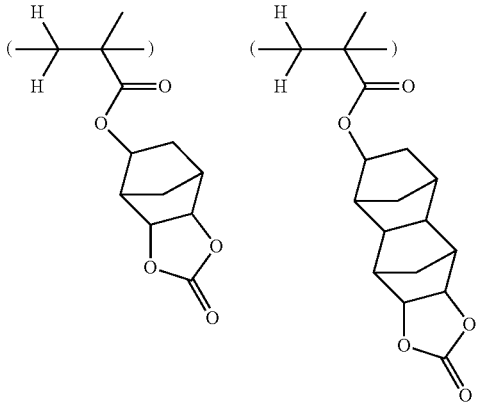

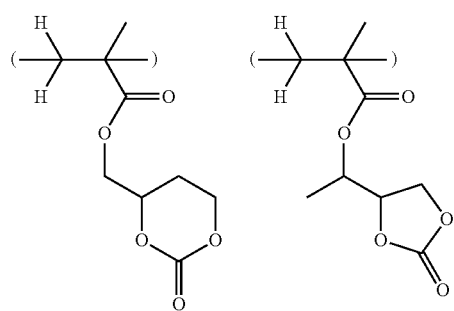
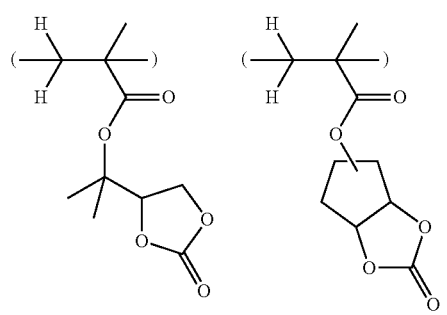
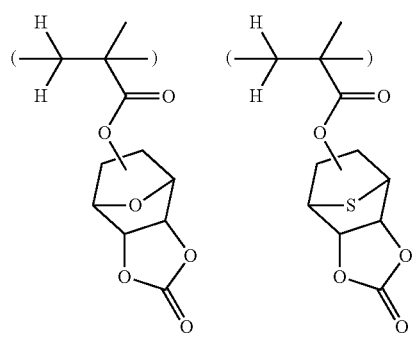
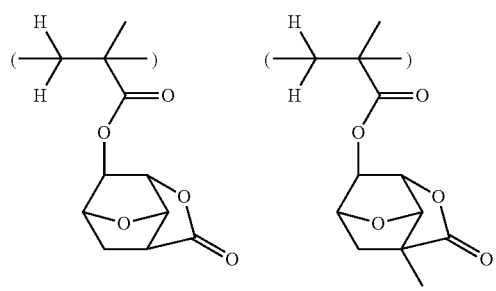
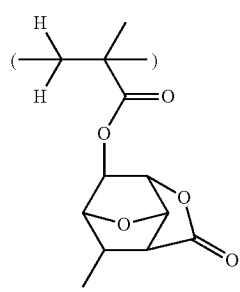
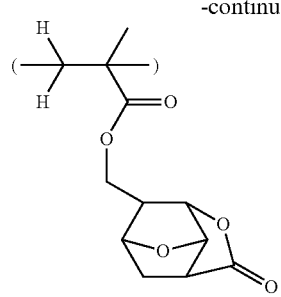
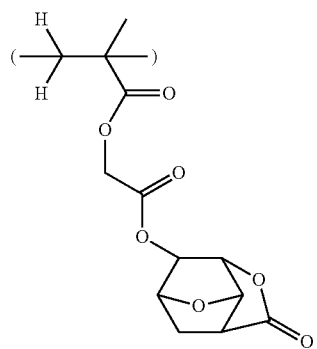
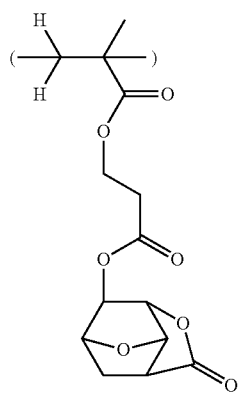
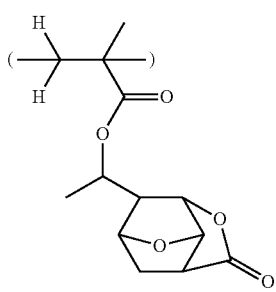
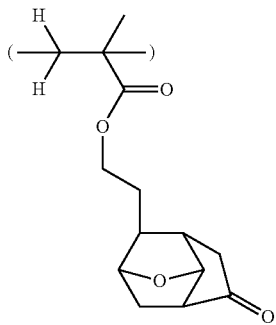

-continued
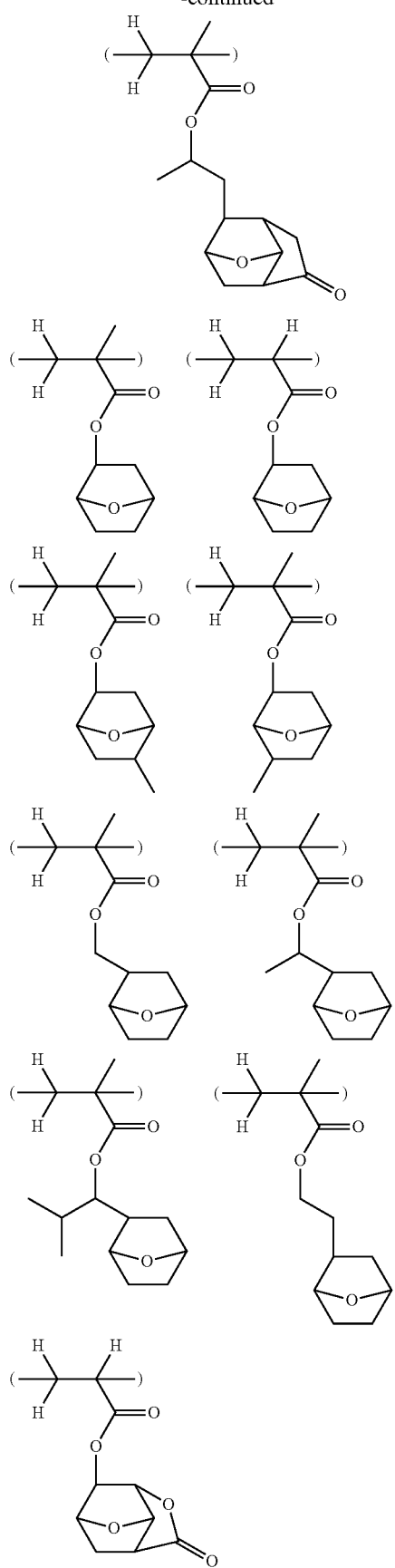
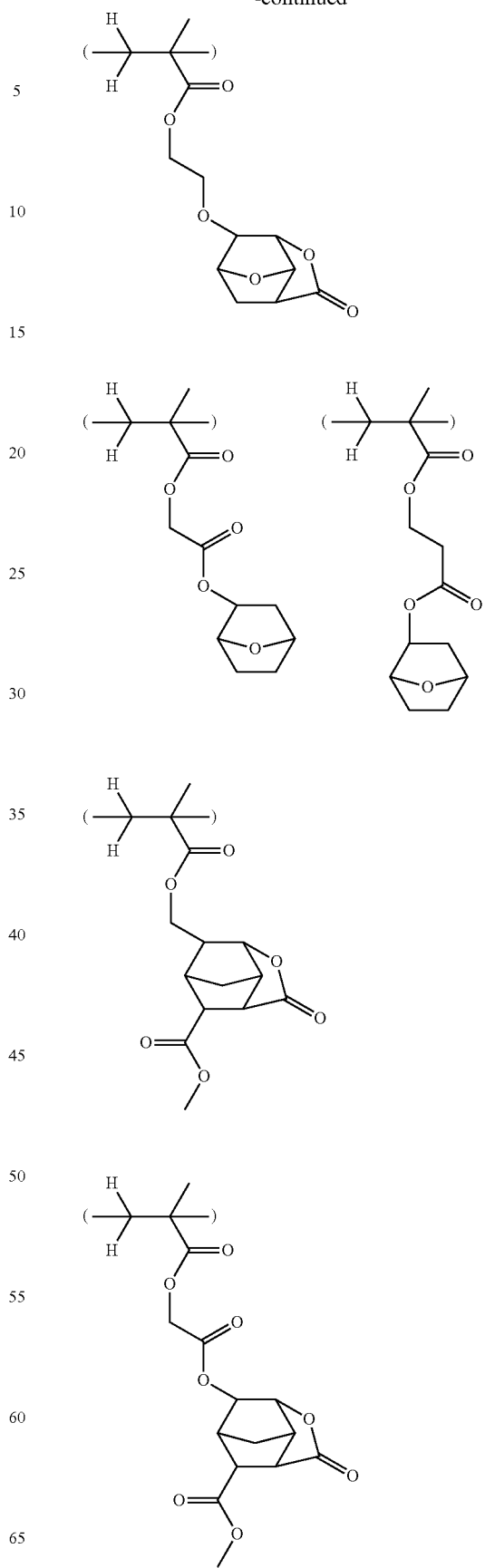

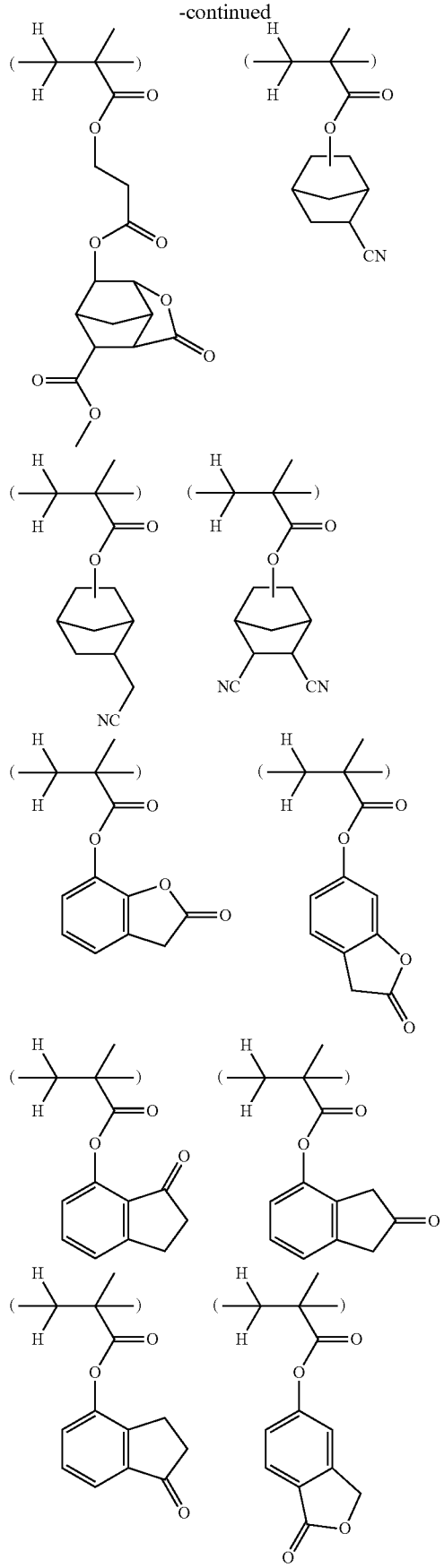
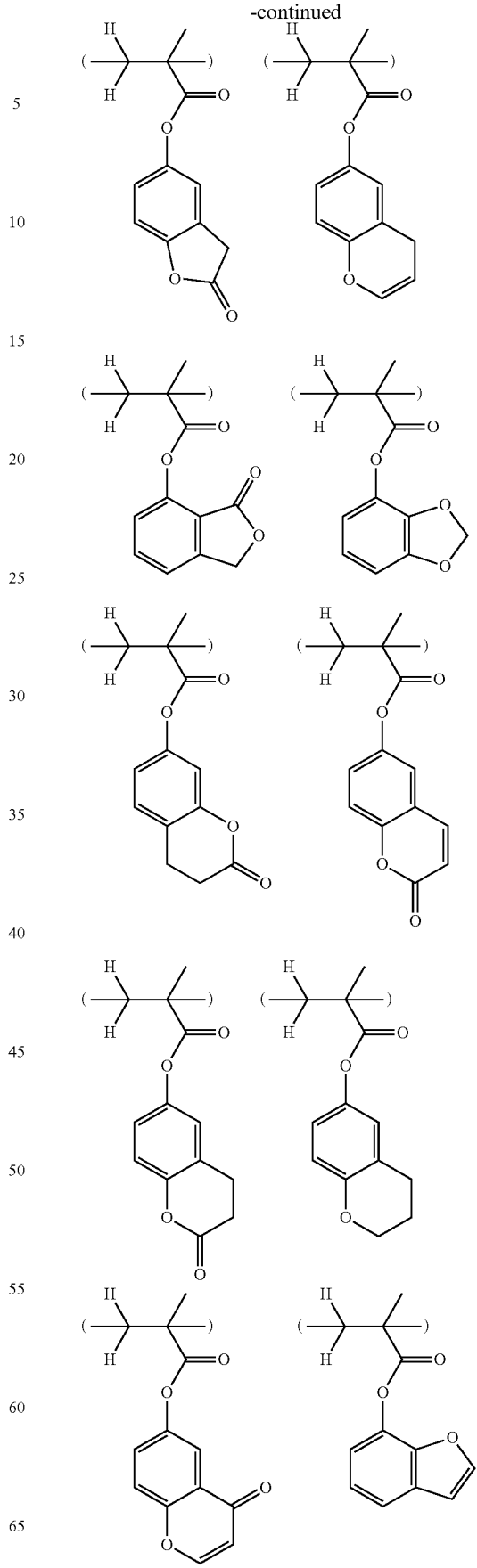

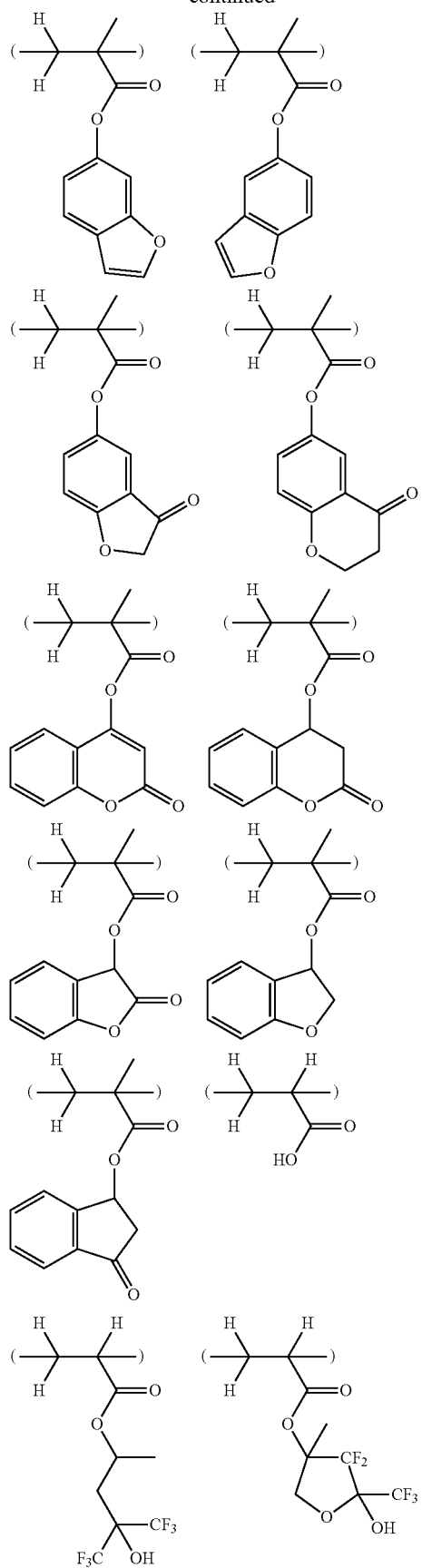
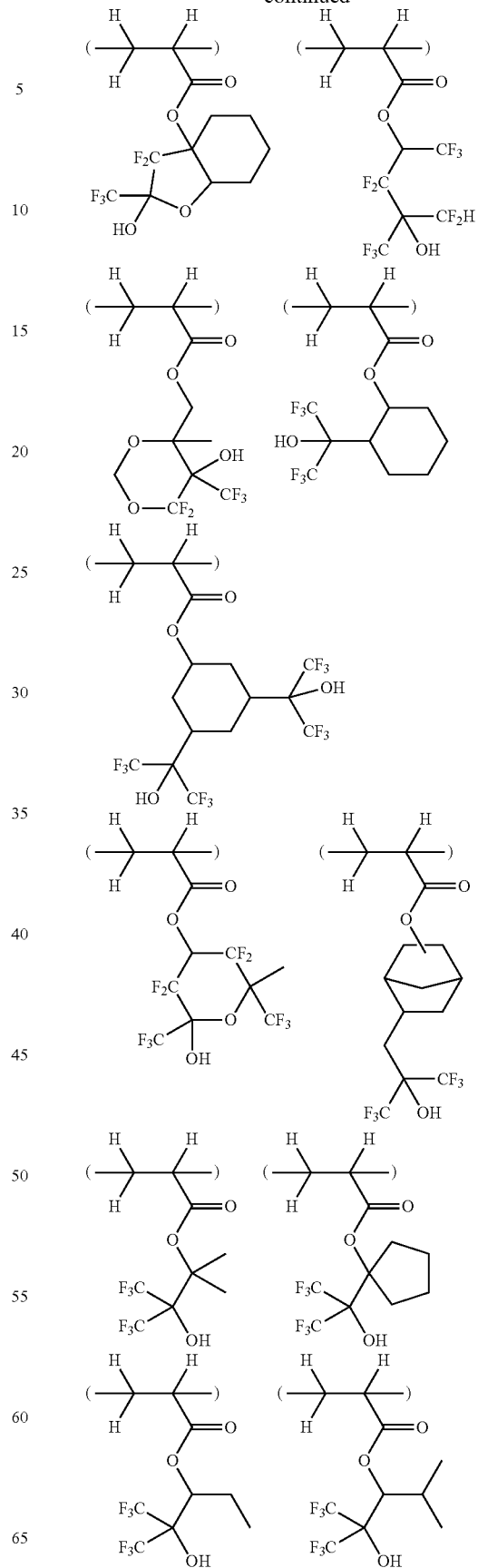

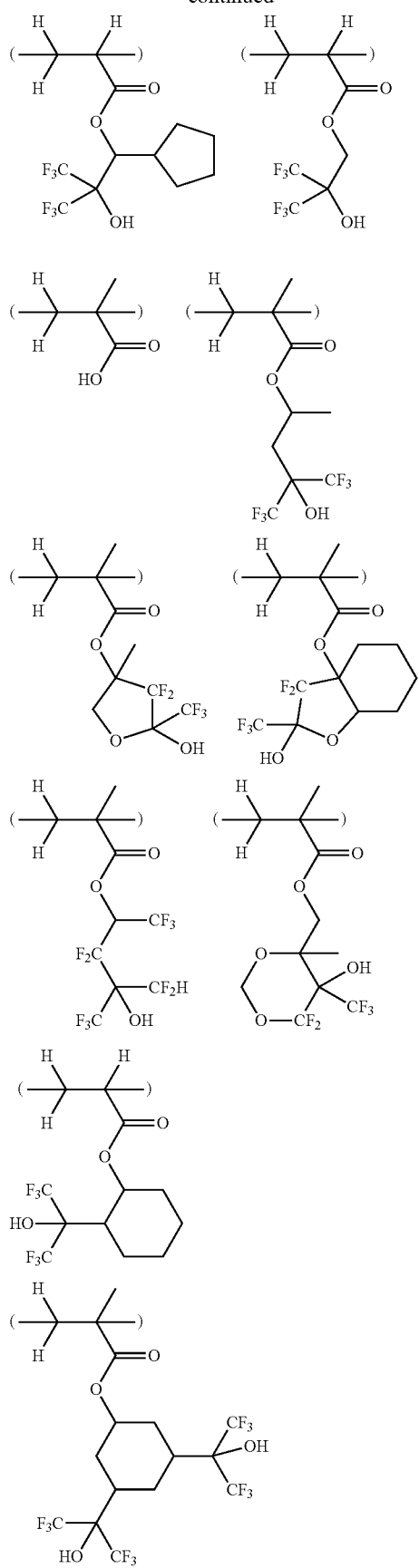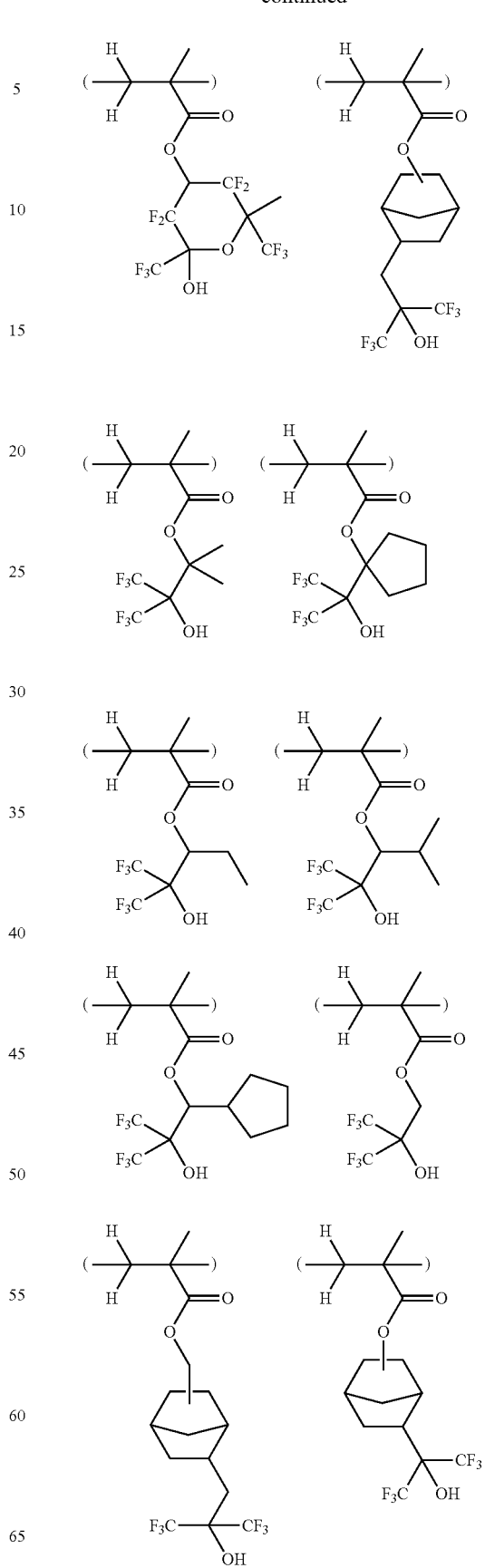

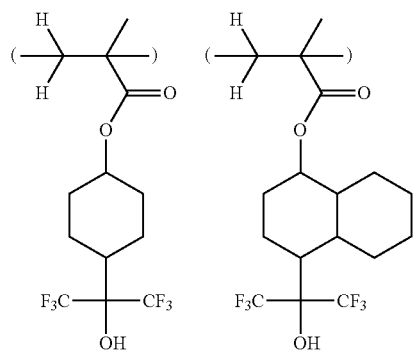
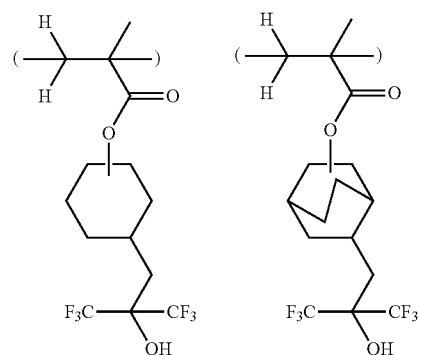
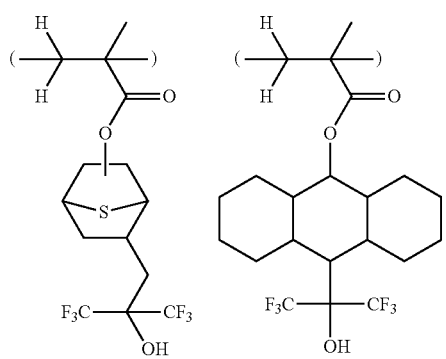
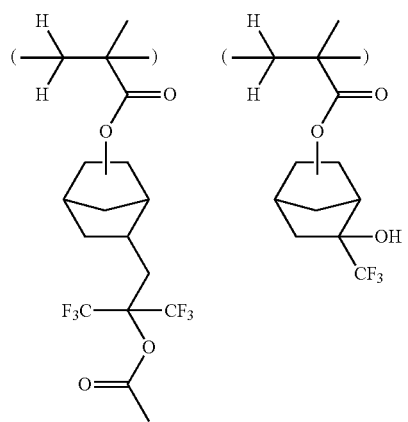
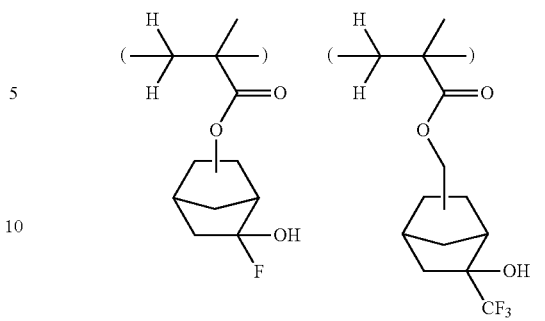
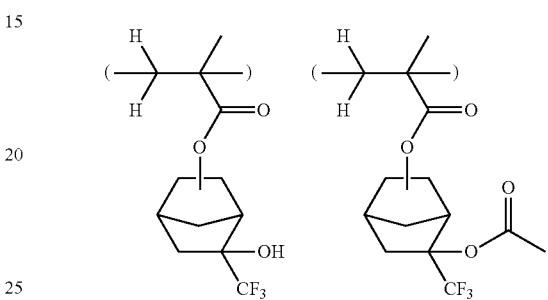
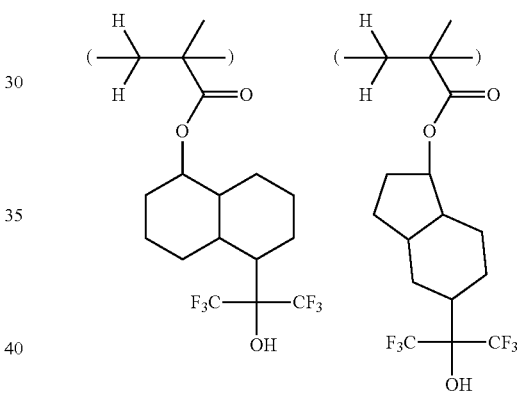
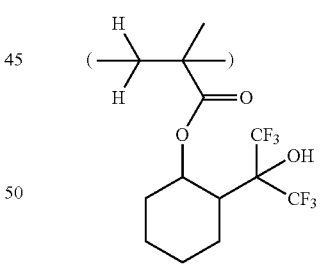
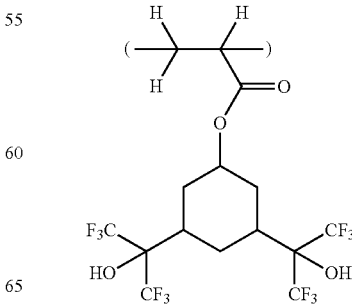

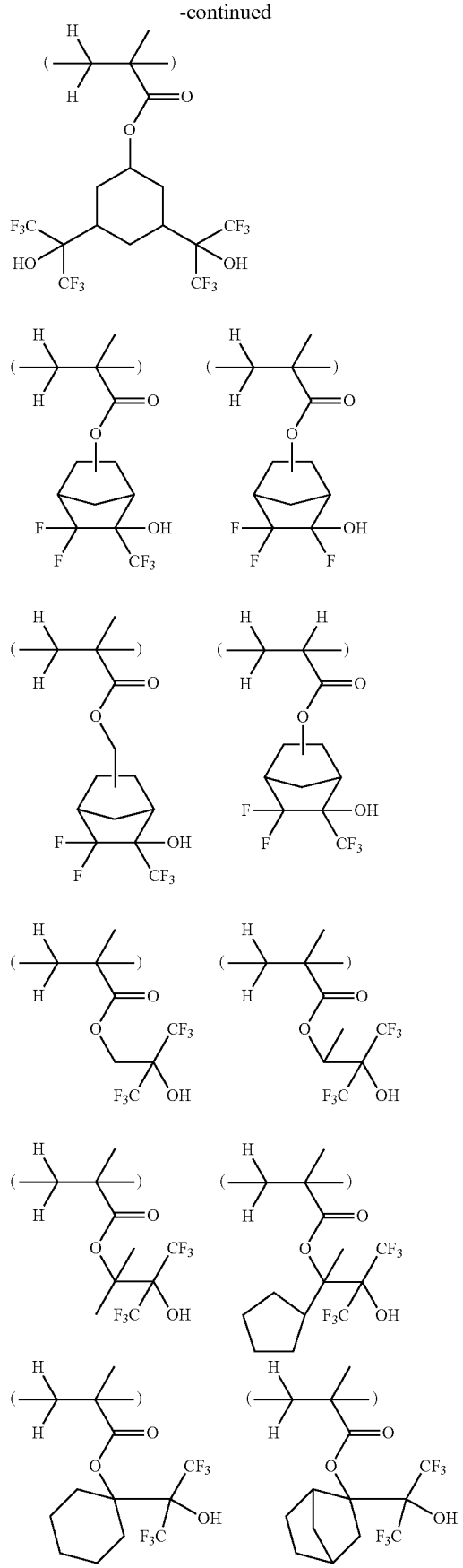
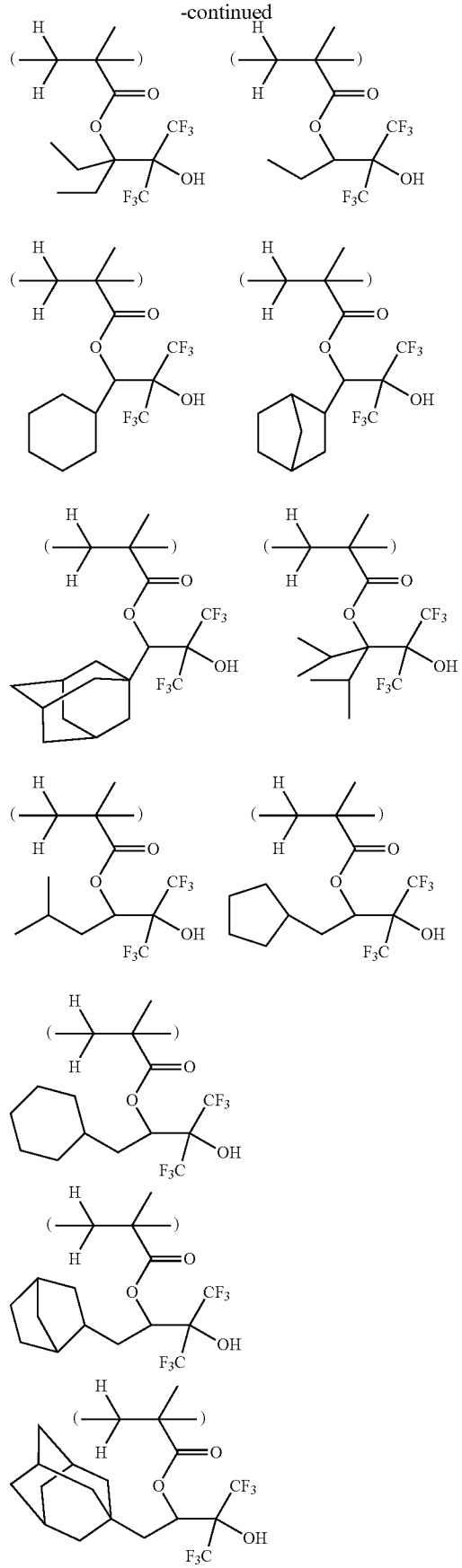

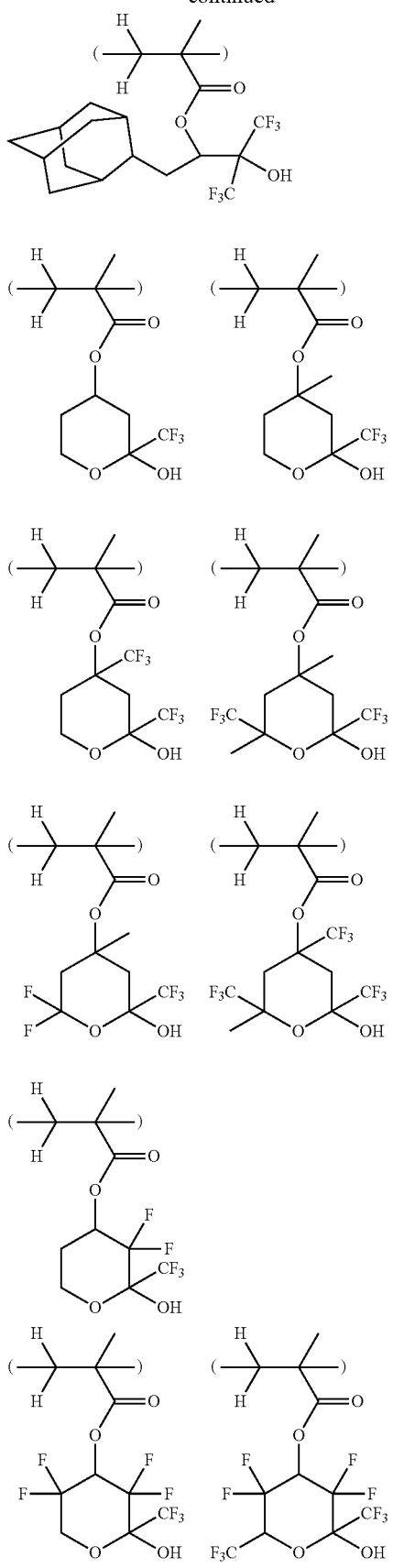
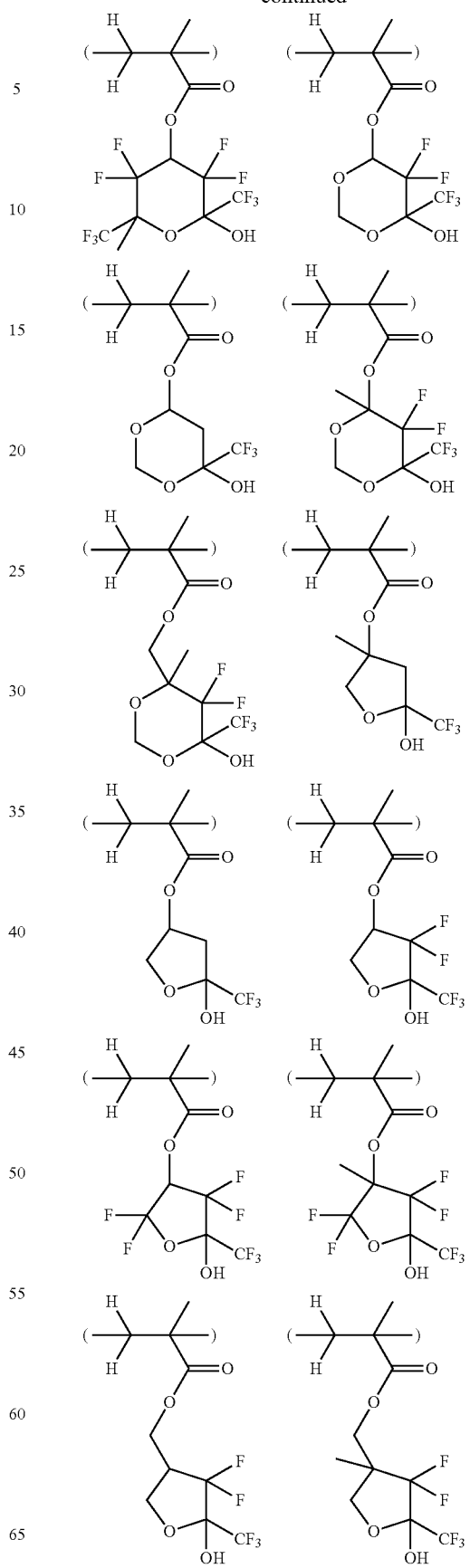

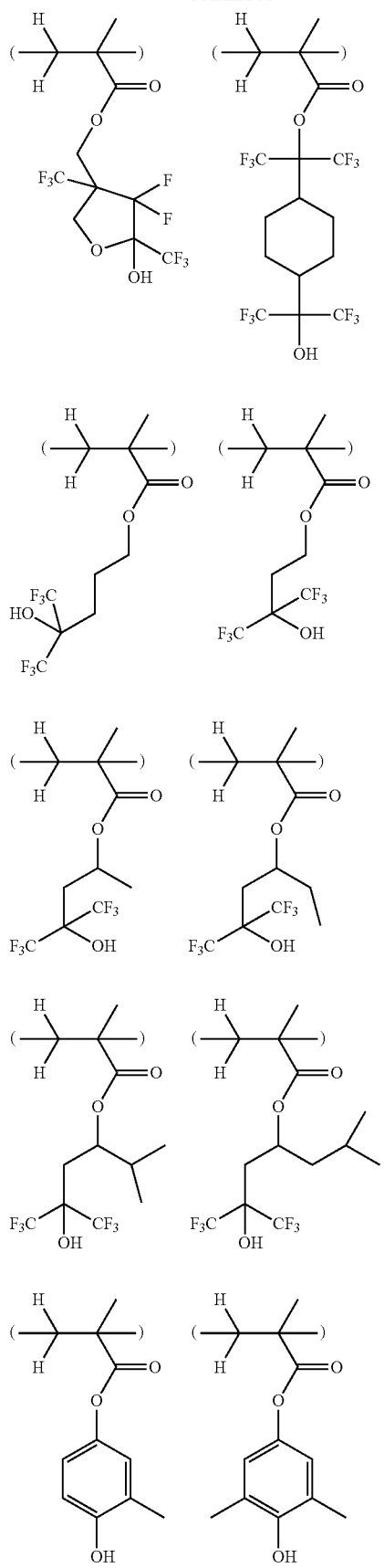
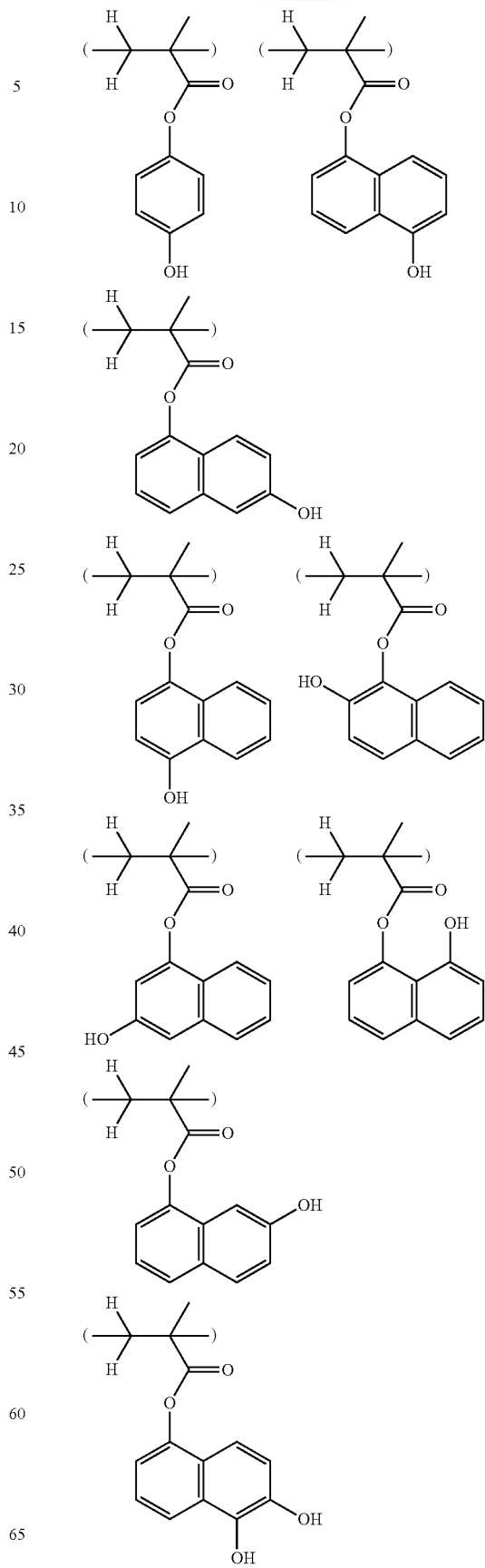

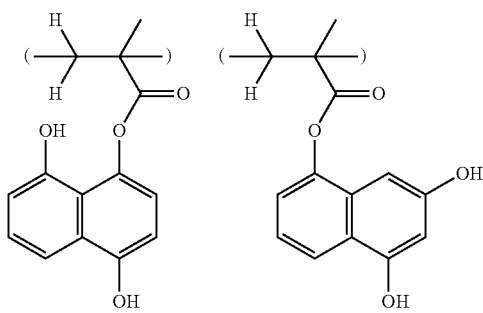
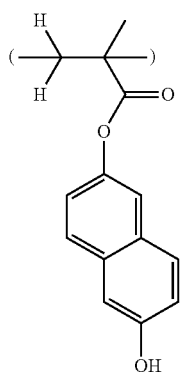
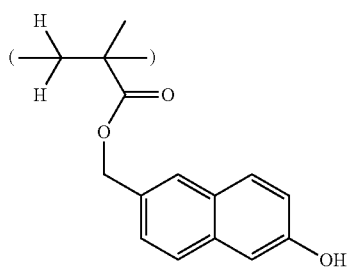
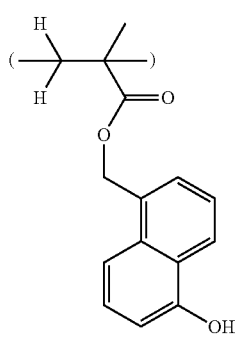
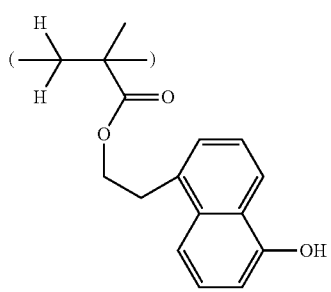
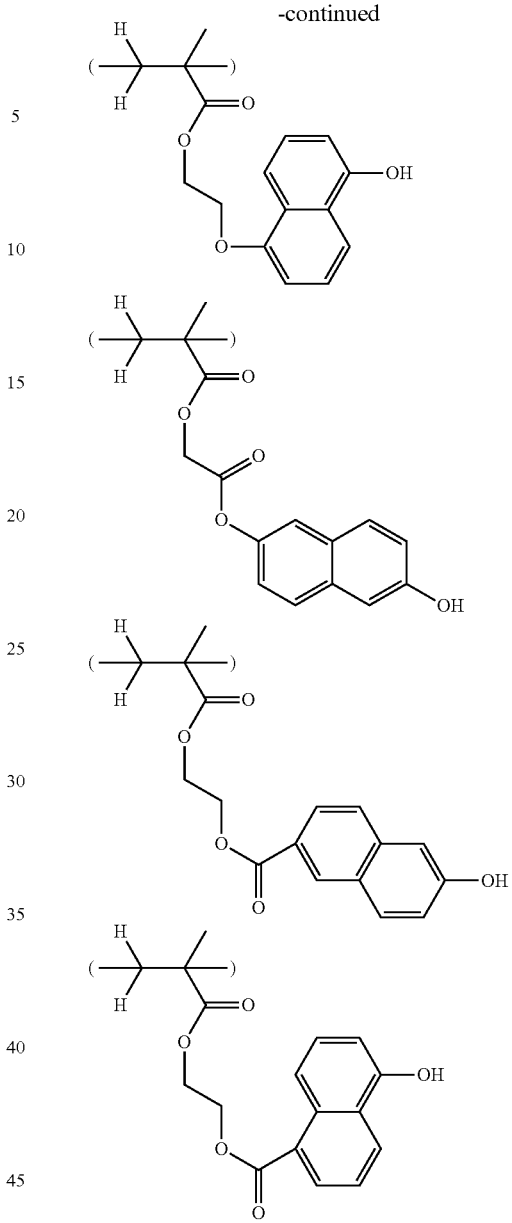

In the case that the repeating unit shown by the general formula (3) is used, especially the unit having a lactone ring as the polar group is used most preferably.

As having been mentioned already, the base resin used in the resist composition of the present invention is characterized by that the resin contains the repeating unit shown by the general formula (2) and the repeating unit shown by the general formula (3); however, other repeating unit may be copolymerized therewith further. For example, the base resin may contain repeating units obtained from monomers including substituted acrylate esters such as methyl methacrylate, methyl crotonate, dimethyl maleate, and dimethyl itaconate; unsaturated carboxylic acids such as maleic acid, fumaric acid, and itaconic acid; cyclic olefins such as norbornene, norbornene derivatives, and tetracyclo[$6.2.1.1^{3,6}.0^{2,7}$] dodecene derivatives; and an unsaturated acid anhydride such as itaconic anhydride. As to the hydrogenated ring opened metathesis polymer, those described in Japanese Patent Laid-Open Publication No. 2003-66612 may be used.

The weight-average molecular weight of the polymer compound used in the resist composition of the present invention is in the range of 1000 to 500000, or preferably in the range of 3000 to 100000. Outside this range, there may be risks that the etching resistance thereof deteriorates significantly, and that the dissolution rate difference between before and after exposure cannot be secured thereby deteriorating the resolution. As to the measurement method for molecular weight, a gel permeation chromatography (GPC) with the conversion to polystyrene may be mentioned.

To synthesize these polymer compounds, one method thereof involves thermal polymerization of one kind or several kinds of the monomer having an unsaturated bond in an organic solvent with the addition of a radical polymerization initiator, and thereby these polymer compounds may be obtained. Illustrative example of the organic solvent used during polymerization includes toluene, benzene, tetrahydrofuran, diethyl ether, and dioxane. Illustrative example of the polymerization initiator includes 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide, wherein polymerization may be conducted by heating preferably in the temperature range of 50 to 80° C. The reaction time thereof is in the range of 2 to 100 hours, or preferably in the range of 5 to 20 hours. The acid-labile group introduced into a monomer may be used as it is, or may be protected or partially protected after polymerization.

In the polymer compound of the component (B) used in the resist composition of the present invention, the preferable ratio of each repeating unit obtained from respective monomers may be made, for example, in the range (% by mol) as shown below, though not limited to this.

Thus, the polymer compound may contain:

(I) one kind, or two or more kinds, of the structural unit shown by the general formula (2) in the range of 1 to 50% by mol, preferably in the range of 5 to 40% by mol, or more preferably in the range of 10 to 30% by mol, (II) one kind, or two or more kinds, of the structural unit shown by the general formula (3) in the range of 50 to 99% by mol, preferably in the range of 60 to 95% by mol, or more preferably in the range of 70 to 90% by mol, and if necessary, (III) one kind, or two or more kinds, of the structural unit based on other monomer in the range of 0 to 80% by mol, preferably in the range of 0 to 70% by mol, or more preferably in the range of 0 to 50% by mol.

(C) Organic Solvent

As to the organic solvent of the component (C) used in the present invention, any organic solvent may be used provided that it can dissolve a polymer compound, a photo-sensitive acid generator, a quencher, other additives, and so forth. Illustrative example of the organic solvent like this includes: ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and a lactone such as γ-butyrolactone, while these may be used solely or as a mixture of two or more of them, though not limited to them.

Among these organic solvents, in the present invention, 1-ethoxy-2-propanol, propylene glycol monomethyl ether acetate, cyclohexanone, γ-butyrolactone, and a mixture of them are preferably used, because these are especially excellent in dissolution of an acid generator in the resist composition.

Use amount of the organic solvent is preferably in the range of 200 to 5000 parts by mass, especially in the range of 400 to 3000 parts by mass, relative to 100 parts by mass of the base resin.

(D) Basic Compound (Quencher)

In this specification, the basic compound means a compound which can suppress, upon diffusing in the resist film, the diffusion rates of the acid and the like that are generated from an acid generator. As to the quencher like this, preferably usable example thereof includes primary, secondary, and tertiary aliphatic amines, mixed amines, aromatic amines, heterocyclic amines, nitrogen-containing compounds having a carboxyl group, nitrogen-containing compounds having a sulfonyl group, nitrogen-containing compounds having a hydroxy group, nitrogen-containing compounds having a hydroxyphenyl group, alcoholic nitrogen-containing compounds, amides, imides, carbamates, and ammonium salts.

In this case, a compound having a high nucleophilicity and a compound having excessively strong basicity are not suitable because these can react with the cationic part of the sulfonium salt of the present invention. Preferable compounds are primary or secondary amines protected by tBOC (tert-butoxycarbonyl). These protected amines may be referred to such as, for example, Japanese Patent Laid-Open Publication No. 2007-298569 and No. 2010-20204. In addition, anilines such as, for example, aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine are weakly basic so that they are preferable in a combination with the sulfonium salt of the present invention.

Meanwhile, these basic compounds (quenchers) may be used solely or as a combination of two or more of them, wherein the blending amount thereof is preferably in the range of 0.001 to 12 parts, especially in the range of 0.01 to 8 parts, relative to 100 parts of the base resin. By blending the quencher, not only the resist sensitivity can be easily controlled, but also diffusion rate of the acid in the resist film can be suppressed, thereby enhancing the resolution power, suppressing the sensitivity change after the photo-exposure, and lowering the dependency on the substrate and the environment, so that the exposure margin, the pattern profile, and so forth can be improved. In addition, the substrate adhesion can be improved by adding these quenchers.

(E) Surfactant not Soluble or Poorly Soluble in Water while Soluble in an Alkaline Developing Solution, and/or Surfactant not Soluble or Poorly Soluble in Water and an Alkaline Developing Solution (Hydrophobic Resin)

Into the resist composition of the present invention, a surfactant component (E) may be added; and the reference thereof may be made to (S) defined components described in Japanese Patent Laid-Open Publication No. 2010-215608 and No. 2011-16746.

As to the surfactant not soluble or poorly soluble in water and an alkaline developing solution, among the surfactants described in the foregoing patent documents, FC-4430, Surfion S-381, Surfynol E1004, KH-20, KH-30, and an oxetane ring-opened polymer shown by the following structural formula (surf-1) are preferable. These may be used solely or as a combination of two or more of them.

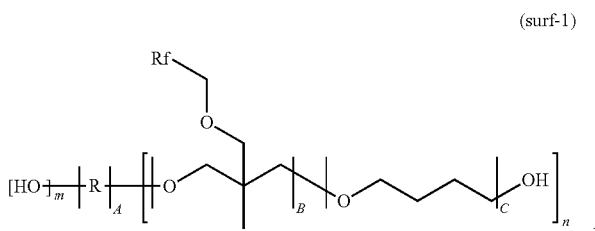

(surf-1)

Here, regardless of the previous descriptions, R, Rf, A, B, C, m, and n are applied only to the above formula (surf-1). R represents 2- to 4-valent aliphatic groups having 2 to 5 carbon atoms; and specifically ethylene, 1,4-butylene, 1,2-propylene, 2,2-dimethyl-1,3-propylene, and 1,5-pentylene may be mentioned as the divalent group, and the following groups as the 3- or 4-valent group,

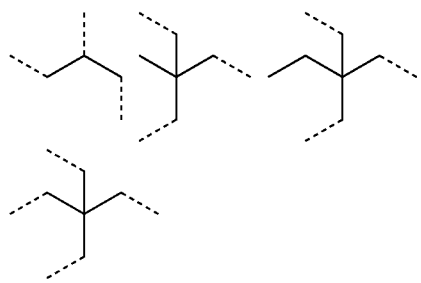

wherein the dotted lines show bonding arms; and these groups are respective partial structures derived from glycerol, trimethylolethane, trimethylolpropane, and pentaerythritol.

Among them, 1,4-butylene or 2,2-dimethyl-1,3-propylene is preferably used. Rf represents a trifluoromethyl group or a pentafluoroethyl group, while a trifluoromethyl group is preferable; m represents an integer of 0 to 3; n represents an integer of 1 to 4; and the sum of n and m, showing the valency of R, is an integer of 2 to 4. A represents 1, B represents an integer of 2 to 25, and C represents an integer of 0 to 10, wherein B is preferably an integer of 4 to 20, and C is preferably 0 or 1. Each composition unit of the foregoing structure does not specify the sequence, and thus, may be bonded as a block or randomly. Production of the surfactant with the type of a partially fluorinated oxetane ring-opened polymer is described in detail in the U.S. Pat. No. 5,650,483 and so forth.

In the case when a resist protective coat is not used in an ArF immersion exposure, the surfactant not soluble or poorly soluble in water while soluble in an alkaline developing solution orientates on the resist surface after spin coating thereby having functions to reduce penetration of water and leaching, and thereby suppressing elution of a water-soluble component from the resist film, and therefore, decreasing the damage to an exposure apparatus; and thus, this is useful. Furthermore, this becomes soluble during the alkaline development after post baking so that this does not readily change to foreign matters to cause defects; and thus, this is useful. This surfactant has properties not soluble or poorly soluble in water while soluble in an alkaline development solution, and is also called as a hydrophobic resin, wherein a surfactant especially having a high water-repellent property thereby enhancing a water-sliding property is preferable. The polymer type surfactant like this may be shown as follows.

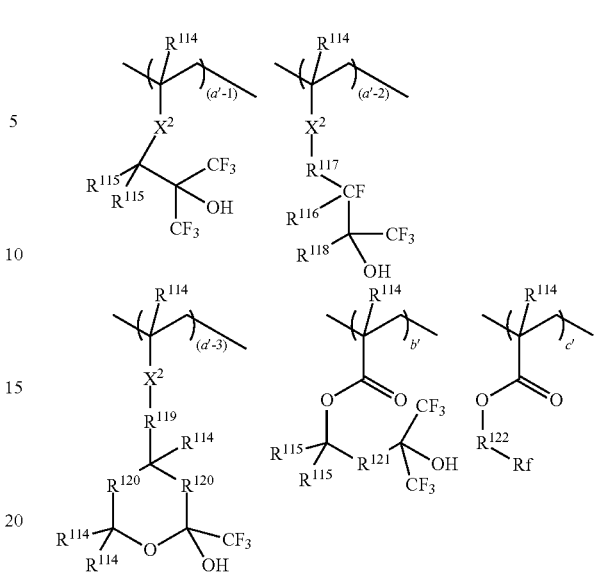

wherein each of $R^{114}$ may be the same or different, representing a hydrogen atom, a fluorine atom, a methyl group, or a trifluoromethyl group. Each of $R^{115}$ may be the same an different, representing a hydrogen atom, or a linear, branched, or cyclic alkyl group or a fluorinated alkyl group having 1 to 20 carbon atoms, wherein each of $R^{115}$ in the same monomer may be bonded to form a ring together with the carbon atom to which these are bonded, and in this case, representing a linear, branched, or cyclic alkylene group or fluorinate alkylene group having 2 to 20 carbon atoms as a total. $R^{116}$ represents a fluorine atom or a hydrogen atom, or may be bonded with $R^{117}$ to form a non-aromatic ring having, as total, 3 to 10 carbon atoms together with the carbon atom to which these groups are bonded. $R^{117}$ represents a linear, branched, or cyclic alkylene group having 1 to 6 carbon atoms, wherein one or more hydrogen atoms thereof may be optionally substituted by a fluorine atom. $R^{118}$ represents a linear or branched alkyl group having 1 to 10 carbon atoms, wherein one or more hydrogen atoms thereof are substituted by a fluorine atom; and $R^{117}$ and $R^{118}$ may be bonded to form a non-aromatic ring together with the carbon atoms to which these groups are bonded, and in this case, representing a trivalent organic group having 2 to 12 carbon atoms as total of $R^{117}$, $R^{118}$, and the carbon atoms to which these groups are bonded. $R^{119}$ represents a single bond, or an alkylene group having 1 to 4 carbon atoms; and $R^{120}$ may be the same or different, representing a single bond, —O—, or —$CR^{114}R^{114}$—. $R^{121}$ represents a linear or branched alkylene group having 1 to 4 carbon atoms, which may optionally be bonded with $R^{115}$ in the same monomer to form a non-aromatic ring having 3 to 6 carbon atoms together with the carbon atom to which these groups are bonded. $R^{122}$ represents a 1,2-ethylene group, a 1,3-propylene group, or a 1,4-butylene group; and Rf represents a linear perfluoroalkyl group having 3 to 6 carbon atoms, or a 3H-perfluoropropyl group, a 4H-perfluorobutyl group, a 5H-perfluoropentyl group, or a 6H-perfluorohexyl group. $X^2$ may be the same or different, representing —C(=O)—O—, —O—, or —C(=O)—$R^{123}$—C(=O)—O—; and $R^{123}$ represents a linear, branched, or cyclic alkylene group having 1 to 10 carbon atoms. Furthermore, $0 \leq (a'-1) < 1$, $0 \leq (a'-2) < 1$, $0 \leq (a'-3) < 1$, $0 < (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

The above-mentioned units will be shown more specifically.
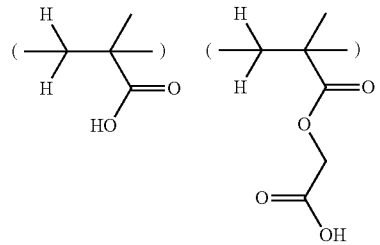
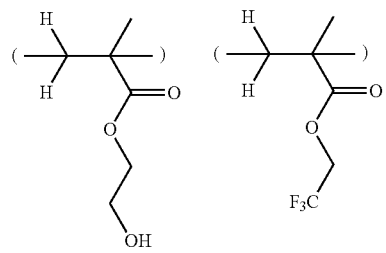
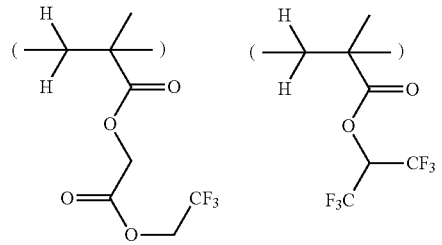
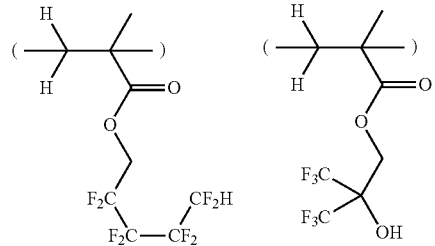
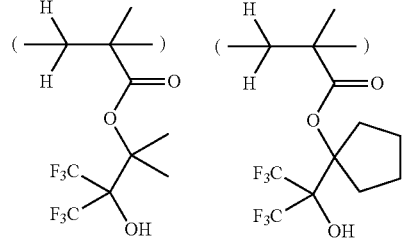
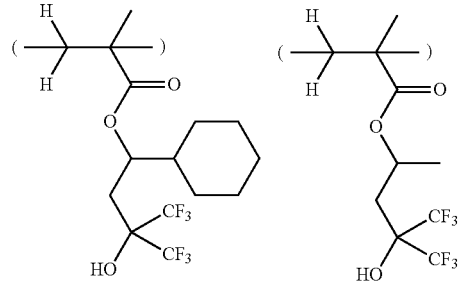
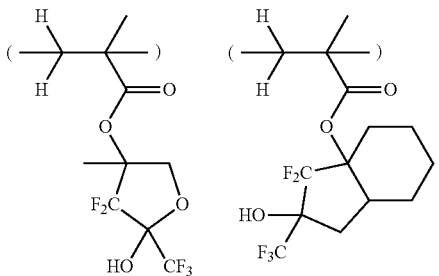
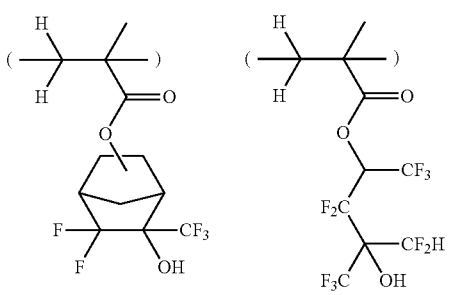
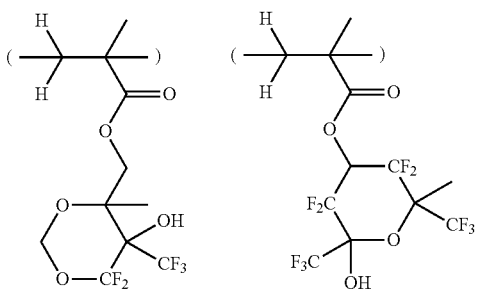
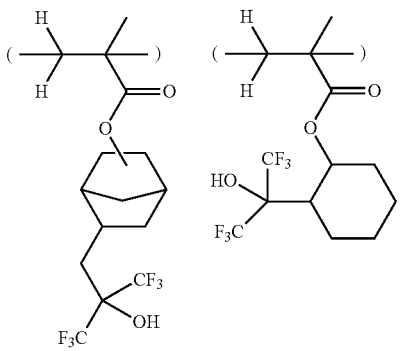
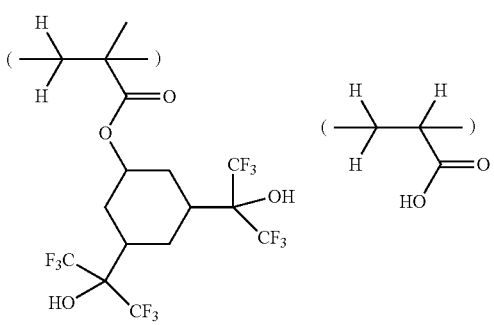

-continued

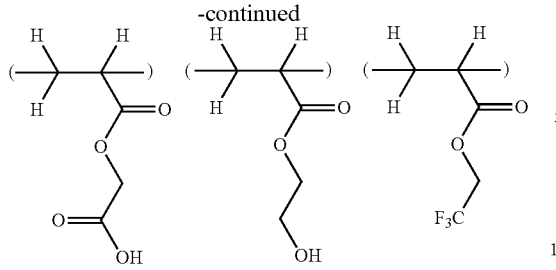
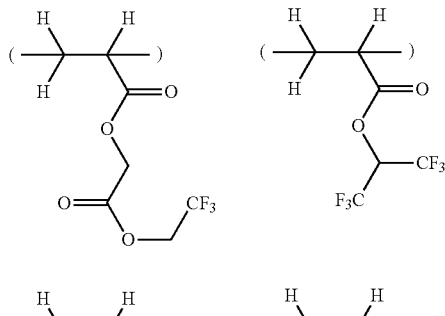
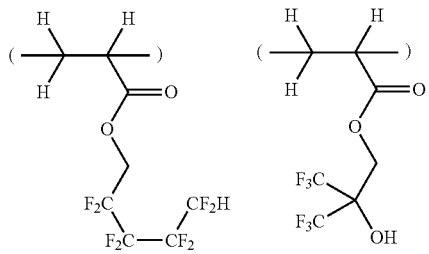
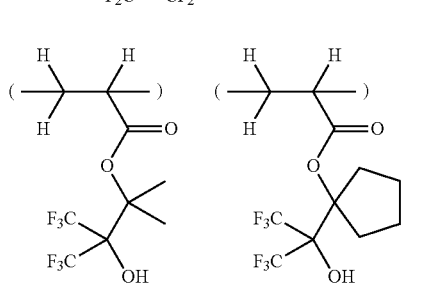
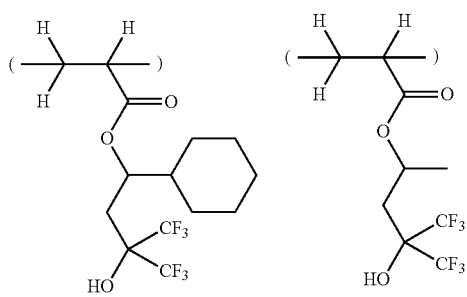
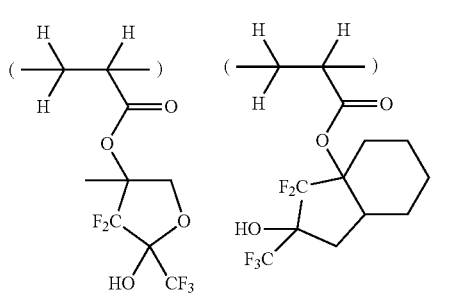

-continued

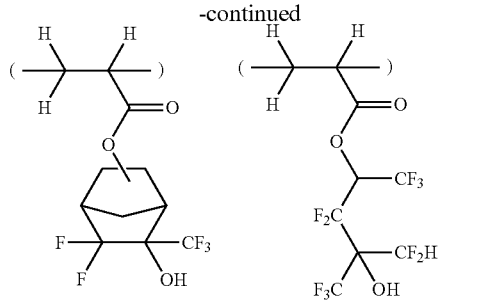
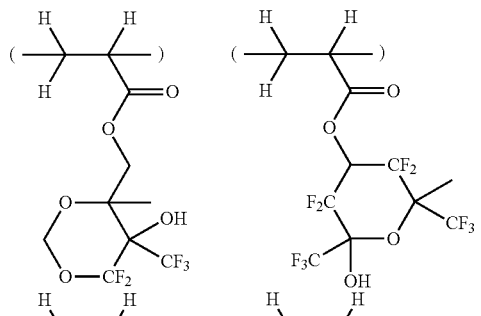
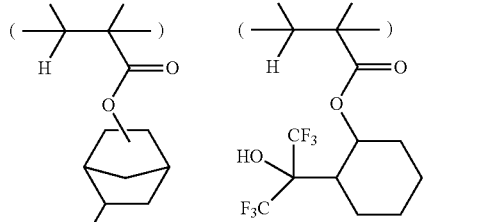
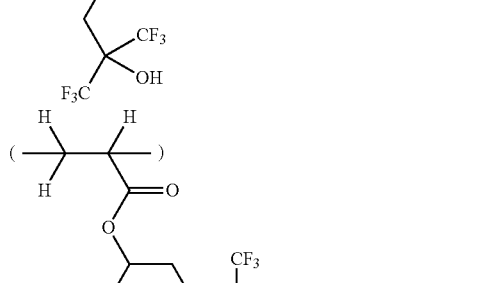
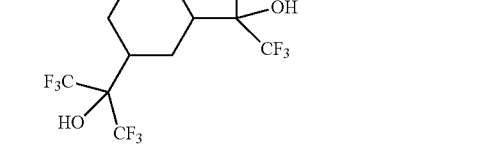

These surfactants not soluble or poorly soluble in water while soluble in an alkaline developing solution may also be referred to Japanese Patent Laid-Open Publication No. 2008-122932, No. 2010-134012, No. 2010-107695, No. 2009-276363, No. 2009-192784, No. 2009-191151, No. 2009-98638, No. 2010-250105, and No. 2011-42789.

The weight-average molecular weight of the above-mentioned polymer-type surfactant is preferably in the range of 1000 to 50000, or more preferably in the range of 2000 to 20000. Outside this range, surface modification effect may sometimes not be sufficient, and development defect may sometimes occur. Meanwhile, the weight-average molecular weight is shown by the polystyrene-converted value obtained by a gel permeation chromatography (GPC). The adding amount thereof is in the range of 0.001 to 20 parts by mass, or preferably in the range of 0.01 to 10 parts by mass, relative to 100 parts by mass of the base resin of the resist composition.

These are described more specifically in Japanese Patent Laid-Open Publication No. 2010-215608.

(F) Photo-Sensitive Acid Generator Other than the Sulfonium Salt (Photo-Sensitive Acid Generator) Shown by the General Formula (1a) or (1b)

In the case that the photo-sensitive acid generator (F) is added, any compound may be used provided that it generates an acid by high energy beams such as a UV beam, a far ultra-violet beam, an electron beam, EUV, a X-ray, an excimer laser beam, a γ beam, and synchrotron radiation beam. Preferable example of the photo-sensitive acid generator includes a sulfonium salt, an iodonium salt, sulfonyl diazomethane, N-sulfonyloxy dicarboxydiimide, an O-arylsulfonyl oxime, and an O-alkylsulfonyl oxime. These may be used solely or as a mixture of two or more of them.

The afore-mentioned sulfonium salts are salts of a sulfonium cation with a sulfonate, a bis(substituted alkylsulfonyl) imide, or a tris(substituted alkylsulfonyl)methide; and as to the sulfonium cation, the following general formula (5) may be shown,

wherein each of $R^{33}$, $R^{44}$, and $R^{55}$ independently represents a linear, branched, or cyclic alkyl group, alkenyl group, or oxoalkyl group having 1 to 10 carbon atoms which may be substituted or unsubstituted, or an aryl group, an aralkyl group, or an aryloxoalkyl group having 6 to 18 carbon atoms which may be substituted or unsubstituted. Any two of $R^{33}$, $R^{44}$, and $R^{55}$ may be bonded with each other to form a ring together with the sulfur atom in the formula.

Specific example of the afore-mentioned alkyl group includes a methyl group, an ethyl group, a n-propyl group, an isopropyl group, a n-butyl group, a tert-butyl group, a cyclopropyl group, a cyclopentyl group, a cyclohexyl group, a cyclopropylmethyl group, a 4-methylcyclohexyl group, a cyclohexylmethyl group, a norbornyl group, and an adamantyl group. Specific example of the afore-mentioned oxoalkyl group includes a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, and a 2-(4-methylcyclohexyl)-2-oxoethyl group. Specific example of the afore-mentioned alkenyl group includes a vinyl group, an allyl group, a propenyl group, a butenyl group, a hexenyl group, and a cyclohexenyl group. Specific example of the afore-mentioned aryl group includes a phenyl group, a naphthyl group, a thienyl group, a hydroxyphenyl group such as a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; and dialkoxynaphthyl groups such as a dimethoxynaphthyl group and a diethoxynaphthyl group. Specific example of the afore-mentioned aralkyl group includes a benzyl group, a 1-phenylethyl group, and a 2-phenylethyl group. Specific example of the afore-mentioned aryloxoalkyl group includes 2-aryl-2-oxoethyl groups such as a 2-phenyl-2-oxoethyl group, a 2-(1-naphthyl)-2-oxoethyl group, and a 2-(2-naphthyl)-2-oxoethyl group. In addition, a part of the hydrogen atoms in these groups may be substituted by a fluorine atom or a hydroxy group. Any two of $R^{33}$, $R^{44}$, and $R^{55}$ may be bonded with each other to form a ring together with the sulfur atom in the formula; and in this case, the groups shown by the following formulae and the like may be mentioned.

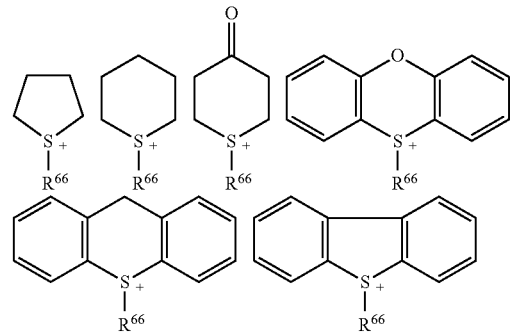

wherein $R^{66}$ represents the same groups as those mentioned in $R^{33}$, $R^{44}$, and $R^{55}$ as the examples.

As to the anion species of the afore-mentioned sulfonium salts, illustrative example of the sulfonate includes trifluoromethane sulfonate, pentafluoroethane sulfonate, heptafluoropropane sulfonate, nonafluorobutane sulfonate, tridecafluorohexane sulfonate, 2,2,2-trifluoroethane sulfonate, pentafluorobenzene sulfonate, 1,1-difluoro-2-naphthylethane sulfonate, 1,1,2,2-tetrafluoro-2-(norbornane-2-yl) ethane sulfonate, 1,1,2,2-tetrafluoro-2-(tetracyclo[6.2.1.1$^{3,6}$. 0$^{2,7}$]dodeca-3-ene-8-yl)ethane sulfonate, 2-benzoyloxy-1,1, 3,3,3-pentafluoropropane sulfonate, 1,1-difluoro-2-tosyloxyethane sulfonate, adamantanemethoxycarbonyl difluoromethane sulfonate, 1-(3-hydroxymethyladamantane) methoxycarbonyl difluoromethane sulfonate, methoxycarbonyl difluoromethane sulfonate, 1-(hexahydro-2-oxo-3,5-methano-2H-cyclopental[b]furan-6-yloxycarbonyl)difluoromethane sulfonate, and 4-oxo-1-adamantyloxycarbonyl difluoromethane sulfonate; illustrative example of the bis(substituted alkylsulfonyl)imide includes bis(trifluoromethylsulfonyl)imide, bis(pentafluoroethylsulfonyl) imide, bis(heptafluoropropylsulfonyl)imide, and perfluoro(1, 3-propylenebissulfonyl)imide; illustrative example of the tris (substituted alkylsulfonyl)methide includes tris (trifluoromethylsulfonyl)methide; and sulfonium salts in a combination of them with the before-mentioned cationic species may be mentioned.

As to the afore-mentioned iodonium salts, a N-sulfonyloxydicarboxylmide-type photo-sensitive acid generator, and a photo-sensitive acid generator with the type of an O-arylsulfonyl oxime compound or an O-alkylsulfonyl oxime compound (oxime sulfonate), those compounds described in Japanese Patent Laid-Open Publication No. 2009-269953 may be mentioned.

Illustrative example of the especially preferably used other acid generator includes triphenylsulfonium nonafluorobutane sulfonate, triphenylsulfonium bis(trifluoromethylsulfonyl) imide, triphenylsulfonium perfluoro(1,3-propylenebissulfonyl)imide, triphenylsulfonium tris(trifluoromethanesulfonyl) methide, N-nonafluorobutanesulfonyloxy-1,8-naphthalenedicarboxy imide, 2-(2,2,3,3,4,4-hexafluoro-1-(nonafluorobutylsulfonyloxyimino)butyl)fluorene, and 2-(2, 2,3,3,4,4,5,5-octafluoro-1-(nonafluorobutylsulfonyloxyimino)pentyl)fluorene.

As to the preferable structure of the photo-sensitive acid generator, compounds shown by the following general formula (P1) may be mentioned,

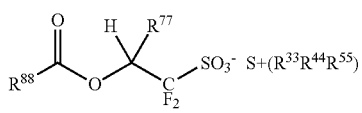

(P1)

wherein $R^{77}$ represents a hydrogen atom or a trifluoromethyl group. $R^{88}$ represents an alkyl group, an alkenyl group, or an aralkyl group having 1 to 30 carbon atoms which may optionally contain a heteroatom. $R^{33}$, $R^{44}$, and $R^{55}$ represent the same meanings as before.

In the formula (P1), $R^{77}$ represents a hydrogen atom or a trifluoromethyl group. $R^{33}$, $R^{44}$, and $R^{55}$ represent the same meanings as before. $R^{88}$ represents an alkyl group, an alkenyl group, or an aralkyl group having 1 to 30 carbon atoms which may optionally contain a heteroatom. As to the heteroatom contained in $R^{88}$, an oxygen atom, a nitrogen atom, a sulfur atom, and a halogen atom are preferable, while an oxygen atom is more preferable. As to the alkyl group, the alkenyl group, or the aralkyl group having 1 to 30 carbon atoms in $R^{88}$, any of linear, branched, and cyclic groups may be allowed; however the groups having 6 to 30 carbon atoms are more preferable in order to obtain a high resolution in fine patterning process. In the case of using an aryl group as $R^{88}$, a side wall of the formed resist pattern may be sometimes poor in its smoothness, so that this is not preferable. Specific example of $R^{88}$ includes a methyl group, an ethyl group, a propyl group, an isopropyl group, a butyl group, an isobutyl group, a sec-butyl group, a tert-butyl group, a pentyl group, a neopentyl group, a cyclopentyl group, a hexyl group, a cyclohexyl group, a 3-cyclohexenyl group, a heptyl group, a 2-ethylhexyl group, a nonyl group, a undecyl group, a tridecyl group, a pentadecyl group, a heptadecyl group, a 1-adamantyl group, a 2-adamantyl group, a 1-adamantylmethyl group, a norbornyl group, a norbornylmethyl group, a tricyclodecanyl group, a tetracyclododecanyl group, a tetracyclododecanylmethyl group, a dicyclohexylmethyl group, an icosanyl group, an allyl group, a benzyl group, a diphenylmethyl group, a tetrahydrofuryl group, a methoxymethyl group, an ethoxymethyl group, a methylthiomethyl group, an acetamidemethyl group, a trifluoroethyl group, a (2-methoxyethoxy) methyl group, an acetoxymethyl group, a 2-carboxy-1-cyclohexyl group, a 2-oxopropyl group, a 4-oxo-1-adamantyl group, and a 3-oxocyclohexyl group, though not limited them.

Details of synthesis of the sulfonium salts shown by the general formula (P1) are described in Japanese Patent Laid-Open Publication No. 2007-145797 (Patent Document 4), No. 2008-106045, No. 2009-7327, and No. 2009-258695.

In addition, the sulfonium salts described in Japanese Patent Laid-Open publication No. 2010-215608 may be used suitably. More specific illustrative examples of the preferable photo-sensitive acid generator are shown below.

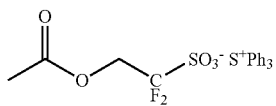

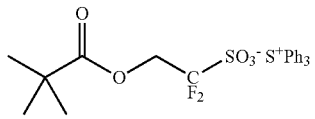

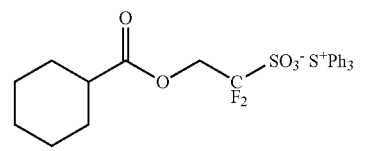

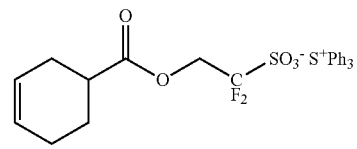

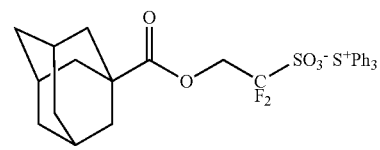

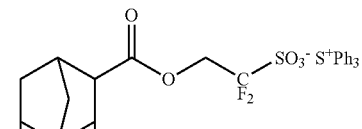

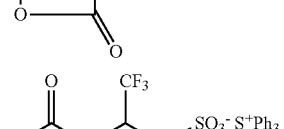

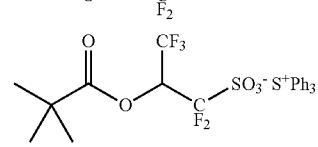

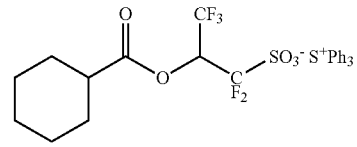

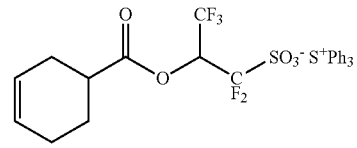

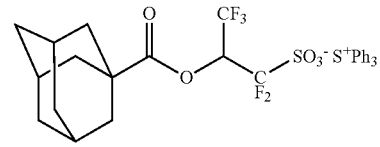

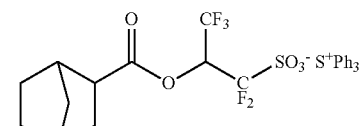

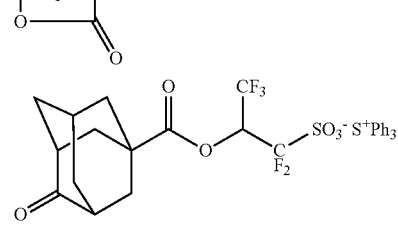

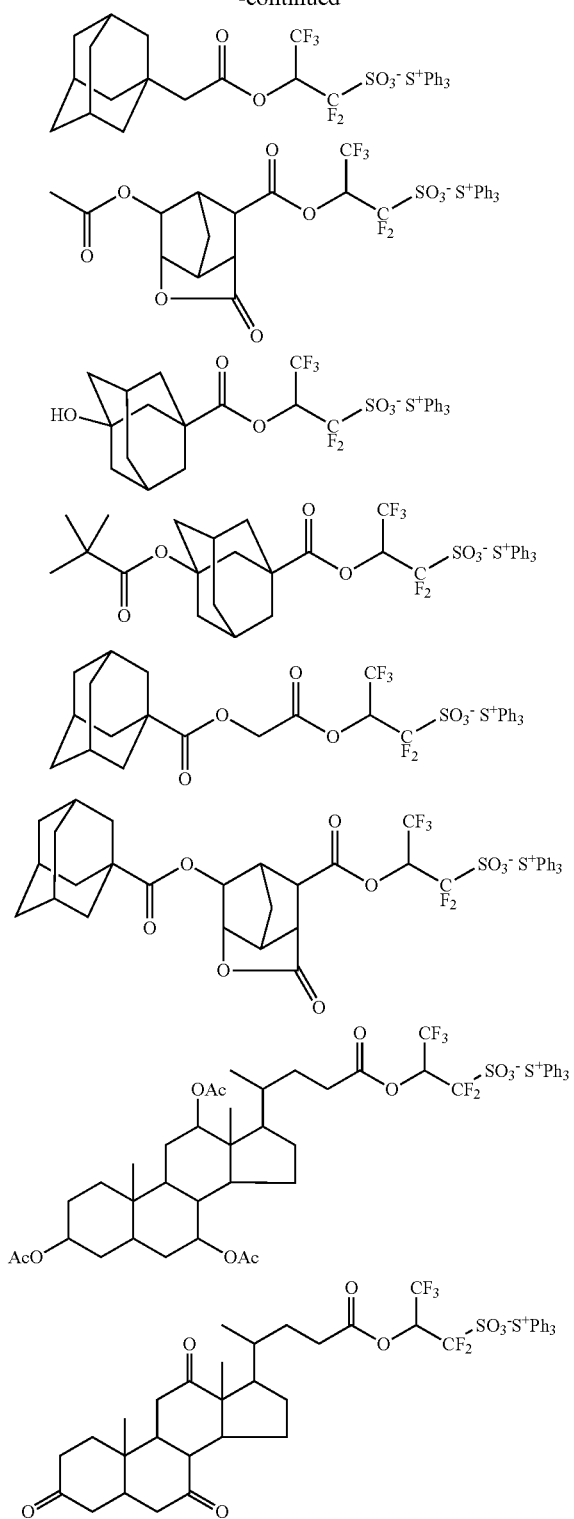
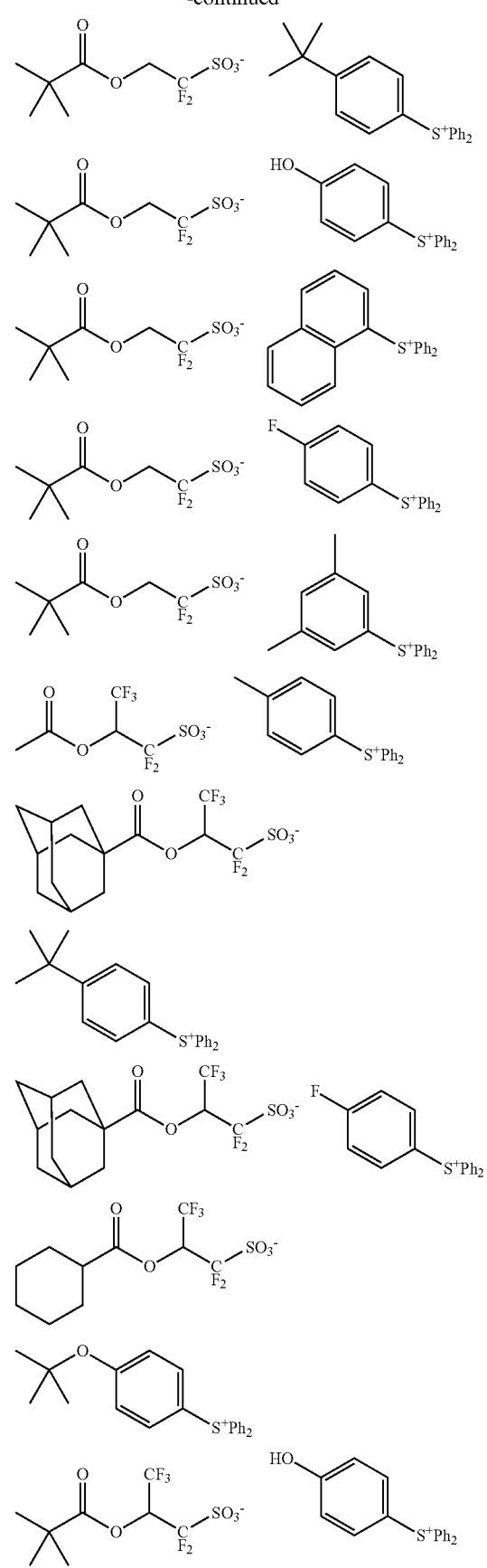
wherein Ac represents an acetyl group, and Ph represents a phenyl group.

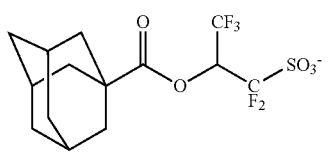
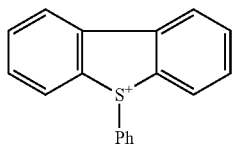
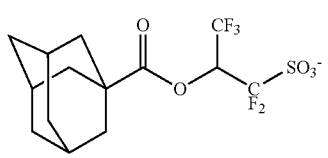
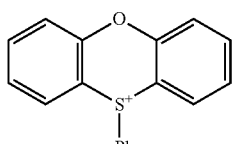
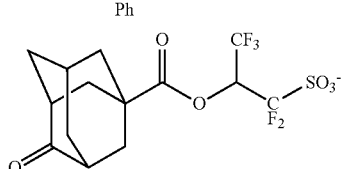
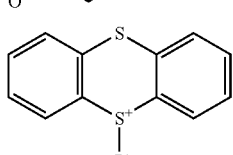
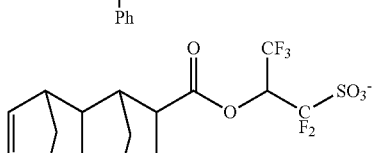
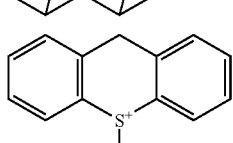
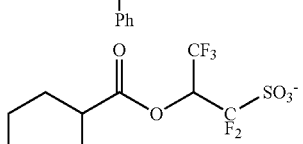
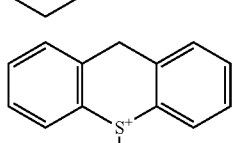
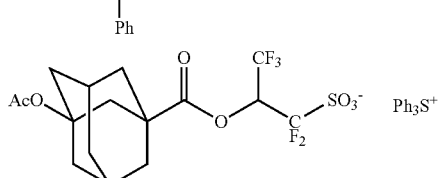

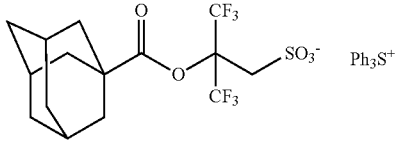
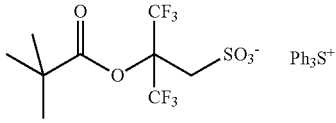
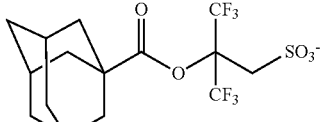
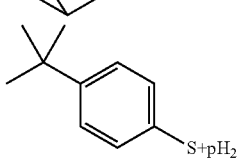

wherein Ac represents an acetyl group, and Ph represents a phenyl group.

Addition amount of these photo-sensitive acid generators (F) relative to 100 parts by mass of the polymer compound in the resist composition is in the range of 0 to 40 parts by mass, and if it is blended, preferably in the range of 0.1 to 40 parts by mass, or more preferably in the range of 0.1 to 20 parts by mass. If the amount is too much, there may bring about deterioration of the resolution and the problem of generating foreign matters after resist development or during removal.

As to the other photo-sensitive acid generator, a photo-sensitive acid generator having a nitrogen-containing substituent may be used. The compound like this functions as a quencher in the unexposed part, whereas in the exposed part, it functions as a so-called photo-degradable base, which loses the quencher capacity by neutralization with the generated own acid. By using the photo-degradable base, contrast between the exposed part and the unexposed part can be intensified further. As to the photo-degradable base, reference may be made to such as, for example, Japanese Patent Laid-Open Publication No. 2009-109595 and No. 2012-046501.

The photo-sensitive acid generators (F) may be used as a mixture of two or more of them or by blending with other acid generator. If it is blended with other acid generator, the addition amount of the other acid generator is usually in the range of 0 to 20 parts by mass, or preferably in the range of 0.1 to 10 parts by mass, relative to 100 parts by mass of the base resin in the resist composition.

(G) Organic Acid Derivative and/or Fluorine-Substituted Alcohol

The resist composition of the present invention may be added with a compound that generates an acid by decomposition by action of an acid (acid amplifier compound). These compounds may be referred to Japanese Patent Laid-Open Publication No. 2009-269953 or No. 2010-215608.

Addition amount of the acid amplifier compound in the resist composition of the present invention is 2 or less parts by mass, or preferably 1 or less parts by mass, relative to 100 parts by mass of the base resin in the resist composition. If the addition amount is too much, control of diffusion is difficult, thereby causing deterioration of the resolution and the pattern form.

Addition of an organic acid derivative or a compound (dissolution inhibitor agent) having weight-average molecular weight of 3000 or less, whose solubility into the alkaline developing solution changes by action of an acid is arbitrary, and similarly to the respective afore-mentioned components, they may be referred to the compounds described in Japanese Patent Laid-Open Publication No. 2009-269953 or No. 2010-215608.

Thirdly, the present invention provides further a patterning process using the above-mentioned resist composition.

To form a pattern by using the resist composition of the present invention, a heretofore known lithography technology may be used. For example, the resist composition is applied onto, for example, a substrate (such as, for example, Si, $SiO_2$, SiN, SiON, TiN, WSi, BPSG, SOG, and an organic antireflective film) for manufacturing of an integrated circuit or a substrate (such as, for example, Cr, CrO, CrON, and MoSi) for manufacturing of a mask circuit by means of spin coating or the like so as to give film thickness of in the range of 0.05 to 2.0 μm; and then, this is pre-baked on a hot plate in the temperature range of 60 to 150° C. for 1 to 10 minutes, or preferably in the temperature range of 80 to 140° C. for 1 to 5 minutes. Then, while a mask to form an objective pattern is held over the resist film, a high energy beam such as a far ultra-violet beam, an excimer laser beam, and an X-ray, or an electron beam, is irradiated so as to give the exposure dose in the range of 1 to 200 $mJ/cm^2$, or preferably in the range of 10 to 100 $mJ/cm^2$. Alternatively, direct drawing is done by an electron beam without interposition of a mask to form a pattern. Exposure may also be done by a usual exposure method, or as the case may be, by soaking between the mask and the resist film, i.e., by an immersion method. In this case, a protective coat not soluble in water may also be used. Thereafter, post-exposure bake (PEB) is conducted on a hot plate in the temperature range of 60 to 150° C. for 1 to 5 minutes, or preferably in the temperature range of 80 to 140° C. for 1 to 3 minutes. Further, development is conducted by a conventional method such as a dip method, a puddle method, and a spray method by using an aqueous alkaline developing solution such as an aqueous tetramethylammonium hydroxide (TMAH) with the concentration range of 0.1 to 5% by mass, or preferably in the concentration range of 2 to 3% by mass, for 0.1 to 3 minutes, or preferably for 0.5 to 2 minutes, to form an objective pattern on the substrate. Meanwhile, the resist composition of the present invention is the most suitable for fine patterning by a KrF excimer laser beam, an ArF excimer beam, an electron beam, or a soft X-ray with the wavelength range of 3 to 15 nm, among the high energy beams. Note that, sometimes an objective pattern may not be obtained outside the upper and the lower limits mentioned above.

The afore-mentioned water-insoluble protective coat is used to prevent elusion from the resist film and to enhance a water-sliding property of the film surface, wherein this is classified roughly into two classes. One class is an organic solvent removal type in which removal thereof is necessary before the alkaline development by an organic solvent not dissolving the resist film; and the other class is an alkali-soluble type, that is, the protective coat is soluble in the alkaline developing solution, and therefore the protective coat is removed simultaneously with removal of the soluble part of the resist film.

As to the latter, especially a composition having, as a base, a polymer compound containing a 1,1,1,3,3,3-hexafluoro-2-propanol residue, which is not soluble in water but soluble in the alkaline developing solution, dissolved in an alcoholic solvent having 4 or more carbon atoms, an ether solvent having 8 to 12 carbon atoms, or a mixed solvent of them is preferable.

Further, a composition having the afore-mentioned surfactant, which is not soluble in water but soluble in the alkaline developing solution, dissolved in an alcoholic solvent having 4 or more carbon atoms, an ether solvent having 8 to 12 carbon atoms, or a mixed solvent of them may be made.

In addition, as the means for patterning, extraction of the acid generator and the like from the film surface by conducting pure water rinsing (post-soak), or washing out of particles may be done after formation of the resist film; and rinsing (post-soak) may be conducted to remove residual water on the film after the photo-exposure.

Furthermore, as the life-prolonging technology to the 32-nm ArF lithography, a double patterning process may be mentioned. In the double patterning process, there may be mentioned: a trench method in which a base coat of a 1:3 trench pattern is processed by the first exposure and etching, followed by displacing the position thereof and then the second exposure to form the 1:3 trench pattern thereby forming a 1:1 pattern; and a line method in which a first base coat of a 1:3 solitarily-left pattern is processed by the first exposure and etching, followed by displacing the position thereof and then the second exposure to process the second base coat having the 1:3 solitarily-left pattern formed under the first base coat thereby forming a 1:1 pattern having a halved pitch.

Meanwhile, as to the developing solution in the patterning process of the present invention, as mentioned above, an aqueous alkaline developing solution such as an aqueous tetramethylammonium hydroxide (TMAH) with the concentration range of 0.1 to 5% by mass, or preferably in the concentration range of 2 to 3% by mass may be used; or alternatively, a means of a negative tone development by using an organic solvent to develop and dissolve the unexposed part may also be used.

For this organic solvent development, the usable developing solution is one or more kinds selected from the following solvents: 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutanoate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

EXAMPLES

Hereunder, the present invention will be explained specifically by showing Synthesis Examples, Examples, and Comparative Examples, but the present invention is not limited by the following Examples.

Synthesis Example 1

Sulfonium salts of the present invention were synthesized by the methods shown below.

Synthesis Example 1-1

Synthesis of triethylammonium=2-(admantane-1-carbonyloxy)-3,3,3-trifluoro-2-trifluoromethylpropane-1-sulfonate In accordance with the method described in Japanese Patent Laid-Open Publication No. 2010-215608, an aqueous solution of sodium 3,3,3-trifluoro-2-hydroxy-2-trifluoromethylpropane-1-sulfonate was synthesized. Then, 152 g of triethylamine, and 104 g of 35% hydrochloric acid were added into 1320 g of this aqueous solution (corresponding to 1 mol of sodium 3,3,3-trifluoro-2-hydroxy-2-trifluoromethylpropane-1-sulfonate); and after the resulting mixture was stirred for 10 minutes, the reaction solution was concentrated. To this were added 111 g of triethylamine, 12 g of N,N-dimethyl-4-aminopyridine, and 2000 g of methylene chloride. To this mixed solution was added a mixed solution of 250 g of 1-adamantanecarbonyl chloride and 250 g of methylene chloride under ice-cooling; and then, after the resulting mixture was stirred for one overnight at room temperature, 1000 g of water was added thereinto to terminate the reaction. After the quenched reaction solution was separated into layers, the extracted organic layer was washed by an aqueous triethylammonium chloride solution and then by water. Thereafter, the organic layer was concentrated, added by methyl isobutyl ketone, and then concentrated again. Diisopropyl ether was added to the concentrated solution for recrystallization, and then, the deposited solid was recovered and dried under reduced pressure to obtain 392 g of the intended product of triethylammonium=2-(admantane-1-carbonyloxy)-3,3,3-trifluoro-2-trifluoromethylpropane-1-sulfonate as a reddish brown solid (yield 74%).

Synthesis Example 1-2

Synthesis of 1-(2-methoxyethoxy)-naphthalene

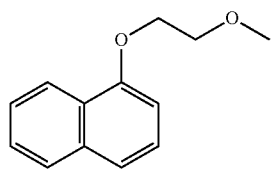

Under a nitrogen atmosphere, a mixed solution of 1500 g of 1-naphthol, 1032 g of 2-methoxyethyl chloride, 460 g of sodium hydroxide, 78 g of sodium iodide, and 3000 g of ethanol was stirred for 37 hours with heating at 80° C. After cooling, 3000 g of water and 5000 g of toluene were added to the mixed solution, and then the organic layer was separated and washed by 1800 g of an aqueous sodium hydroxide (concentration of 5% by mass) for five times. Then, after washed by 1800 g of water for four times, the organic layer was concentrated to obtain 1835 g of an oily substance. This was distilled under reduced pressure (at 110° C. and 13 Pa) to obtain 1637 g of the intended product (Yield 77%).

Synthesis Example 1-3

Synthesis of 4-(2-methoxyethoxy)-1-naphthyltetrahydrothiophenium=2-(admantane-1-carbonyloxy)-3,3,3-trifluoro-2-trifluoromethylpropane-1-sulfonate (PAG-1)

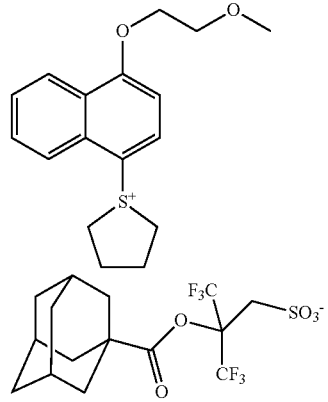

PAG-1

After 161 g of 1-(2-methoxyethoxy)-naphthalene synthesized in Synthesis Example 1-2 was dispersed in 324 g of Eaton's reagent (diphosphorous pentaoxide-methanesulfonic acid solution, manufactured by Sigma-Aldrich Co., LLC), 83 g of tetramethylene sulfoxide was added dropwise thereinto under ice-cooling with mixing. After this reaction solution was aged for one overnight at room temperature, 810 g of water and 400 g of diisopropyl ether were added under ice-cooling, and then, the aqueous layer was separated. The aqueous layer was washed again by 400 g of diisopropyl ether to obtain 4-(2,2,2-trifluoroethoxy)-1-naphthyltetrahydrothiophenium=methanesulfonate as the aqueous solution thereof. To 567 g of this aqueous solution were (corresponding to 0.315 mol) added 110 g of triethylammonium=2-(admantane-1-carbonyloxy)-3,3,3-trifluoro-2-trifluoromethylpropane-1-sulfonate (synthesized in Synthesis Example 1-1), 1000 g of methylene dichloride, and 600 g of water, and then the resulting organic layer was extracted from the mixed solution. After the extracted organic layer was washed by water, the organic layer was concentrated, added by methyl isobutyl ketone, and then concentrated again. Diisopropyl ether was added to the concentrated solution for recrystallization, and then, the deposited solid was recovered and dried under reduced pressure to obtain 144 g of the intended product of 4-(2-methoxyethoxy)-1-naphthyltetrahydrothiophenium=2-(admantane-1-carbonyloxy)-3,3,3-trifluoro-2-trifluoromethylpropane-1-sulfonate as a white solid (yield 96%).

Figure 2:
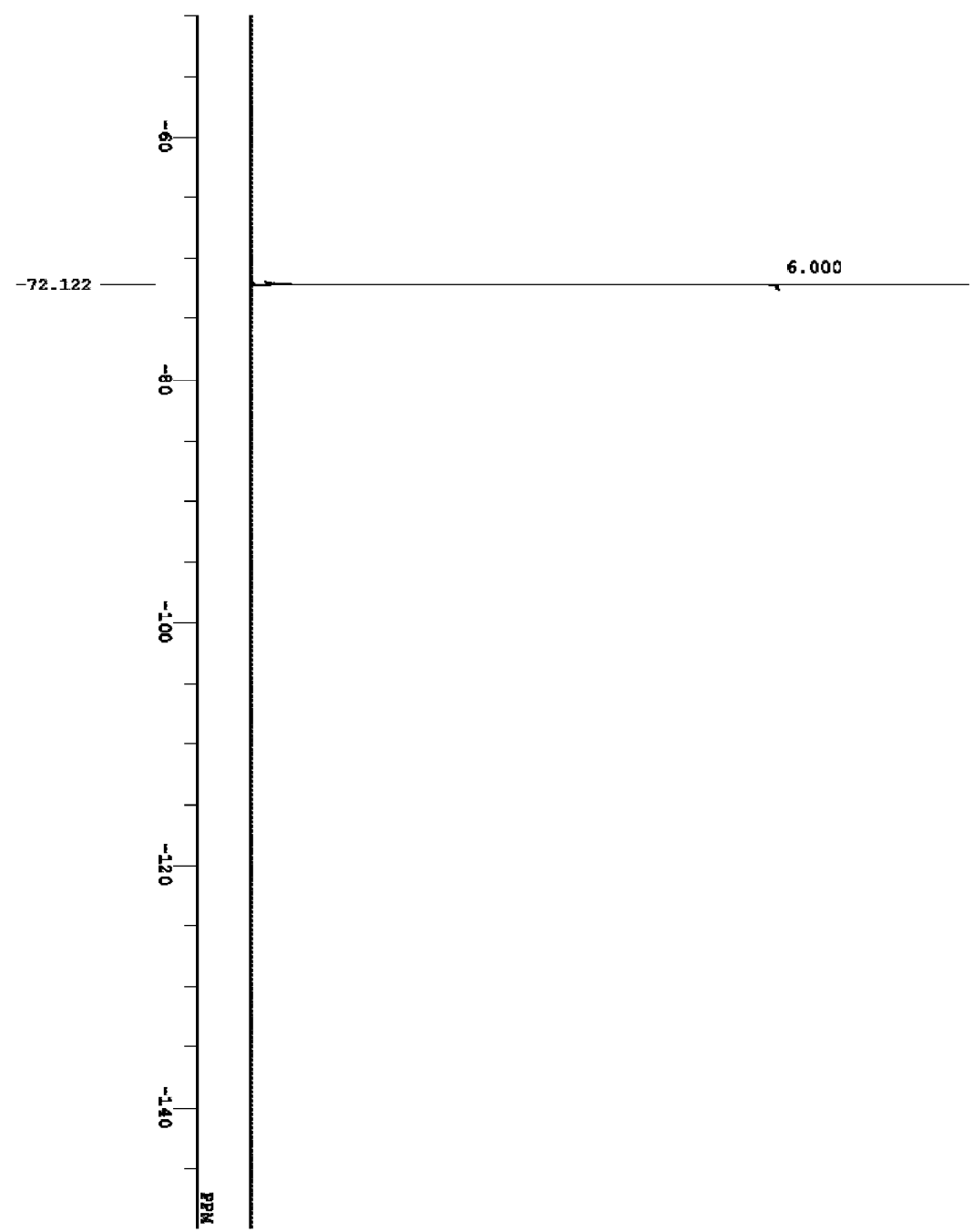
FIG. 2 shows $^{13}$F-NMR in DMSO-$d_6$ of the target compound PAG-1 obtained in Synthesis Example 1-3.

From the analysis of the spectral data of the targeted product thus obtained, this product was confirmed doubtlessly to be PAG-1 (FIGS. 1 and 2). The spectral data of the targeted product thus obtained are shown below. Results of the nuclear magnetic resonance spectra ($^1$H-NMR and $^{19}$F-NMR in DMSO-$d_6$) are shown in FIG. 1 and FIG. 2. Note that, minute amounts of the residual solvents (diisopropyl ether and water) are detected in $^1$H-NMR.

IR (D-ATR):
ν=2911, 2854, 1755, 1592, 1572, 1510, 1455, 1379, 1367, 1332, 1268, 1251, 1237, 1215, 1198, 1146, 1126, 1087, 1063, 1038, 1017, 970, 758, 650, 616, and 595 cm$^{-1}$.

Time of Flight Mass Spectrometry (TOFMS; MALDI):

POSITIVE M+ 289 (corresponding to $C_{17}H_{21}O_2S^+$)

NEGATIVE M− 423 (corresponding to $(C_{10}H_{15}COO)-C(CF_3)_2-CH_2SO_3^-$)

Synthesis Example 2

The polymer compounds used in the resist composition of the present invention were synthesized by the methods shown below. Meanwhile, the term "GPC" in the following Examples means a gel permeation chromatography; the weight-average molecular weights (Mw) of the obtained polymer compounds were measured as the polystyrene-converted values by a gel permeation chromatography (GPC) using tetrahydrofuran as a solvent.

Synthesis Example 2-1

Synthesis of Polymer Compound (P-1)

Under a nitrogen atmosphere, a monomers-polymerization initiator solution was prepared by taking 3.9 g of methacrylate=3-hydroxy-1-adamantyl, 18.0 g of methacrylate 3-ethyl-3-exo-tetracyclo[4.4.0.1$^{2,5}$.1$^{7,10}$]dodecyl, 18.3 g of methacrylate=4,8-dioxatricycio[4.2.1.0$^{3,7}$]nonane-5-one-2-yl, 0.38 g of V-601 (manufactured by Wako Pure Chemical Industries, Ltd.), 0.48 g of mercaptoethanol, 24 g of PGMEA (propylene glycol methyl ether acetate), and 31 g of γ-butyrolactone. Into another flask under a nitrogen atmosphere were taken 8.0 g of PMA (propylene glycol monomethyl ether acetate) and 10.5 g of γ-butyrolactone; and then, after the resulting mixture was heated to 80° C. with stirring, the afore-mentioned monomers-polymerization initiator solution was added dropwise thereinto for 4 hours. After completion of the dropping, the obtained polymerization solution was stirred for 2 hours with keeping the temperature at 80° C., and then cooled to room temperature. The polymerization solution thus obtained was added dropwise into 640 g of an aqueous methanol containing 10% by weight of water with intense stirring, and then the deposited copolymer was collected by filtration. The copolymer was washed by 240 g of methanol twice, and then dried under vacuum at 50° C. for 20 hours to obtain 35.3 g of the copolymer as white powders (yield 88%). The GPC analysis showed that the polystyrene-equivalent weight-average molecular weight (Mw) of the copolymer was 6520 and the degree of dispersion thereof was 1.86.

(P-1)

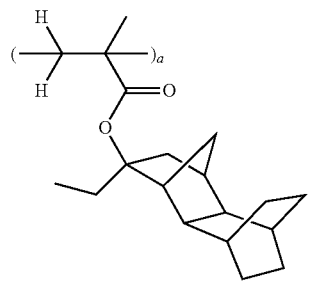
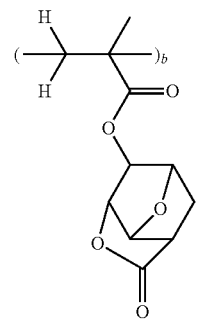
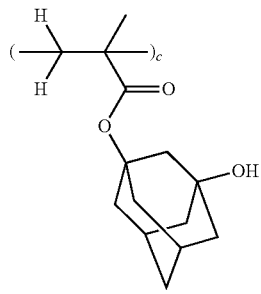

(a = 0.40, b = 0.50, c = 0.10)

Synthesis Examples 2-2 to 2-11

Synthesis of P-2 to P-11

The procedure of Synthesis Example 2-1 was repeated, except that kind and blending ratio of each monomer were changed, to obtain respective polymer compounds.

The produced resins (polymer compounds) are shown in Table 1. Meanwhile, in Table 1, the introduction ratio shows mol ratio. Structures of each unit in Table 1 are shown in Table 2 and Table 3.

TABLE 1

| Resin | Unit 1 (introduction ratio) | | Unit 2 (introduction ratio) | | Unit 3 (introduction ratio) | | Unit 4 (introduction ratio) | |
|---|---|---|---|---|---|---|---|---|
| P-1 | A-1 | (0.40) | B-1 | (0.50) | B-6 | (0.10) | — | |
| P-2 | A-1 | (0.25) | A-2 | (0.35) | B-1 | (0.30) | B-6 | (0.10) |
| P-3 | A-4 | (0.50) | B-2 | (0.40) | B-6 | (0.10) | — | |
| P-4 | A-5 | (0.30) | A-6 | (0.20) | B-1 | (0.40) | B-6 | (0.10) |
| P-5 | A-3 | (0.50) | B-1 | (0.50) | — | | — | |
| P-6 | A-3 | (0.50) | B-5 | (0.40) | B-6 | (0.10) | — | |
| P-7 | A-3 | (0.50) | B-1 | (0.20) | B-4 | (0.30) | — | |
| P-8 | A-3 | (0.50) | B-3 | (0.20) | B-4 | (0.30) | — | |
| P-9 | A-2 | (0.25) | A-5 | (0.25) | B-4 | (0.35) | B-6 | (0.15) |
| P-10 | A-3 | (0.25) | A-5 | (0.25) | B-4 | (0.35) | B-6 | (0.15) |
| P-11 | A-3 | (0.25) | A-5 | (0.25) | B-5 | (0.35) | B-6 | (0.15) |

TABLE 2

A-1

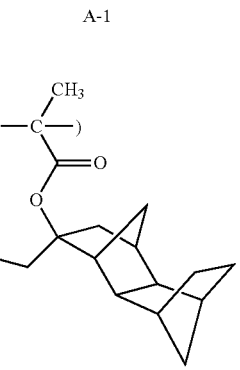

TABLE 2-continued
A-2
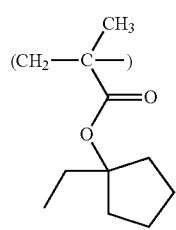
A-3
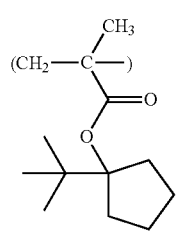
A-4
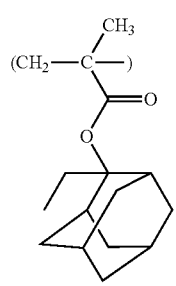
A-5
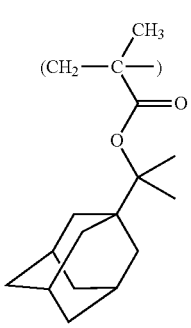
A-6
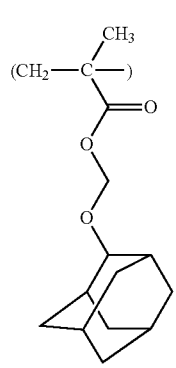
TABLE 3
B-1
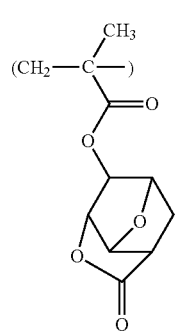
B-2
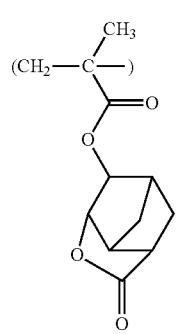
B-3
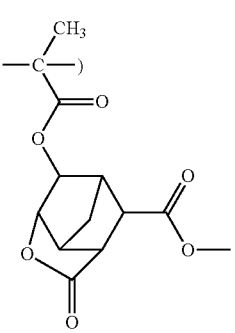
B-4
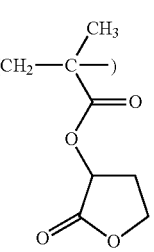

TABLE 3-continued

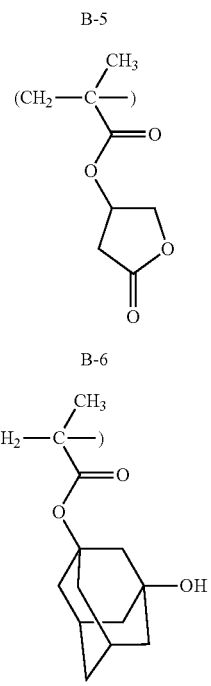

Preparation of Resist Solution

By using the sulfonium salts and the polymer compounds shown by Synthesis Examples, each of the resist compositions was prepared by dissolving the below-mentioned basic compound (quencher) in the solvent containing 0.01% by mass of the below-mentioned surfactant A (manufactured by OMNOVA Solutions Inc.) with the composition as shown in Table 4; and these resist compositions were filtrated through a 0.2-μm filter made of Teflon (registered trade mark) to obtain respective resist solutions.

Meanwhile, in Table 4, the basic compound (quencher) (Q-1), the solvents, the alkali-soluble surfactant (SE-1), and sulfonium salts other than the sulfonium salts shown by Synthesis Examples, which were used together with the sulfonium salts and the polymer compounds shown by Synthesis Examples, as materials of resist composition, are as following.

Q-1: 1-benzyloxycarbonyl-2-phenylbenzimidazole
PGMEA: propylene glycol monomethyl ether acetate
GBL: γ-butyrolactone
PAG-X: triphenylsulfonium=2-(adamantane-1-carbonyloxy)-3,3,3-trifluoro-2-trifluoromethylpropane-1-sulfonate
PAG-Y: 4-(2,2,2-trifluoroethoxy)-1-naphthyltetrahydrothiophenium-2-(adamantane-1-carbonyloxy-1,1,3,3,3-pentafluoropropane-1-sulfonate
PAG-Z: triphenylsulfonium=2-(adamantane-1-carbonyloxy-1,1,3,3,3-pentafluoropropane-1-sulfonate
Alkali-soluble surfactant (SF-1): poly(methacrylate=3,3,3-trifluoro-2-hydroxy-1,1-dimethyl-2-trifluoromethylpropyl-.methacrylate=1,1,1-trifluoro-2-hydroxy-6-methyl-2-trifluoromethylhepta-4-yl) shown by the following formula (this is the compound described in Japanese Patent Laid-Open Publication No. 2008-122932).

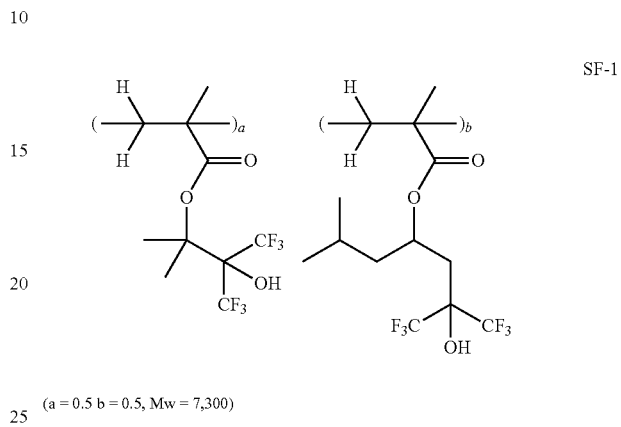

(a = 0.5 b = 0.5, Mw = 7,300)

Surfactant A: 3-methyl-3-(2,2,2-trifluoroethoxymethyl)oxetane.tetrahydrofuran.2,2-dimethyl-1,3-propanediol copolymer shown by the following formula (manufactured by OMNOVA Solutions Inc.)

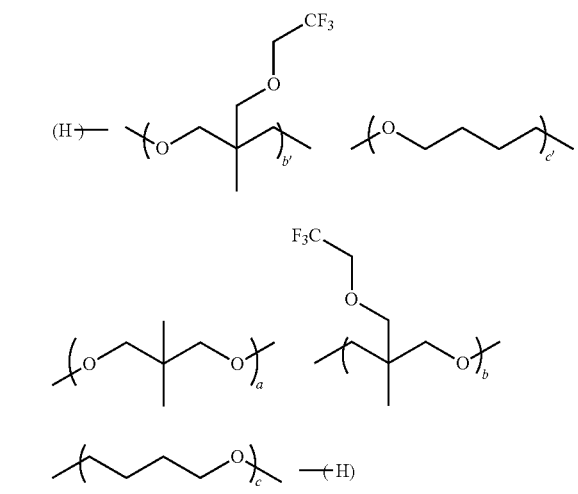

a:(b + b'):(c+c') = 1:4~7:0. 01~1 (Mole ratio)
Weight-average molecular weight:1,500

TABLE 4

| Resist | Resin (polymer compound) (parts by mass) | | Acid generator (parts by mass) | | Basic compound (parts by mass) | | Surfactant (parts by mass) | | Solvent 1 (parts by mass) | | Solvent 2 (parts by mass) | |
|---|---|---|---|---|---|---|---|---|---|---|---|---|
| R-01 | P-1 | (80) | PAG-1 | (13.8) | Q-1 | (1.4) | SF-1 | (5.0) | PGMEA | (1728) | GBL | (192) |
| R-02 | P-2 | (80) | PAG-1 | (13.8) | Q-1 | (1.4) | SF-1 | (5.0) | PGMEA | (1728) | GBL | (192) |
| R-03 | P-3 | (80) | PAG-1 | (13.8) | Q-1 | (1.4) | SF-1 | (5.0) | PGMEA | (1728) | GBL | (192) |
| R-04 | P-4 | (80) | PAG-1 | (13.8) | Q-1 | (1.4) | SF-1 | (5.0) | PGMEA | (1728) | GBL | (192) |
| R-05 | P-5 | (80) | PAG-1 PAG-X | (9.7) (4.0) | Q-1 | (1.4) | SF-1 | (5.0) | PGMEA | (1728) | GBL | (192) |

TABLE 4-continued

| Resist | Resin (polymer compound) (parts by mass) | | Acid generator (parts by mass) | | Basic compound (parts by mass) | | Surfactant (parts by mass) | | Solvent 1 (parts by mass) | | Solvent 2 (parts by mass) | |
|---|---|---|---|---|---|---|---|---|---|---|---|---|
| R-06 | P-6 | (80) | PAG-1 | (9.7) | Q-1 | (1.4) | SF-1 | (5.0) | PGMEA | (1728) | GBL | (192) |
|  |  |  | PAG-X | (4.0) |  |  |  |  |  |  |  |  |
| R-07 | P-7 | (80) | PAG-1 | (9.7) | Q-1 | (1.4) | SF-1 | (5.0) | PGMEA | (1728) | GBL | (192) |
|  |  |  | PAG-X | (4.0) |  |  |  |  |  |  |  |  |
| R-08 | P-8 | (80) | PAG-1 | (9.7) | Q-1 | (1.4) | SF-1 | (5.0) | PGMEA | (1728) | GBL | (192) |
|  |  |  | PAG-X | (4.0) |  |  |  |  |  |  |  |  |
| R-09 | P-9 | (80) | PAG-1 | (14.3) | Q-1 | (1.4) | SF-1 | (5.0) | PGMEA | (1728) | GBL | (192) |
|  |  |  | PAG-X | (8.0) |  |  |  |  |  |  |  |  |
| R-10 | P-10 | (80) | PAG-1 | (9.7) | Q-1 | (1.4) | SF-1 | (5.0) | PGMEA | (1728) | GBL | (192) |
|  |  |  | PAG-X | (4.0) |  |  |  |  |  |  |  |  |
| R-11 | P-11 | (80) | PAG-1 | (9.7) | Q-1 | (1.4) | SF-1 | (5.0) | PGMEA | (1728) | GBL | (192) |
|  |  |  | PAG-Z | (4.0) |  |  |  |  |  |  |  |  |
| R-12 | P-1 | (80) | PAG-X | (13.3) | Q-1 | (1.4) | SF-1 | (5.0) | PGMEA | (1728) | GBL | (192) |
| R-13 | P-1 | (80) | PAG-Y | (10.5) | Q-1 | (1.4) | SF-1 | (5.0) | PGMEA | (1728) | GBL | (192) |
| R-14 | P-1 | (80) | PAG-Z | (10.1) | Q-1 | (1.4) | SF-1 | (5.0) | PGMEA | (1728) | GBL | (192) |

Evaluation of Resist Compositions
ArF Exposure (1)

Examples 1-1 to 1-11, and Comparative Examples 1-1 to 1-3

The antireflective film solution ARC-29A (manufactured by Nissan Chemical Industries, Ltd.) was applied onto a silicon substrate and then baked at 200° C. for 60 seconds to obtain the antireflective film (film thickness of 100 nm) on the substrate; and then, after the resist solution was applied thereonto by spin coating, it was baked on a hot plate at 100° C. for 60 seconds to obtain the resist film having film thickness of 90 nm. This was immersion-exposed by using the ArF excimer laser scanner NSR-S610C (NA=1.30, dipolar, and Cr mask: manufactured by Nikon Corporation); and then, after baking (PEB) was conducted at 80° C. for 60 seconds, this was developed by an aqueous tetramethylammonium hydroxide solution (concentration of 2.38% by mass) for 60 seconds.
(Evaluation Method)

Evaluation of the resist was done as to the 40-nm 1:1 line-and-space pattern by observation with an electron microscope, wherein the exposure dose to obtain the line width of 40 nm was taken as the optimum exposure dose (Eop, mJ/cm$^2$). Pattern forms at the optimum exposure dose were compared to judge good or bad.

Furthermore, fluctuation of the line width in the line part of the 40-nm 1:1 line-and-space pattern was measured by a SEM to determine the line width roughness (LWR) (30 spots were measured to calculate the 3σ value). When the LWR value is smaller, fluctuation of the line pattern is smaller, which means better.

In this evaluation method, the judgment was done according to the following criteria.
Good: 3.0 nm or less
Bad: 3.1 nm or more Then, the number of defects in the pattern formed after development was counted by the defect-testing apparatus KLA2800 (manufactured by KLA-Tencor Corporation); and then, the defect density was obtained according to the following equation.

Defect density (number of defects/cm$^2$)=total number of detected defects/test area Formed pattern: repeat pattern of the 40-nm 1:1 line-and-space
Defect-testing conditions: UV light source, test pixel size of 0.28 μm, and cell-to-cell mode
In this evaluation method, the judgment was done according to the following criteria.
Good: less than 0.05 defects/cm$^2$
Not good: 0.05 or more defects/cm$^2$

TABLE 5

| | Resist | Optimum exposure dose (mJ/cm$^2$) | LWR (nm) | Pattern form | Defect density (number/cm$^2$) |
|---|---|---|---|---|---|
| Example 1-1 | R-01 | 37 | 3.1 | Rectangular | 0.02 |
| Example 1-2 | R-02 | 38 | 2.9 | Rectangular | 0.02 |
| Example 1-3 | R-03 | 42 | 3.1 | Rectangular | 0.02 |
| Example 1-4 | R-04 | 32 | 3.0 | Rectangular | 0.03 |
| Example 1-5 | R-05 | 34 | 2.3 | Rectangular | 0.04 |
| Example 1-6 | R-06 | 32 | 2.9 | Rectangular | 0.03 |
| Example 1-7 | R-07 | 33 | 2.7 | Rectangular | 0.03 |
| Example 1-8 | R-08 | 33 | 2.9 | Rectangular | 0.04 |
| Example 1-9 | R-09 | 34 | 2.8 | Rectangular | 0.03 |
| Example 1-10 | R-10 | 36 | 2.7 | Rectangular | 0.02 |
| Example 1-11 | R-11 | 36 | 2.8 | Rectangular | 0.02 |
| Comparative Example 1-1 | R-12 | 37 | 3.2 | Not good, footing | 0.06 |
| Comparative Example 1-2 | R-13 | 36 | 3.5 | Not good, slightly footing | 0.07 |
| Comparative Example 1-3 | R-14 | 34 | 3.4 | Not good, footing | 0.07 |

From the results in Table 5, the resist compositions of the present invention have not only excellent pattern form and LWR, but also less number of defects, showing that these are suitable as the material for the ArF immersion lithography.

Evaluation of Resist Compositions

ArF Exposure (2)

Examples 2-1 to 2-11, and Comparative Examples 2-1 to 2-3

After the spin-on carbon film ODL-50 (80% by mass of the carbon content, manufactured by Shin-Etsu Chemical Co., Ltd.) was applied on a silicon wafer with the film thickness of 200 nm, the silicon-containing spin-on hard mask SHB-A940 (43% by mass of the silicon content) was formed on it with the film thickness of 35 nm to obtain a substrate for a trilayer process. Onto the substrate thus prepared was applied by spin coating each of the resist compositions prepared according to Table 4; and then, this was baked on a hot plate at 100° C. for 60 seconds to obtain the resist film having film thickness of 100 nm.

This was exposed by using the ArF excimer laser immersion scanner NSR-610C (NA 1.30, σ 0.98/0.78, cross-pole aperture 20 degree, Azimuthally polarized illumination, 6% half tone phase shift mask, 90 nm pitch size on the wafer, and lattice mask with the line width of 30 nm: manufactured by Nikon Corporation) while changing the exposure dose; after exposure, it was baked (PEB) at 80° C. for 60 seconds; butyl acetate was ejected from the developer nozzle rotated at 30 rpm for 3 seconds; thereafter, static puddle development was conducted for 27 seconds; and after rinsed with diisoamyl ether, this was spin-dried and then baked at 100° C. for 20 seconds to evaporate the rinsing solvent, thereby obtaining the negative pattern.

Sizes of 50 image-reversed hole patterns by the solvent development were measured by using TDSEM (CG-4000, manufactured by Hitachi High-Technologies Corporation) to obtain the size dispersion 3σ. Cross-section forms of the hole patterns were observed by the electron microscope S-4300 (manufactured by Hitachi High-Technologies Corporation). The results are shown in Table 6.

TABLE 6

| Resist | Optimum exposure dose (mJ/cm²) | Pattern form | Hole size dispersion 3σ (nm) |
|---|---|---|---|
| Example 2-1 | R-01 | 38 | Vertical | 2.8 |
| Example 2-2 | R-02 | 39 | Vertical | 2.7 |
| Example 2-3 | R-03 | 42 | Vertical | 2.8 |
| Example 2-4 | R-04 | 33 | Vertical | 2.9 |
| Example 2-5 | R-05 | 35 | Vertical | 2.4 |
| Example 2-6 | R-06 | 33 | Vertical | 2.6 |
| Example 2-7 | R-07 | 34 | Vertical | 2.3 |
| Example 2-8 | R-08 | 34 | Vertical | 2.5 |
| Example 2-9 | R-09 | 35 | Vertical | 2.4 |
| Example 2-10 | R-10 | 38 | Vertical | 2.4 |
| Example 2-11 | R-11 | 37 | Vertical | 2.8 |
| Comparative Example 2-1 | R-12 | 39 | Reversed taper | 3.6 |
| Comparative Example 2-2 | R-13 | 37 | Reversed taper | 3.7 |
| Comparative Example 2-3 | R-14 | 35 | Reversed taper | 3.9 |

From the results in Table 6, it was shown that the resist compositions of the present invention have excellent uniformity in the pattern size after the organic solvent development and give a vertical pattern.

It must be noted here that the present invention is not limited to the embodiments as described above. The foregoing embodiments are mere examples; any form having substantially the same composition as the technical concept described in claims of the present invention and showing similar effects is included in the technical scope of the present invention.

What is claimed is:

1. A sulfonium salt shown by the following general formula (1a),

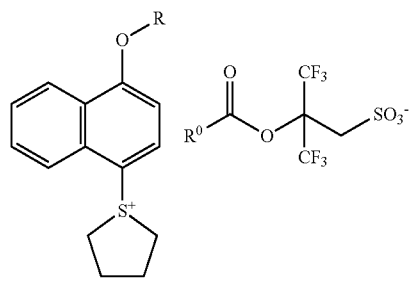

wherein each of R and R⁰ independently represents a hydrogen atom, or a linear, branched, or cyclic monovalent hydrocarbon group having 1 to 30 carbon atoms which may be optionally substituted by a heteroatom or interposed by a heteroatom.

2. The sulfonium salt according to claim 1, wherein the general formula (1a) is shown by the following general formula (1b),

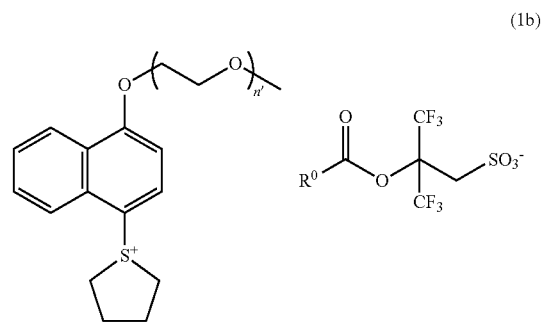

wherein R⁰ represents the same meaning as before; and n' represents an integer of 1 to 4.

3. A chemically amplified resist composition which comprises a base resin, an acid generator, and an organic solvent, wherein the acid generator is the sulfonium salt according to claim 2.

4. The chemically amplified resist composition according to claim 3, wherein the base resin is a polymer compound having a repeating unit shown by the following general formula (2) and a repeating unit shown by the following general formula (3),

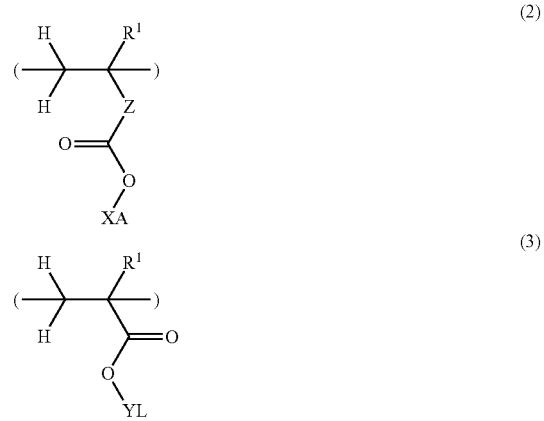

wherein R¹ represents a hydrogen atom, a fluorine atom, a methyl group, or a trifluoromethyl group; Z represents any of a single bond, a pheylene group, a naphthylene group, and (main chain)—C(=O)—O—Z'—; Z' represents a phenylene group, a naphthylene group, or a liner, branched, or cyclic alkylene group having 1 to 10 carbon atoms which may optionally contain any of a hydroxy group, an ether bond, an ester bond, and a lactone ring; XA represents an acid-labile group; and YL represents a hydrogen atom, or a polar group having any one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

5. The chemically amplified resist composition according to claim 4, wherein the chemically amplified resist composition contains further at least any one of a basic compound and a surfactant.

6. The chemically amplified resist composition according to claim 3, wherein the chemically amplified resist composition contains further at least any one of a basic compound and a surfactant.

7. A patterning process comprising a step of applying the chemically amplified resist composition according to claim 3 onto a substrate, a step of exposure by a high energy beam after heat treatment, and a step of development by using a developing solution.

8. The patterning process according to claim 7, wherein the exposure is conducted by an immersion exposure interposed by a liquid having a refractive index of 1.0 or more between a resist coat film and a projection lens.

9. The patterning process according to claim 8, wherein a protective coat is further applied on the resist coat film, and then the immersion exposure is conducted interposed by the liquid between the protective coat and the projection lens.

10. The patterning process according to claim 7, wherein the high energy beam for exposure is a KrF excimer laser, an ArF excimer laser, an electron beam, or a soft X-ray in the wavelength range of 3 to 15 nm.

11. A chemically amplified resist composition which comprises a base resin, an acid generator, and an organic solvent, wherein the acid generator is the sulfonium salt according to claim 1.

12. The chemically amplified resist composition according to claim 11, wherein the base resin is a polymer compound having a repeating unit shown by the following general formula (2) and a repeating unit shown by the following general formula (3),

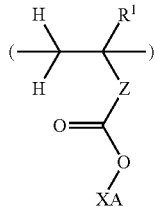

(2)

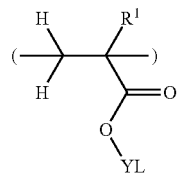

(3)

wherein $R^1$ represents a hydrogen atom, a fluorine atom, a methyl group, or a trifluoromethyl group; Z represents any of a single bond, a pheylene group, a naphthylene group, and (main chain) —C(=O)—O—Z'—; Z' represents a phenylene group, a naphthylene group, or a liner, branched, or cyclic alkylene group having 1 to 10 carbon atoms which may optionally contain any of a hydroxy group, an ether bond, an ester bond, and a lactone ring; XA represents an acid-labile group; and YL represents a hydrogen atom, or a polar group having any one or more structures selected from a hydroxy group, a cyano group, a carbonyl group, a carboxyl group, an ether bond, an ester bond, a sulfonate ester bond, a carbonate bond, a lactone ring, a sultone ring, and a carboxylic acid anhydride.

13. The chemically amplified resist composition according to claim 12, wherein the chemically amplified resist composition contains further at least any one of a basic compound and a surfactant.

14. The chemically amplified resist composition according to claim 11, wherein the chemically amplified resist composition contains further at least any one of a basic compound and a surfactant.

15. A patterning process comprising a step of applying the chemically amplified resist composition according to claim 11 onto a substrate, a step of exposure by a high energy beam after heat treatment, and a step of development by using a developing solution.

16. The patterning process according to claim 15, wherein the exposure is conducted by an immersion exposure interposed by a liquid having a refractive index of 1.0 or more between a resist coat film and a projection lens.

17. The patterning process according to claim 16, wherein a protective coat is further applied on the resist coat film, and then the immersion exposure is conducted interposed by the liquid between the protective coat and the projection lens.

18. The patterning process according to claim 15, wherein the high energy beam for exposure is a KrF excimer laser, an ArF excimer laser, an electron beam, or a soft X-ray in the wavelength range of 3 to 15 nm.

* * * * *